United States Patent [19]

Bequaert et al.

[11] 4,042,777
[45] Aug. 16, 1977

[54] ONE-HANDED KEYBOARD AND ITS CONTROL MEANS

[75] Inventors: Frank Charles Bequaert, Lexington; Nathaniel Rochester, Duxbury, both of Mass.

[73] Assignee: International Business Machines Corporation, Armonk, N.Y.

[21] Appl. No.: 741,638

[22] Filed: Nov. 15, 1976

Related U.S. Application Data

[63] Continuation of Ser. No. 619,867, Oct. 6, 1975, abandoned.

[51] Int. Cl.$^2$ .................. H04L 15/04; H04L 17/02; B41J 7/54
[52] U.S. Cl. .................. 179/79; 178/17 C; 197/99; 340/365 R
[58] Field of Search .................. 178/79, 17 R, 17 C; 197/19, 98, 99, 100; 340/365 R, 365 C, 365 E, 365 A, 365 B, 365 D, 172.5; 235/145 R

[56] References Cited

U.S. PATENT DOCUMENTS

| | | | |
|---|---|---|---|
| 3,022,878 | 2/1962 | Seibel et al. | 340/365 R |
| 3,200,689 | 8/1965 | Rosberger | 340/172.5 X |
| 3,225,883 | 12/1965 | Ayres | 340/365 C |
| 3,428,747 | 2/1969 | Alferieff | 340/365 R |
| 3,675,239 | 7/1972 | Ackerman et al. | 340/365 E |

Primary Examiner—Thomas A. Robinson
Attorney, Agent, or Firm—Bernard M. Goldman

[57] ABSTRACT

A keyboard which has 10 keys controlled by the four fingers and four keys controlled by the thumb of the same hand. On it, the operator forms chords somewhat as a pianist forms chords on a piano. It allows the user to type at normal speed using only one hand and offers the possibility of typing at a faster rate than the conventional two-handed keyboard. The operator presses several keys at once, as when playing a chord on a piano. Each finger or thumb can press one key, or overlap two or four adjacent keys to press the two or four keys. There are 27 such finger positions on the 10 finger keys and 7 thumb positions on the four thumb keys. The thumb position on the thumb keys select the alphabet/-case, output order of characters in the chord, a space character preceding the chord, and capitalizing of the first outputted character of a chord. The finger positions on the finger keys select the characters in the alphabet/case selected by the thumb position. The disclosed system describes a mechanical design of the keys, and control circuits that interpret the chords and emit signals representing the strings of characters implied by the chords.

31 Claims, 26 Drawing Figures

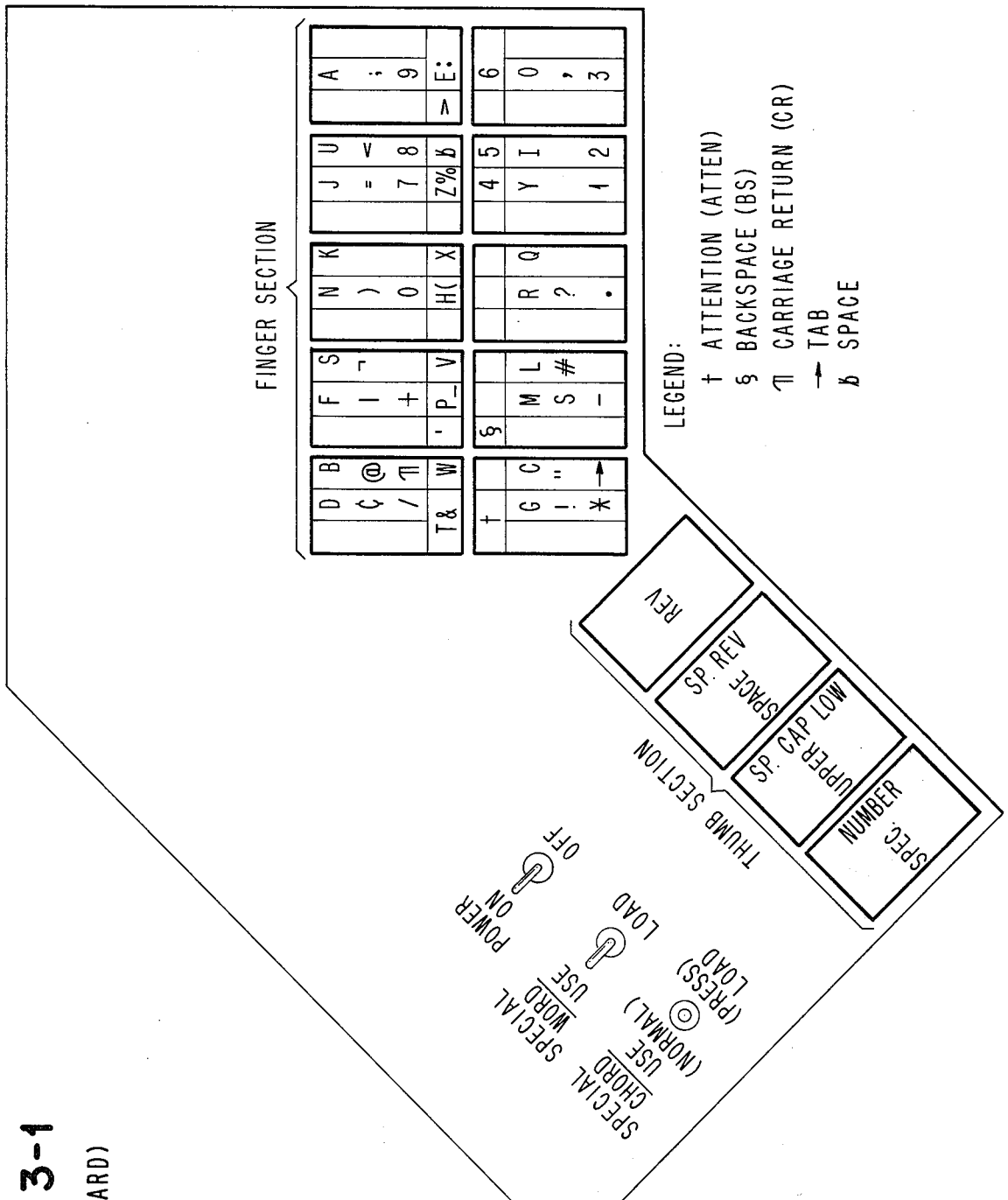
FIG. 3-1 (KEYBOARD)

FIG. 3-2 LETTER ALPHABET (LOWER CASE HAS SAME LETTER POSITION)
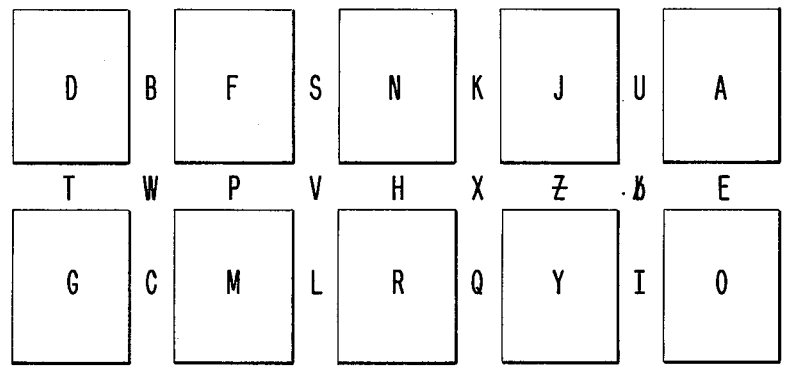
FIG. 3-3 SPECIAL CHARACTER ALPHABET
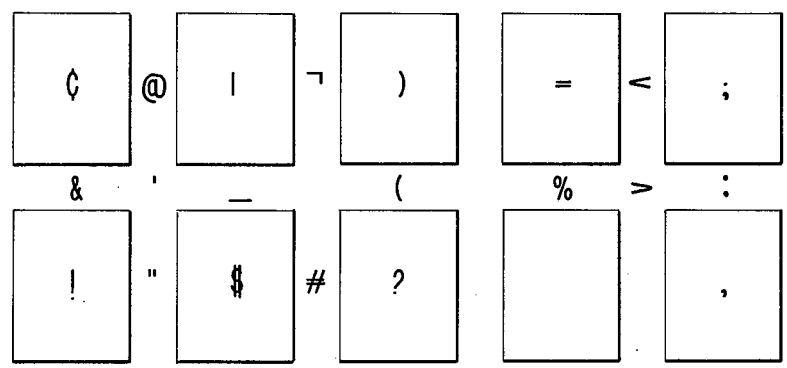
FIG. 3-4 NUMBER ALPHABET
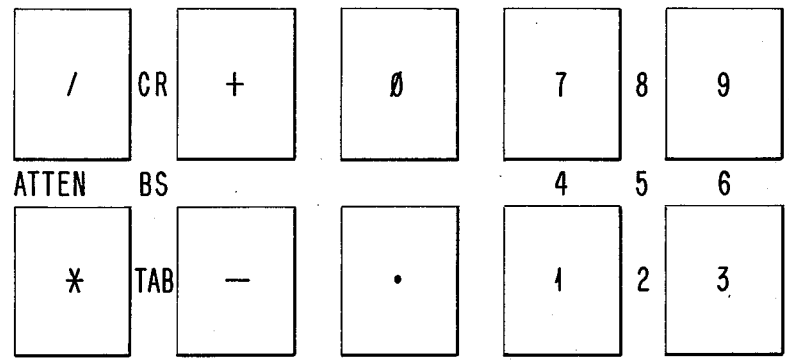

(THUMB KEY SECTION)

(FINGER KEY SECTION)

(KEYBOARD MECHANICAL CONSTRUCTION)

(SIDE VIEW)

FIG. 5.1-1
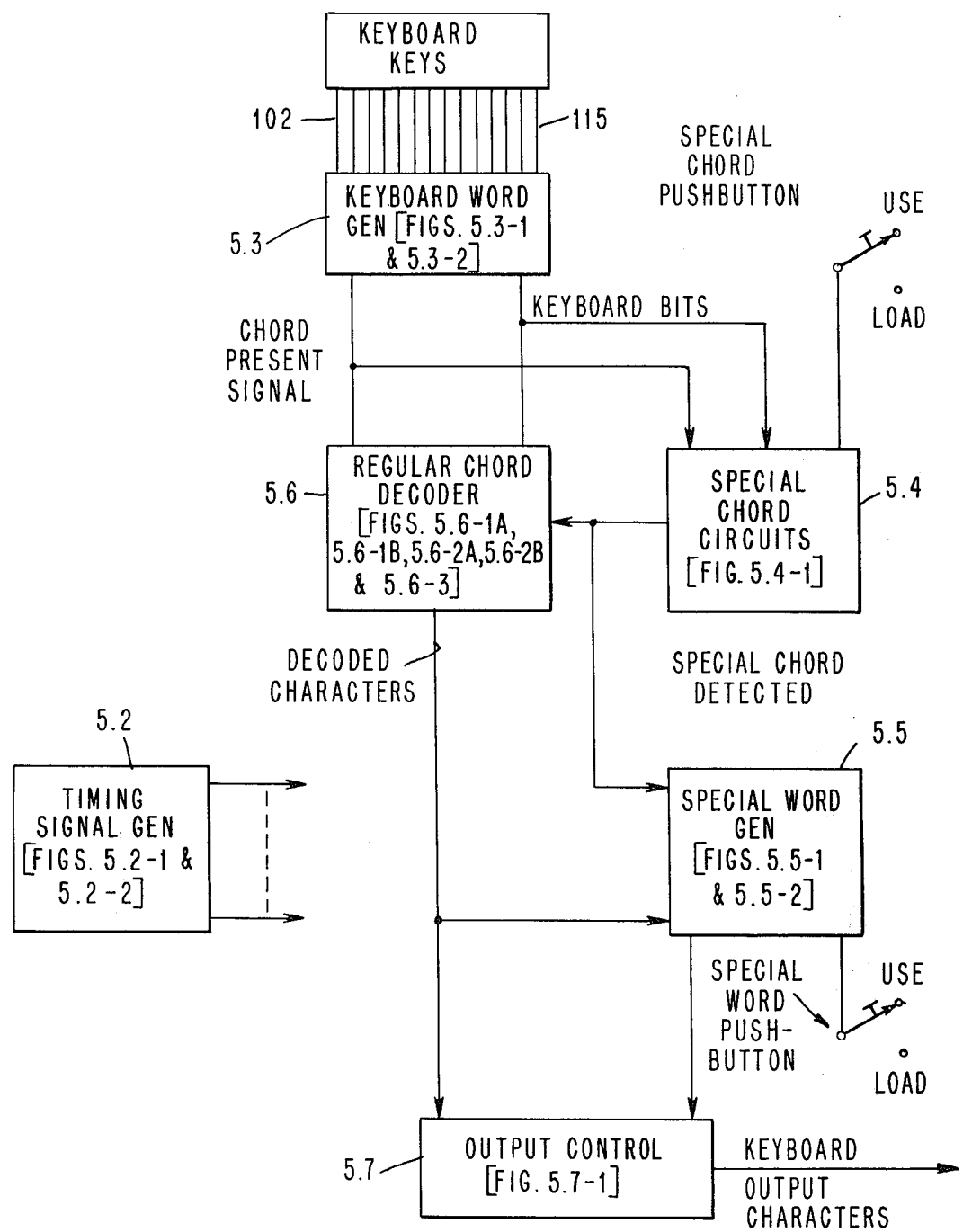

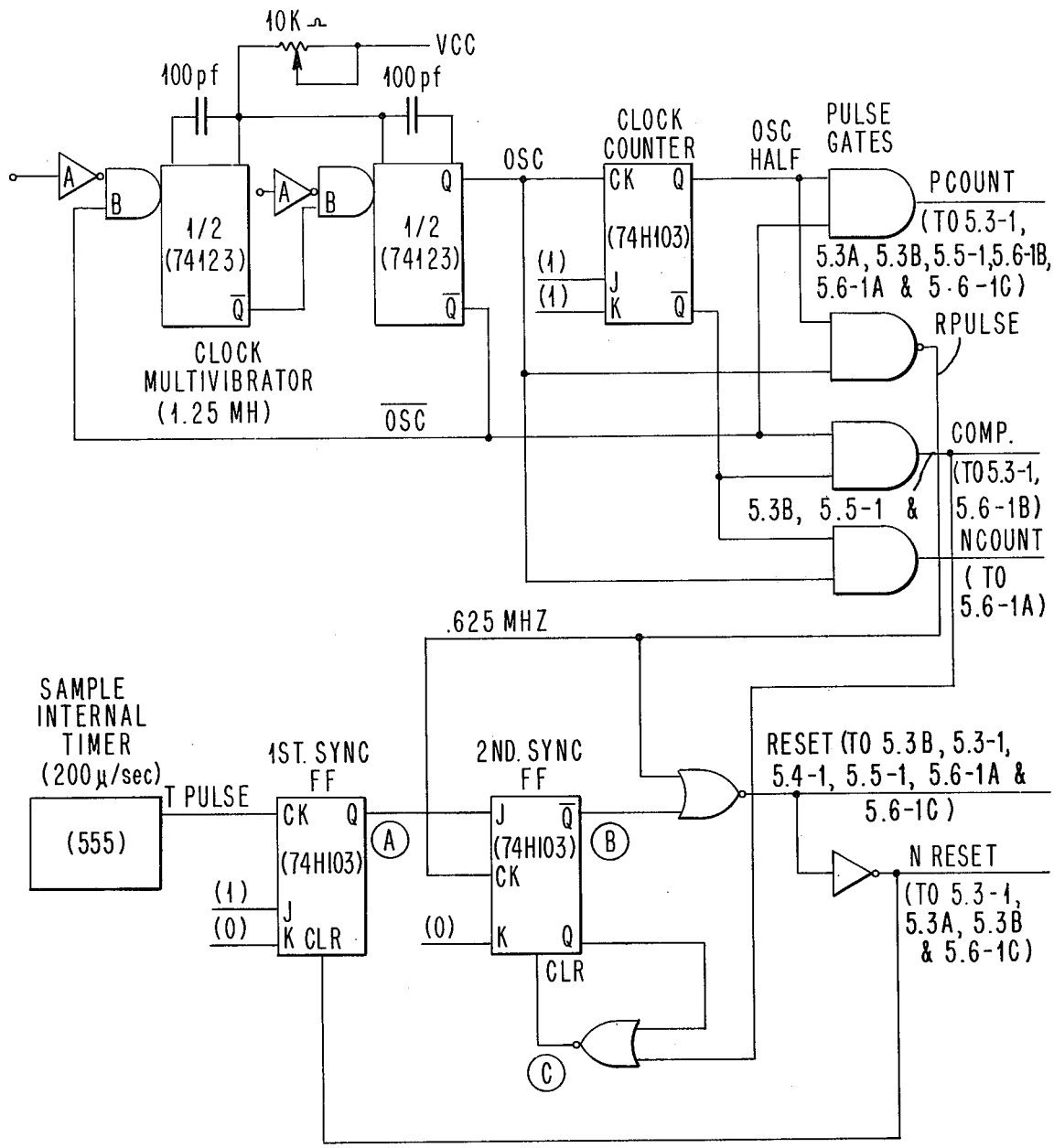
FIG. 5.2-1 (TIMING SIGNAL GENERATOR)

FIG. 5.2-2
(TIMING SIGNAL GENERATOR TIMING)
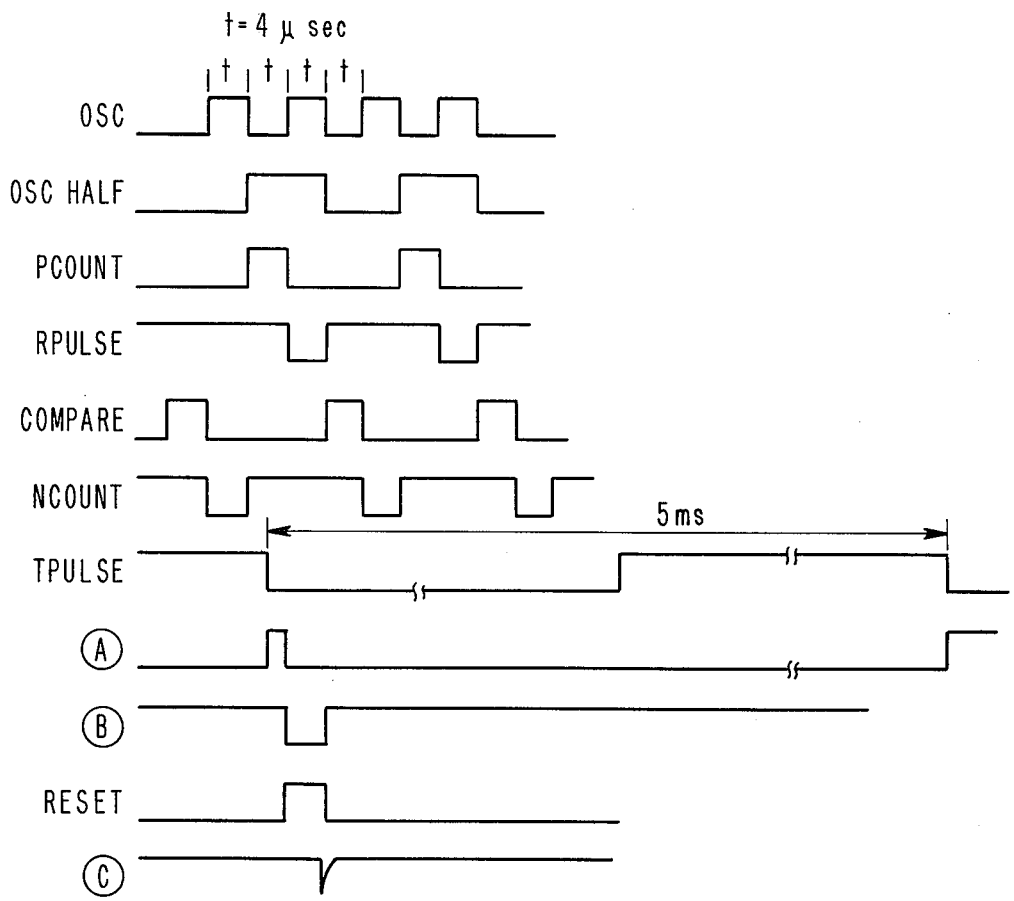

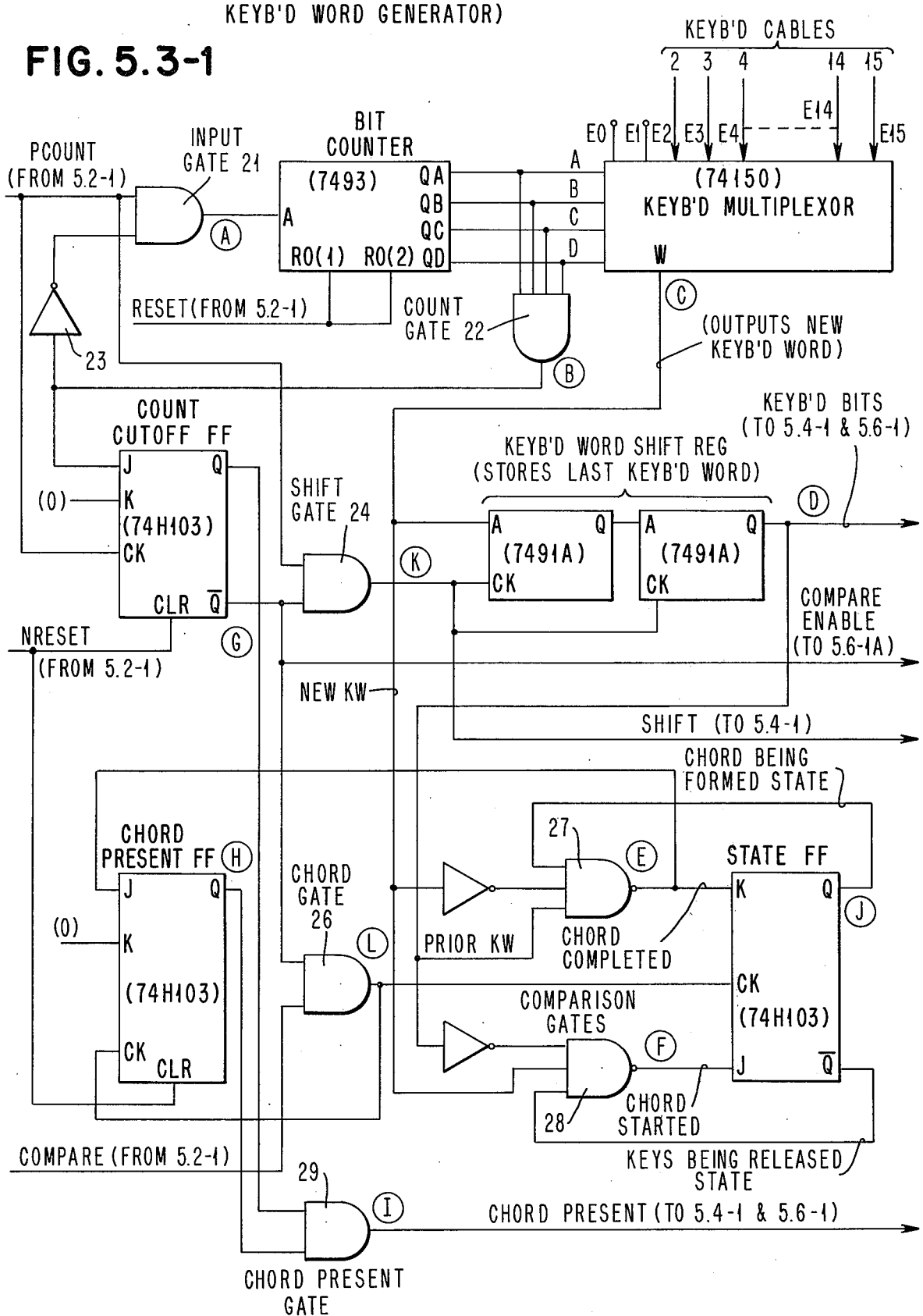

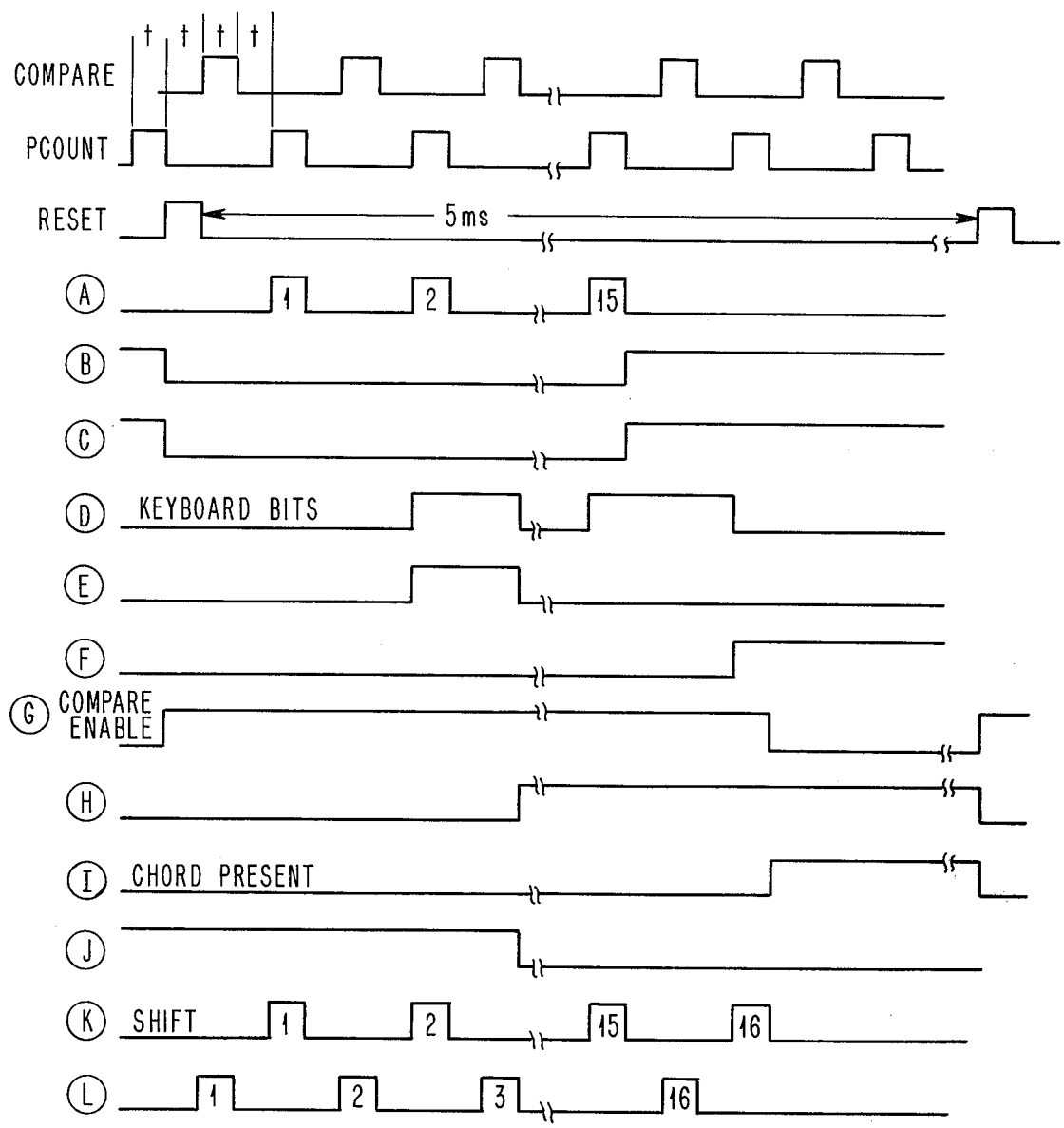
FIG. 5.3-2
(KEYBOARD WORD GENERATOR TIMING)

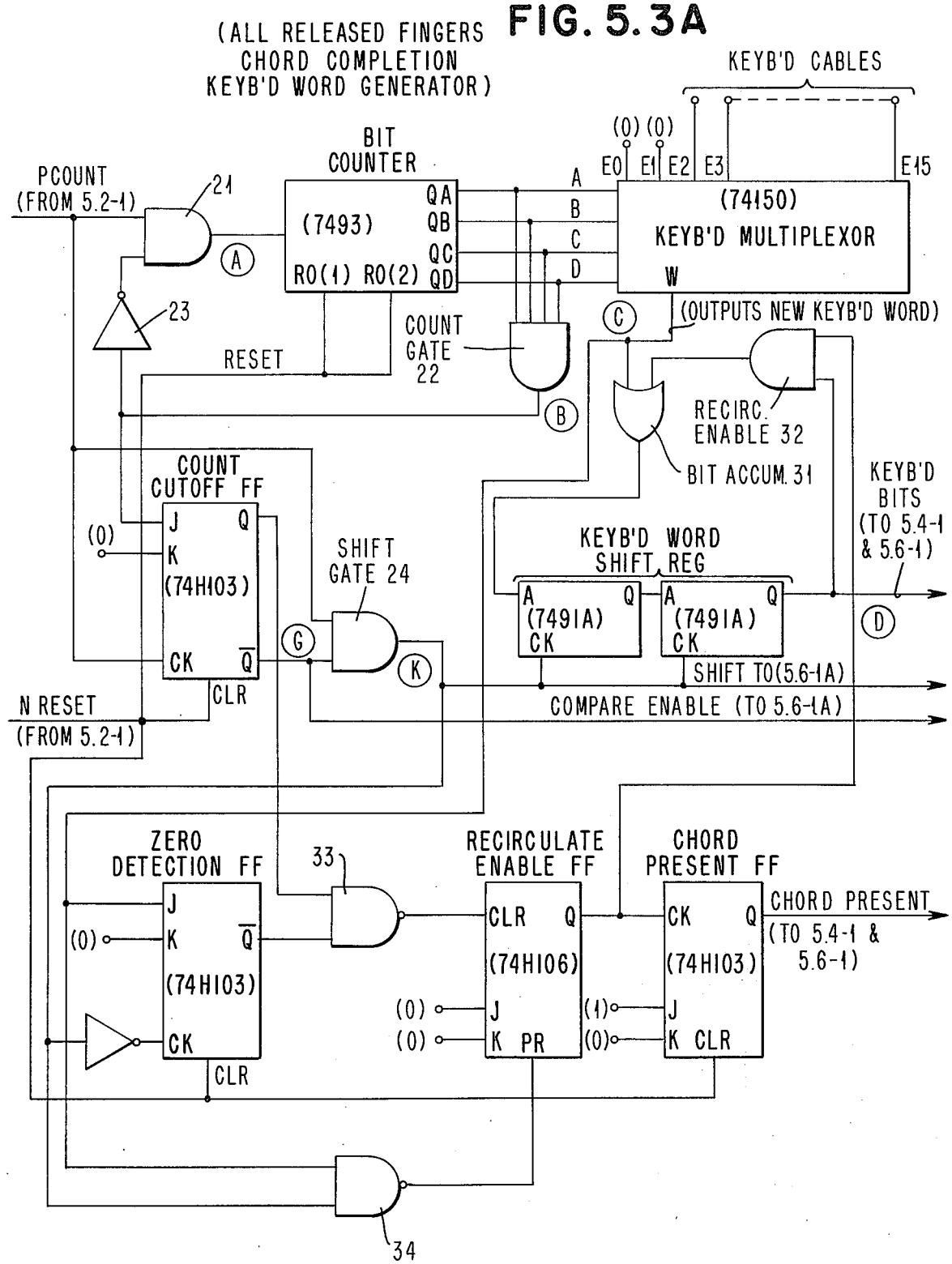
FIG. 5.3A
(ALL RELEASED FINGERS CHORD COMPLETION KEYB'D WORD GENERATOR)

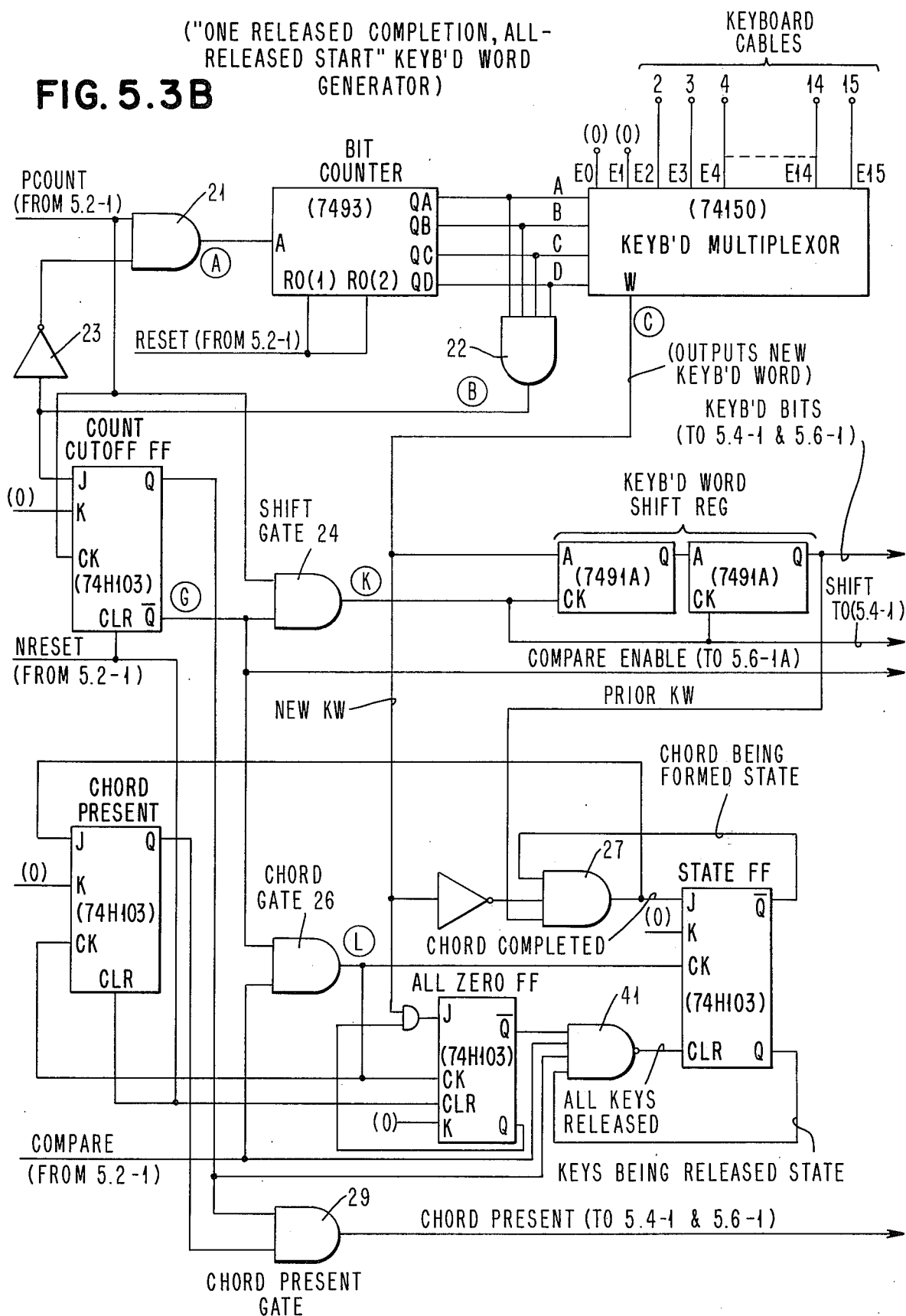
FIG. 5.3B ("ONE RELEASED COMPLETION, ALL-RELEASED START" KEYB'D WORD GENERATOR)

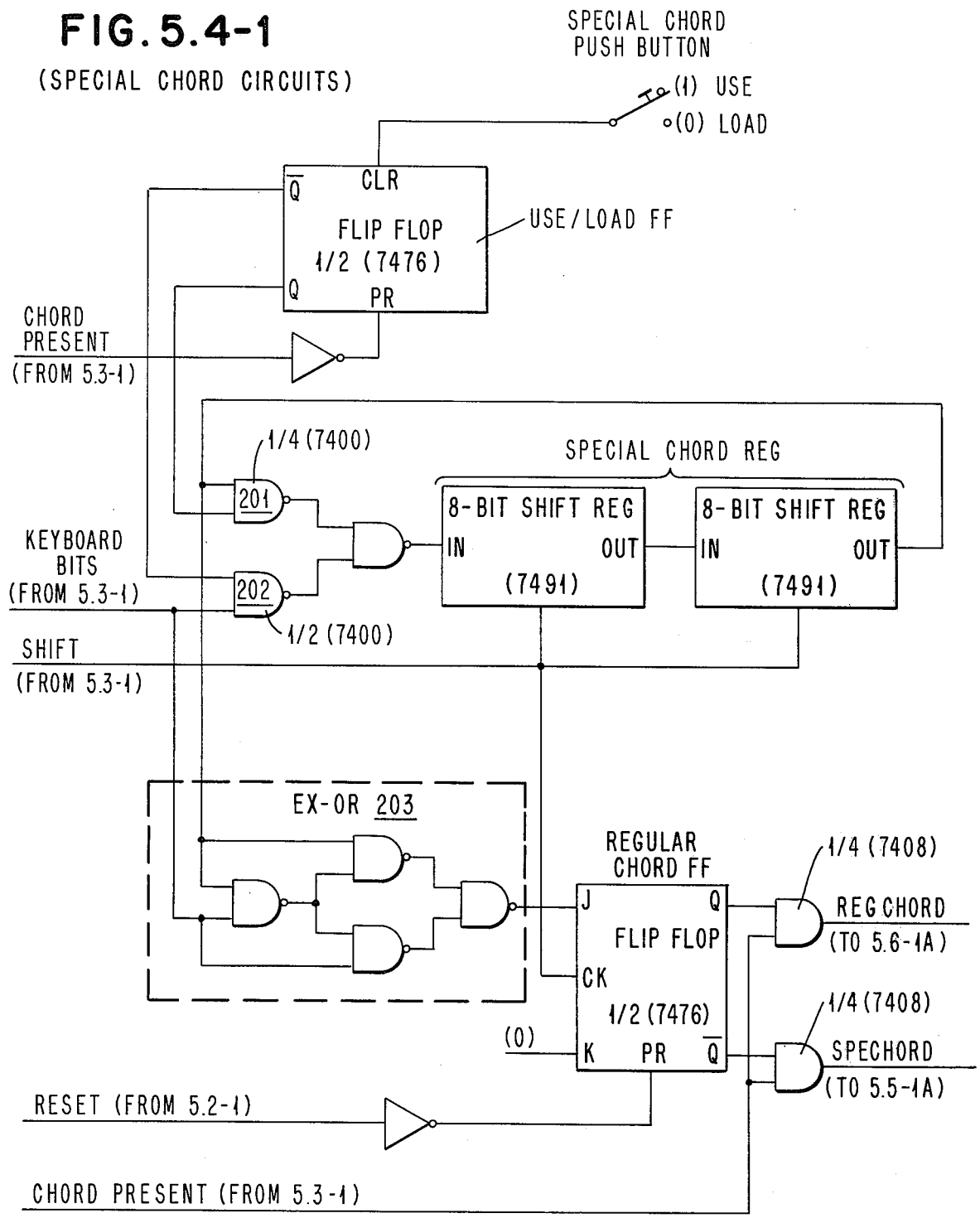
FIG. 5.4-1
(SPECIAL CHORD CIRCUITS)

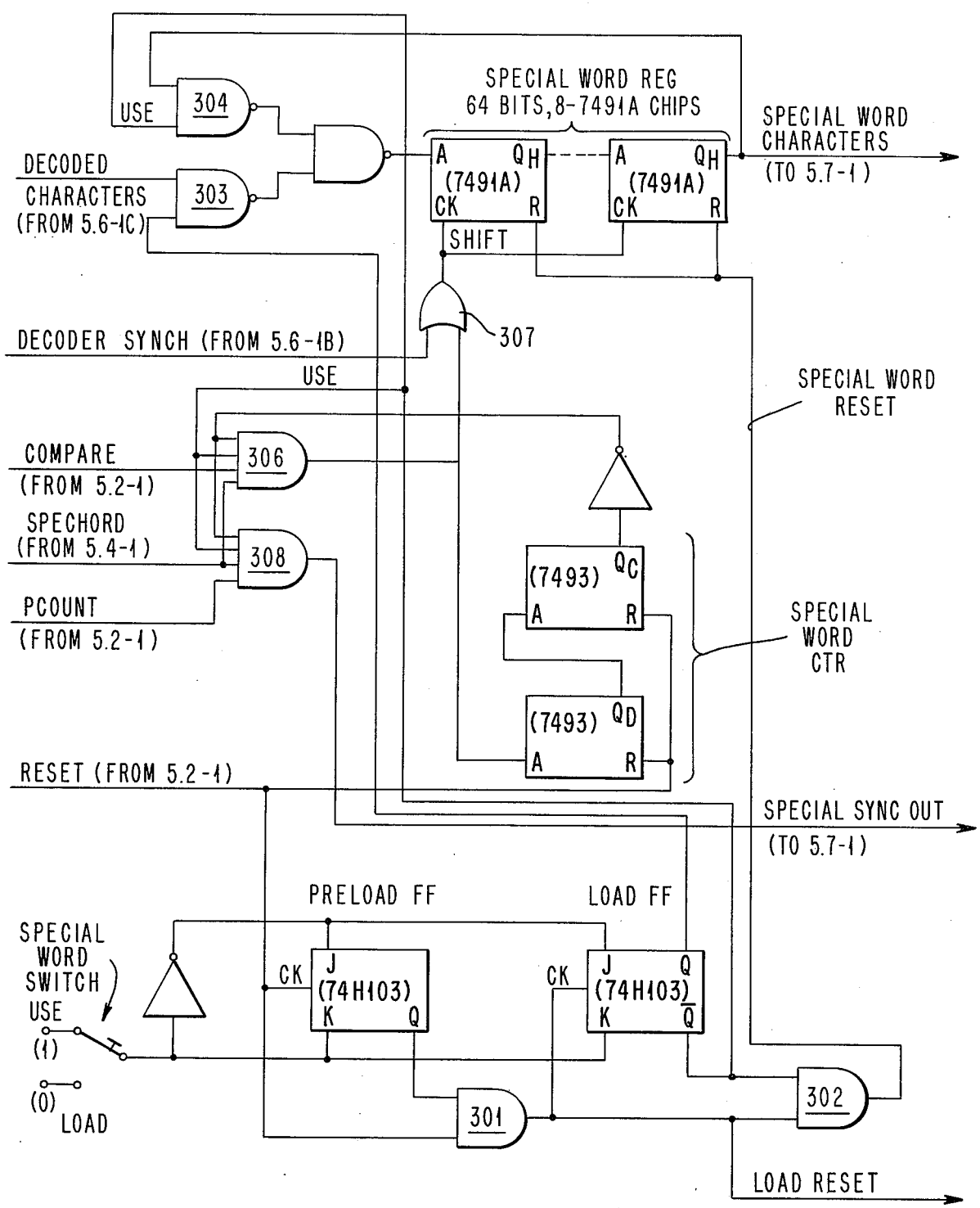
FIG. 5.5-1 (SPECIAL WORD GENERATOR)

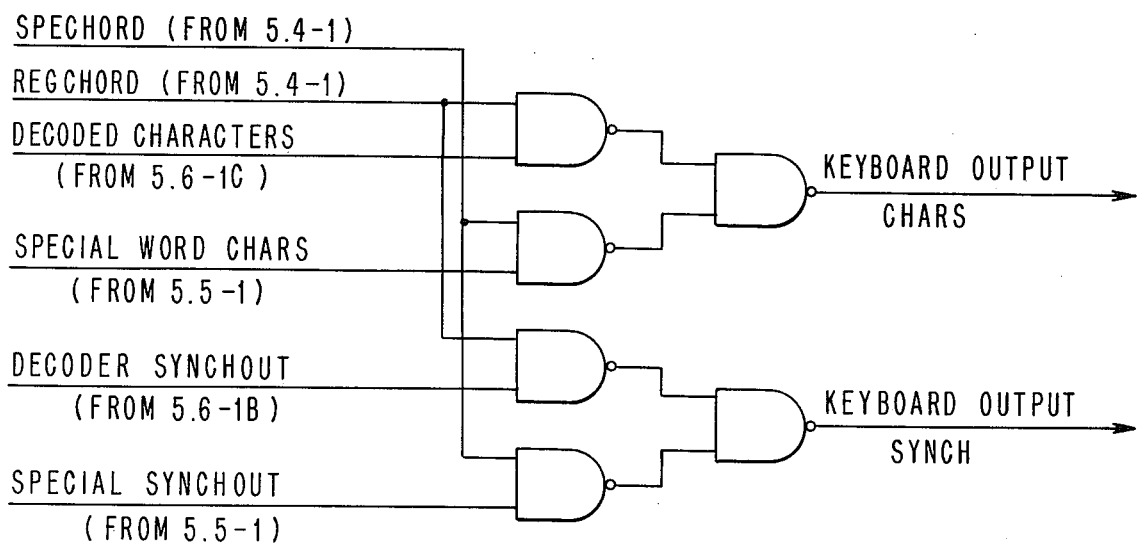
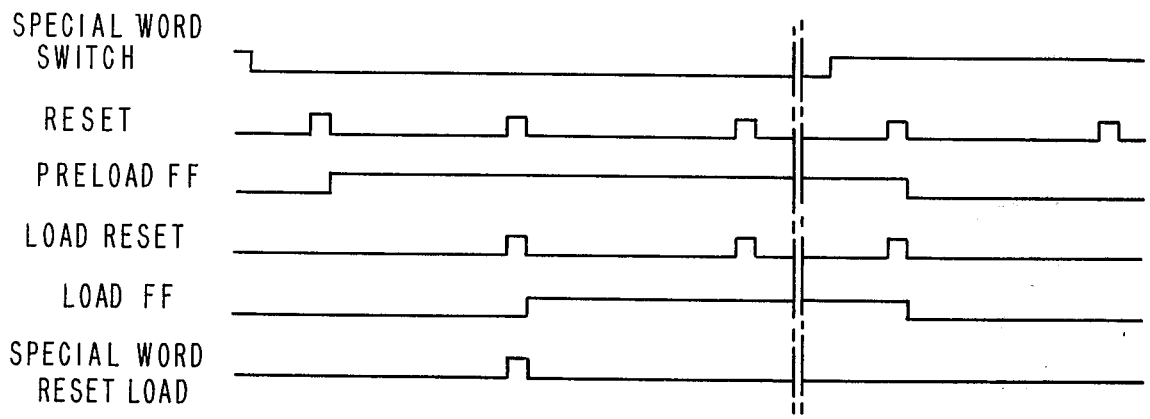

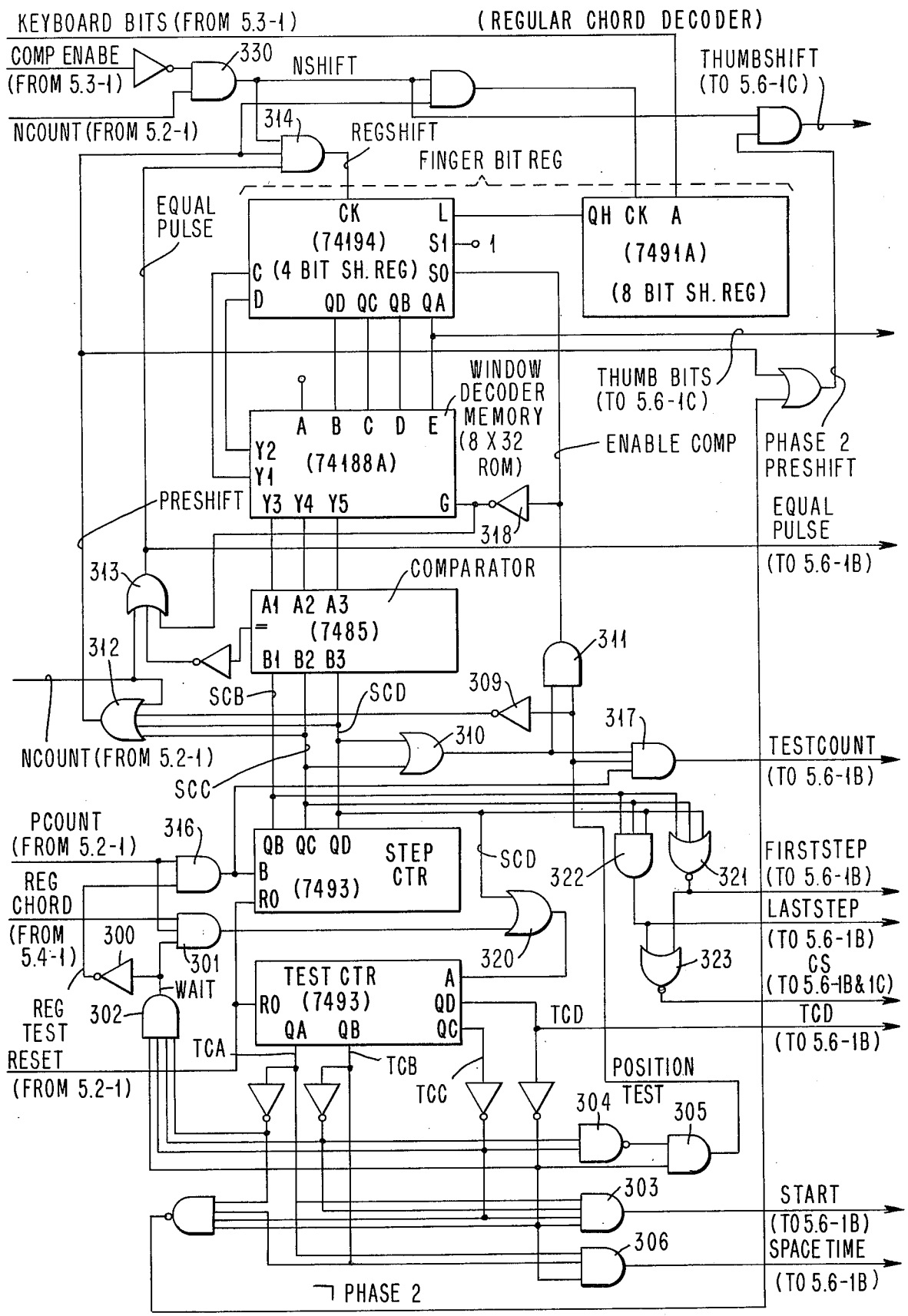
FIG. 5.6-1A

FIG. 5.6-1B
(REGULAR CHORD DECODER)
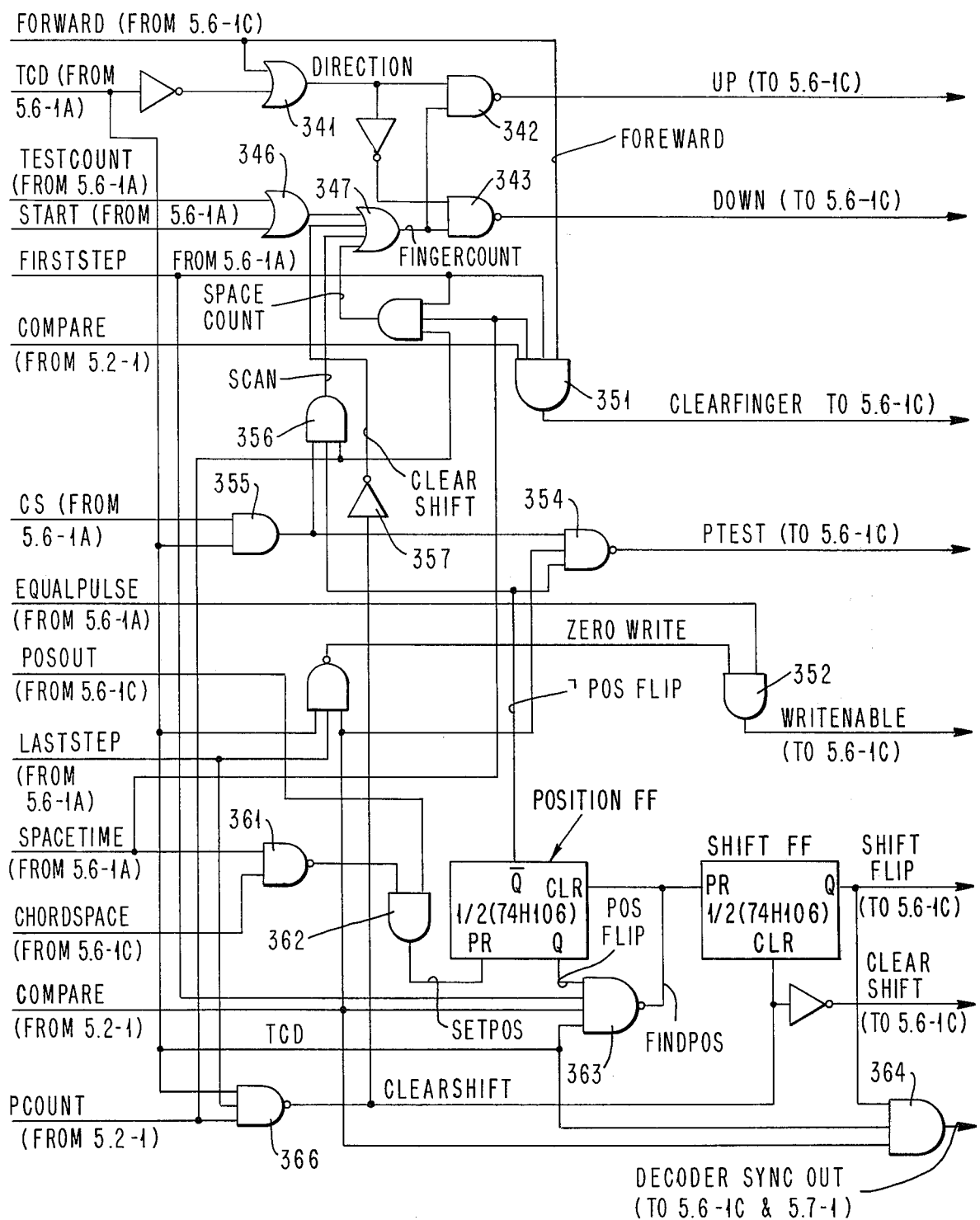

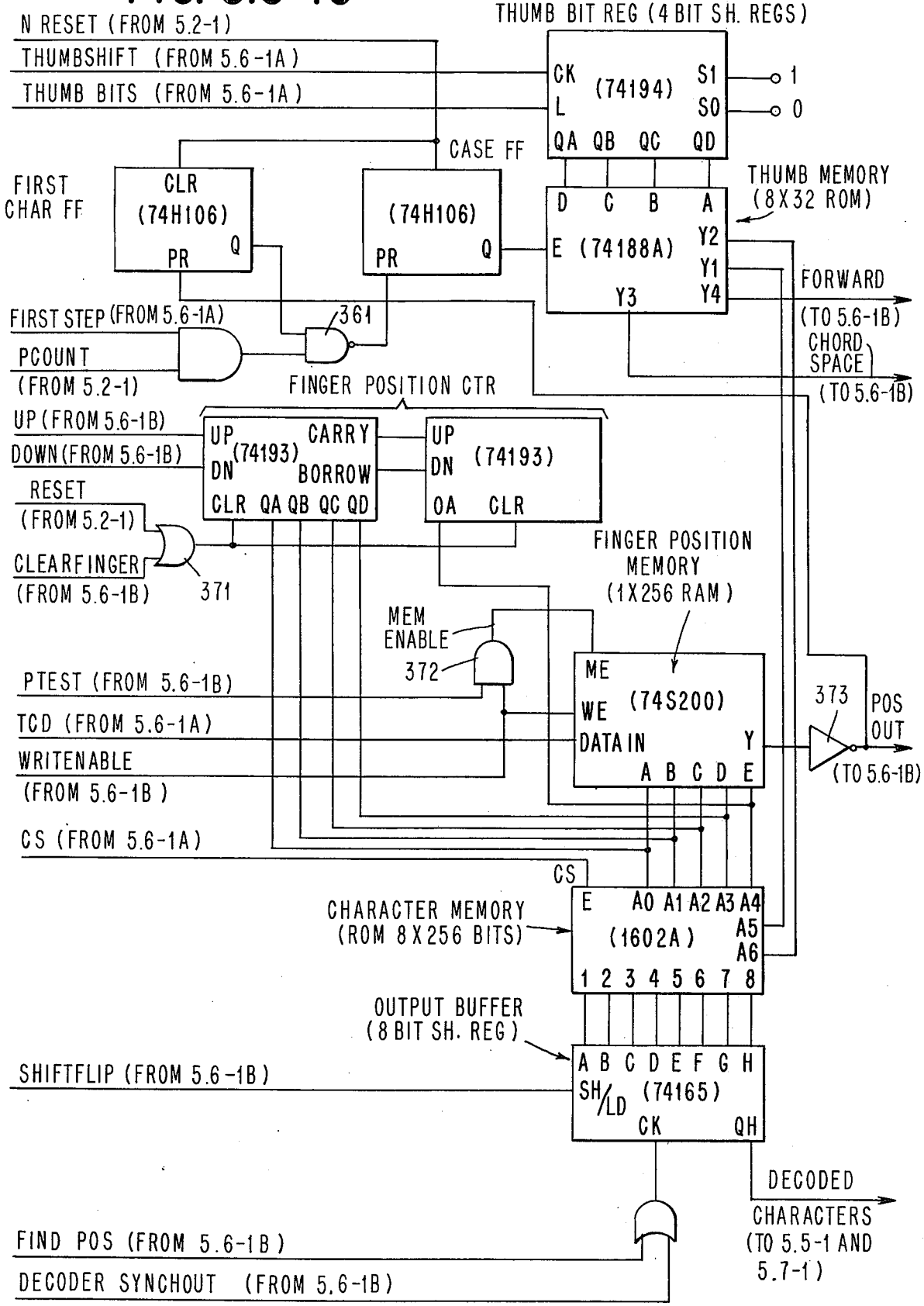
FIG. 5.6-1C

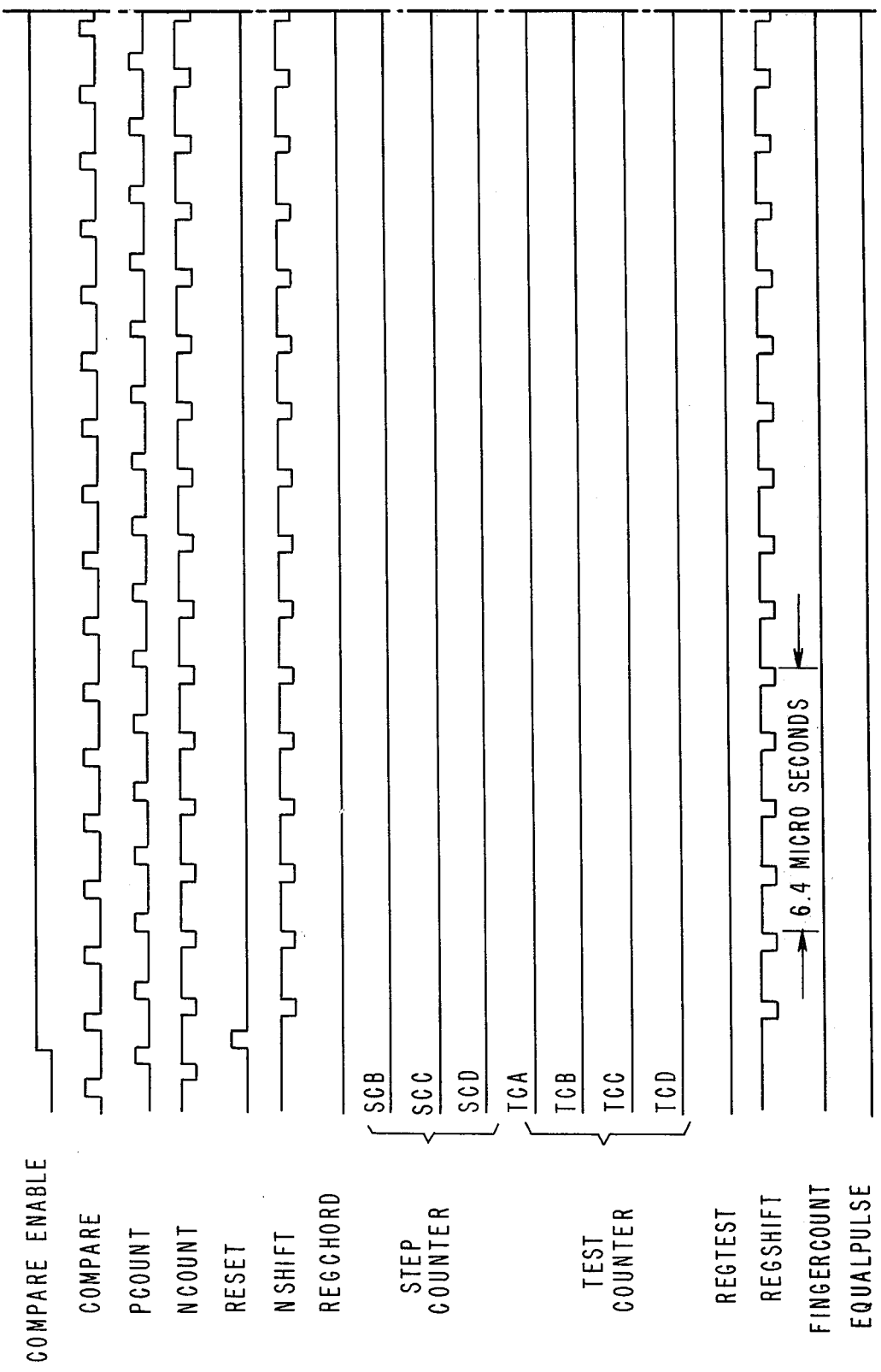

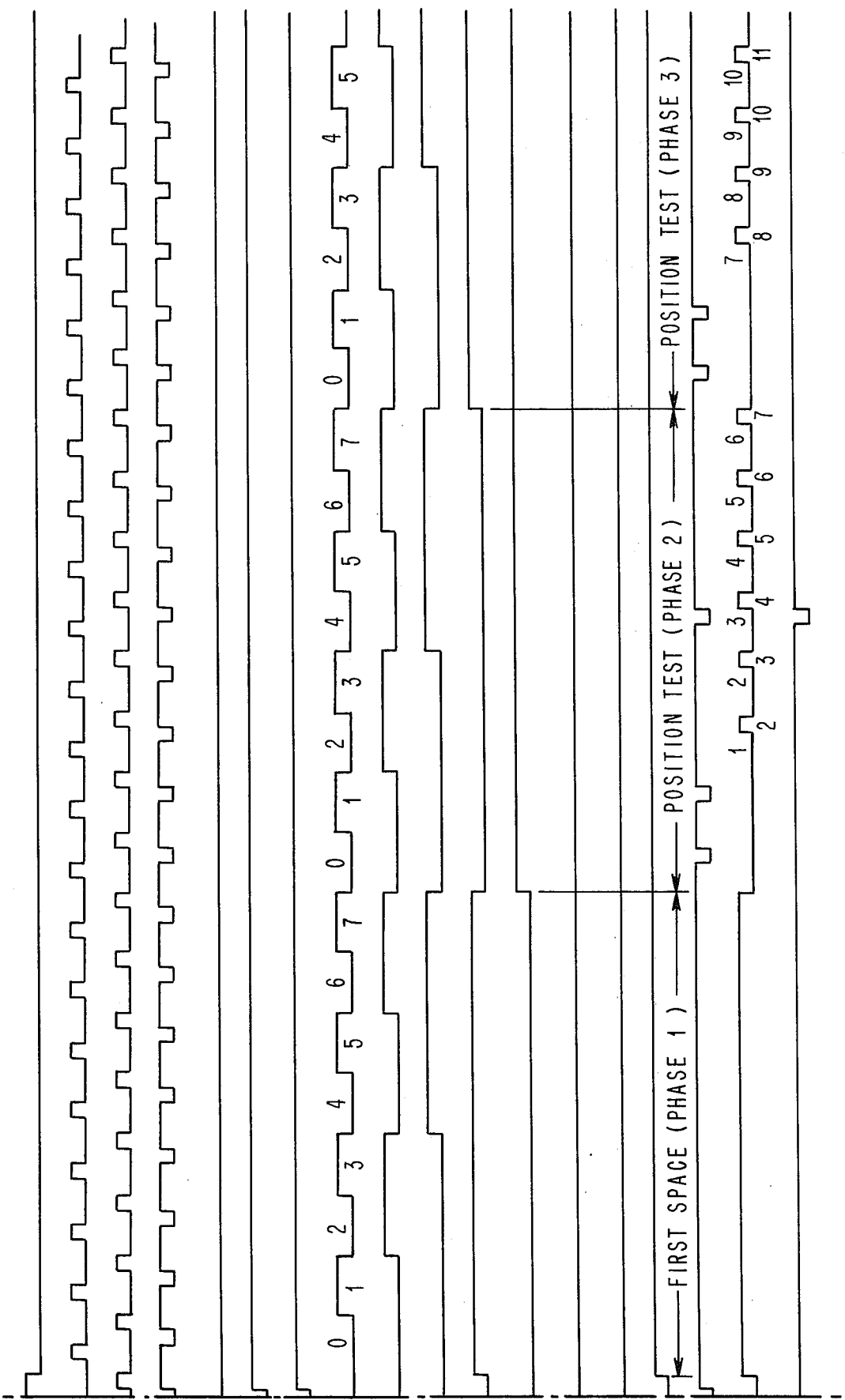
FIG. 5.6-2B

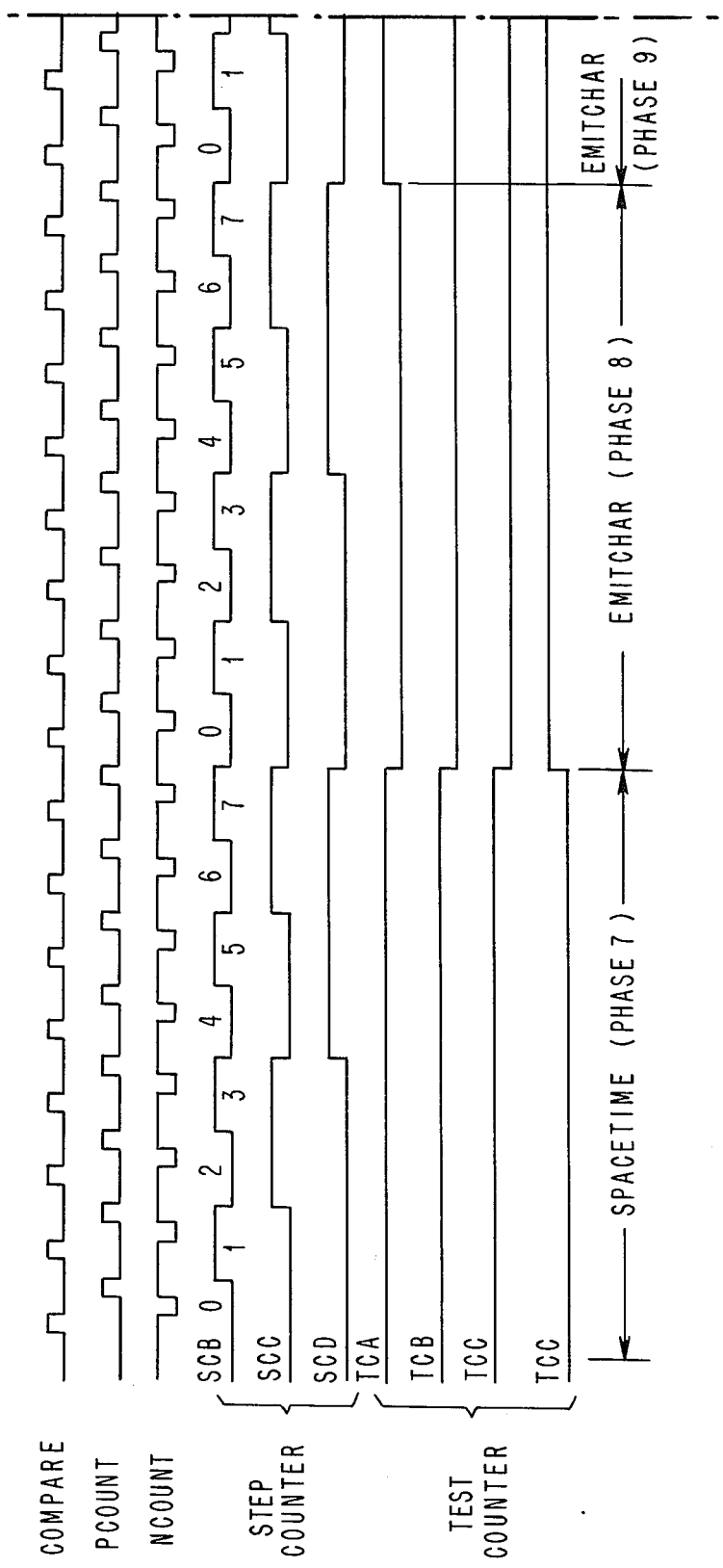
FIG.5.6-3A

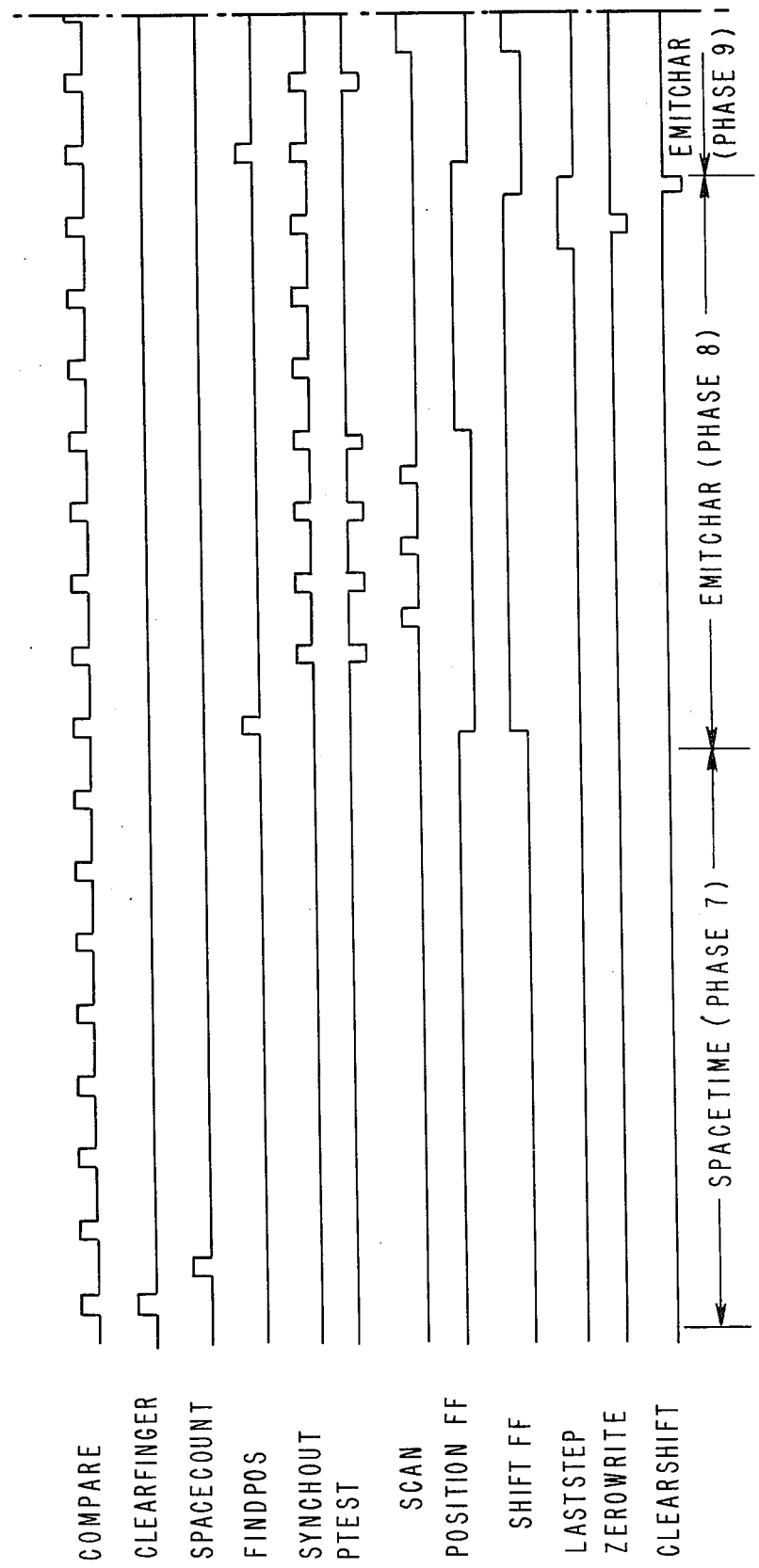

ONE-HANDED KEYBOARD AND ITS CONTROL MEANS

This is a continuation, of application Ser. No. 619,867 filed Oct. 6, 1975, now abandoned.

1. Introduction

This invention relates to a keyboard operated by one hand, and its electronic control circuits. The single-handed operation can in a single movement press one or more keys to comprise a chord which is sensed by the control circuits that generate one or more characters in an output signal sequence.

1.1 Background of the Invention

The conventional two-handed typewriter keyboard has been in use for decades and is well known. The conventional keyboard is not chord operated, that is, only a single key may be pressed at a single time to generate a single output character.

The stenotype, which is well known but in lesser use is arranged for both hands to form chords. The stenotype is not a typewriter but rather it is a machine for taking shorthand mechanically.

The major disadvantage of the stenotype is that its output transcription is actually produced at a slower rate than the conventional single-key-at-a-time typewriter because its output format is not in a desired form and therefore must be retyped using the conventional typewriter to transcribe its output. Hence, the double typing to obtain the final typed product results in a slower overall rate than the rate of the conventional typewriter.

The advantage of the stenotype is that it permits the typist to record 200 words per minute on the average and in exceptional cases up to 300 words per minute using a shorthand type of phonetic chord operation. On the stenotype keyboard, a single finger can press either one or two keys at once and up to all fingers of both hands can be used to simultaneously actuate the keys on the keyboard which are sensed in left-to-right order for outputting onto paper.

The present invention performs the function of a typewriter keyboard and to do this it uses the technique of forming chords that is used in the stenotype.

Prior art in this area is found in the following:

1. Proceedings AFIPS 1968, Fall Joint Computer Conference, Pages 395–410, "A Research Center for Augmenting Human Intellect", by D. C. Englebart and W. K. English.

2. U.S.A. Pat. No. 3,833,765 to Hilborn et al, filed Jan. 30, 1973 and issued Sept. 3, 1974.

The Engelbart et al paper describes an arrangement having a five keyboard, in which the keyboard is operated by one hand to control CRT cursor functions selected by the other hand. The five keys of the keyboard are actuated simultaneously in 31 combinations to select one character of an alphabet/case, which is selected by pressing one or more of these buttons with the other hand.

The Hilborn et al patent discloses a one-handed keyboard which generates a single character by two sequential key depressions. Sequential key depressions are not used by the subject invention for generating a single character. The subject invention introduces the novel principle of finger positions in chords, in which a single finger can depress plural keys to generate a single character with a single finger depression and multiple characters can be generated by a single hand depression using multiple fingers to generate one character per finger in the chord.

2.0 Objectives

The keyboard provided by this invention can be designed to be a light weight portable device that can be operated with one hand. The keyboard provides the full character set conventionally available on commercially available typewriters. The keyboard described herein is shown in a form intended to represent the English alphabet. However, the keyboard can be used to represent any alphabet used by any language. Also, the invention permits the user to add special characters and combinations of characters. A properly trained average operator should be able to type with one hand using this keyboard at a rate equal to or better than 60 words per minute, thus equaling the typing speed of a good typist using a conventional typewriter keyboard. An above average typist should be able to type at a faster rate on this one-handed keyboard than on the conventional two-handed keyboard. The keyboard produces as an output, a series of characters encoded as electric signals that are suitable for input to a light emitting display, printer data transmission device, computer, or other such keyboard operated device.

2.1 Summary of the Invention

The invention permits one hand to type English alphabet characters (or characters in the alphabet of any other language) in a complete unambiguous form. It is not a stenotype for recording sounds which require subsequent typing transcription.

The invention provides a novel keyboard arrangement with novel electronic circuitry for uniquely interpreting each chord depression of keys comprising plural finger positions to generate simultaneously one or more characters. Each finger position actuates up to four keys for generating each character.

The invention provides a one-handed keyboard which is structured with a finger key section and a thumb key section. The keys in the thumb key section operate as follows:

1. No thumb key pressed.
2. Any one of the thumb keys pressed. 3. Any two adjacent thumb keys pressed.

The finger key section is operated by the four fingers of the same hand used to operate the thumb section. Each finger can operate a single finger position involving:

1. Pressing no keys.
2. Pressing one key.
3. Pressing two adjacent keys.
4. Pressing four adjacent keys.

While a single chord operation is performable by a single finger to output one character, a complex chord operation is also performable by up to four fingers simultaneously pressing the keyboard to generate up to four characters.

There are 1,023 finger-position chords that can be produced with ten keys, but anatomical limitations exclude 48 which are not keyable. This leaves 975 playable finger-position chords. When eight thumb-position chords are available, the total number of playable keyboard chords is 7,800. The amount of information conveyed by a single chord may be calculated to be log2 7,800=12.94 bits. If the typist keys three chords per second, as is done in stenotyping, then the rate at which information is entered becomes $$3\log_2 7{,}800 = 38.8 \text{ bits/sec}$$

This may be compared with the corresponding theoretical rate of a conventional two-handed keyboard as follows. The rate of 75 words (4 characters and a space) per minute is 6.25 characters per second. There are 48 keys so the theoretical rate is $$6.25 \log_2 48 = 34.9 \text{ bits/sec}$$

It should be noted that these calculations are only approximate because they ignore several factors including the fact that different characters have different probabilities, some characters are harder to type than others, some have sequences of characters harder than others, the upper/lower case coding is ignored, and some chords are harder to form than others. However, this analysis provides a qualitatively correct explanation of why the chord keyboard works so well and provides useful quantitive approximations. The stroke of the keys is changed, and described below, so the typist should be able to exceed the stenotype rate of three strokes per second, thus perhaps exceeding normal keyboard performance to an even greater degree.

The next question is how to implement this invention. There are many ways. A word could be assigned to each chord, but this would be hard to learn. A particularly interesting assignment of meanings is shown in FIGS. 3-2, 3—3 and 3-4 which show the assignment of characters to finger positions used by the detailed embodiment in this specification. This assignment of characters to finger positions (not to be confused with the conventional assignment of characters to keys) makes it possible to exploit the potentialities of this keyboard without requiring an unreasonable amount of learning on the part of the typist. It is designed for typing English based on the frequencies of common two-letter and three-letter sequences in English.

The finger-position concept can be explained using FIG. 3-2. Suppose the typist presses only the N key; he then outputs the letter N. But if the finger simultaneously presses the N key and the F key, he outputs the letter S shown between the two keys, and he does not output either letter N or F. Furthermore, if the typist presses the four adjacent keys F, N, M and R with one finger, he outputs the letter V shown centered in this quad-group of keys, and none of the letters F, N, M, R is outputted.

This keyboard, unlike prior chord keyboards, such as the stenotypewriter, allows the novice to do "hunt and poke" typing with one finger operating on the finger positions.

The typist who is willing to learn touch-typing can take advantage of additional resources of the keyboard in order to type faster. There are several levels of learning to speed up typing; and when the typist advances to a new level, he will rise to a new and faster typing speed.

By pressing a chord of several finger positions at once, it is possible to output several letters with a single hand movement. For example, the trigraph "the" can be entered with one chord, and the digraph "tr" can be entered with one chord. These are outputted as sequences of lower-case letters in the letter alphabet of FIG. 3-2 by simply pressing simultaneously the finger positions marked with these characters without pressing any thumb positions.

The thumb keys shown in FIG. 3-5 control the selection of alphabets/cases, and related chord control operations. Four thumb keys can support up to eight alphabets/cases and chord control operations. The alphabet/cases selection determine in which alphabet and in which case a pressed finger position is to be outputted. Examples of chord-control thumb positions include (1) selecting the output sequence of letters in the chord, i.e. normal or reverse, (2) prefixing a space when outputting a chord, and (3) capitalizing the first outputted character of a chord. The thumb position controls make it possible to increase substantially the number of characters that can be outputted by pressing a single chord.

The chord control thumb positions are available to a typist who has reached the second level of learning to touch-type. The first level consists in learning to touch-type on the individual finger positions. This second level should take very little additional learning time, and it represents the basic skill of a typist using this keyboard.

The contribution of chords to typing speed can be illustrated by the following example which shows a sample of text with slashes used to delimit the text entered with each chord. In this example we show the maximum number of characters per chord that could be typed by a skilled typist.

/A/ li/ne/ bu/f/fe/r/ co/nt/ain/s/ al/l/ tho/se/ cha/-ra/c/te/rs /re/ad/ by/ the/ sy/st/em/ si/nc/e/ the/ la/st/ end/ of/ li/ne/ wa/s/ de/te/c/te/d/./

In this example, the typist enters 2.28 characters per chord stroke. If the typist makes three strokes per second, this means a typing speed of 6.8 characters per second or 82 words per minute with a single hand. The other hand is free do do other things, such as turn pages, or even type a second one-handed keyboard. Thus, it is conceivable that a person could operate two of these keyboard at once, one for each hand. It is possible that two one-hand 14-key keyboards would overload a typist so he could not quite double his speed by doubling the number of keyboards.

A careful study of the example above will reveal the need for more complicated rules for interpreting complex chords. A consistent rule was followed in delimiting the sample text, and the rule will be evident to someone who studies the example in detail but will probably be meaningless to someone who does not. The rule is to proceed in the direction indicated analyzing the text, finger position by finger position, to associate them to form chords.

It is clear that there are a lot of chords that can be formed by a typist that would not occur in typing normal English text. The assignment of a frequently used special word to uncommon chords will allow faster typing at the cost of having to learn them. For example, the uncommon digraphs *qs* and *pz* are chords that could be assigned the special words "United" and "States", respectively. Also, double letter digraphs like *tt* are very common and could be assigned, like a single character, to respective unused single finger positions in some alphabet/case.

A typist who types a lot of letters might like a single chord, such as *qz* that would write "Sincerely yours, ". The invention permits ad hoc special words to be assigned by the typist to a given chord. For example, in most passages of text, certain words are very common and should be given ad hoc assignments. For typing this specification, the typist might want to assign "keyboard" to a single chord. A chord keyboard as provided by this invention provides an ample availability of chords for such uses.

2.2 Description of the Drawings

The foregoing and other objects, features and advantages of the invention will be more apparent from the following more particular description of the preferred embodiment of the invention illustrated in the accompanying drawings of which:

FIG. 3-1 is a top view of a keyboard embodiment of this invention.

FIG. 3-2, 3—3 and 3-4 represent three of the alphabets available from the 10 finger keys in the keyboard embodiment of FIG. 3-1.

FIG. 3-6 illustrates the window groupings of finger keys used by the electronic circuit for finger position decoding.

Figures 3, 4, 5:
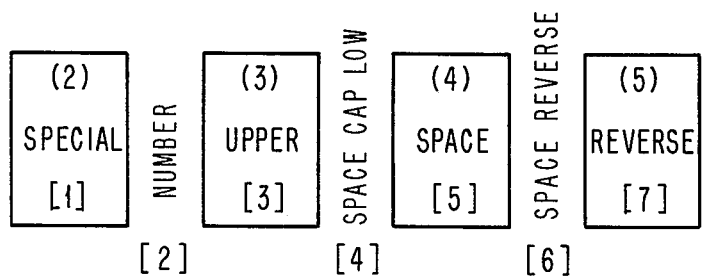
FIG. 3-5 illustrates the thumb key section of the keyboard.
Figures 3, 4, 5, 6:
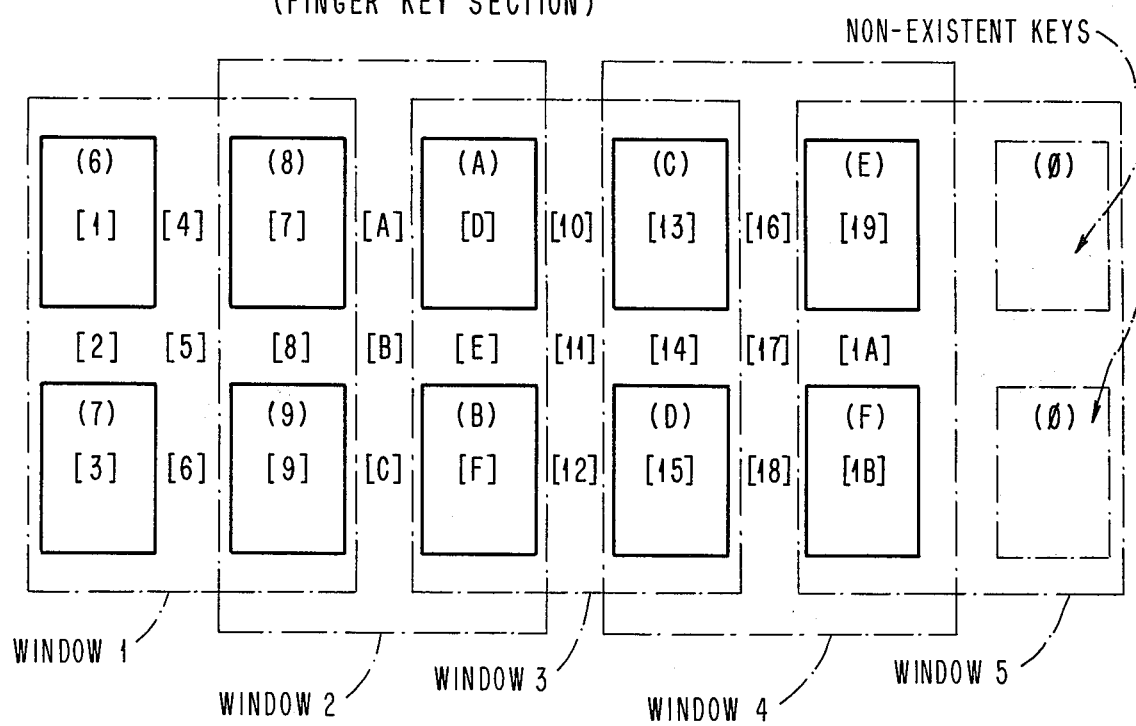
Figures 1, 2, 4:
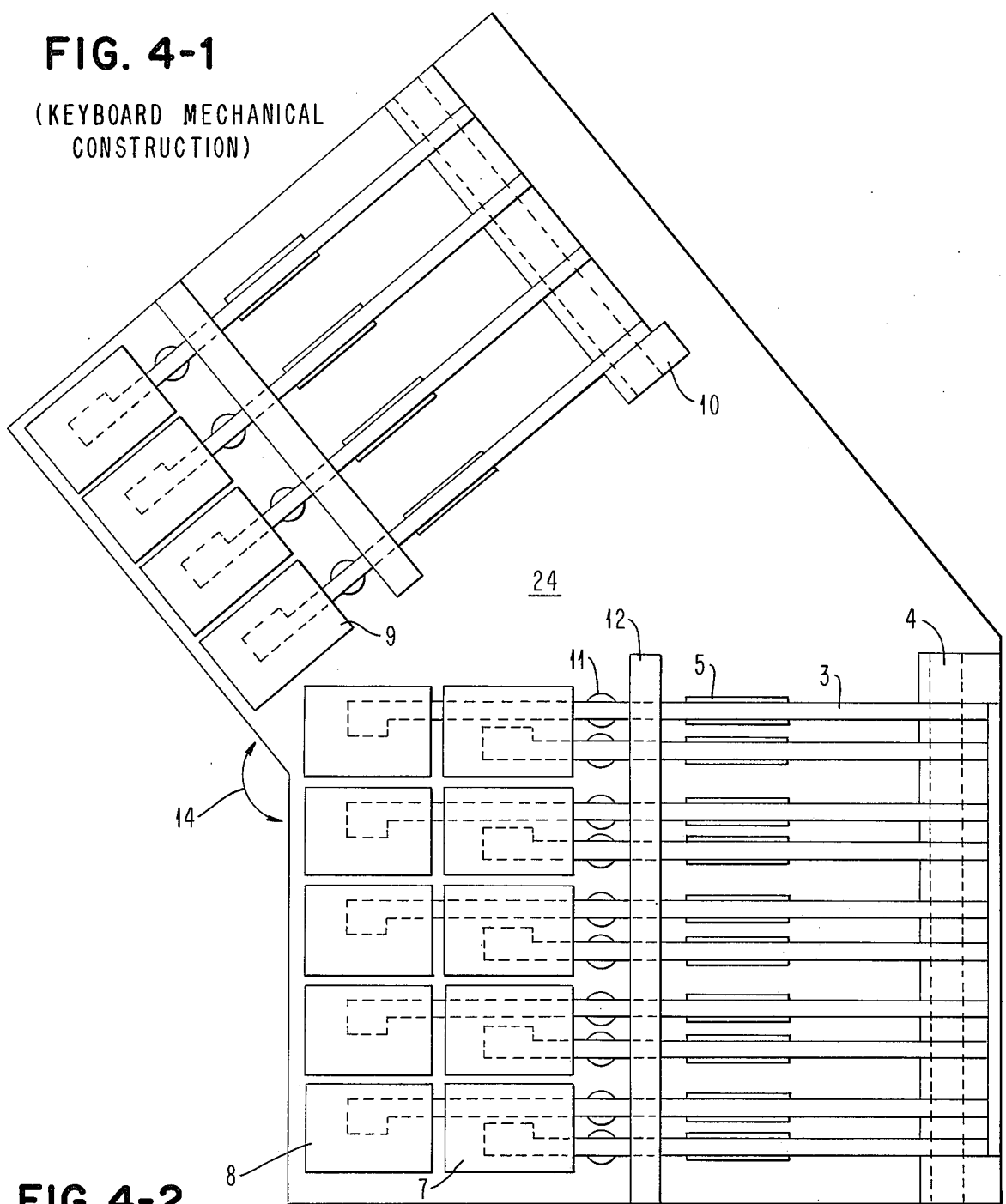

FIG. 4-1, and 4-2 illustrate mechanical views internal of the keyboard.

FIG. 5.1-1 is a block diagram of the keyboard control circuit sections provided in the detailed embodiment.

FIG. 5.2.-1 shows the circuits found in the timing signal generator section of the embodiment.

FIG. 5.2-2 illustrates the timing of signals of the timing signal generator of FIG. 5.2-1.

FIG. 5.3-1 shows circuits found in a keyboard word generator part of the embodiment.

FIG. 5.3-2 illustrates the timing of waveforms found in the keyboard word generator of FIG. 5.3-1.

5.3A and 5.3B show two different keyboard word generators, each being alternative to the generator in FIG. 5.3-1.

FIG. 5.4-1 illustrates a special chord circuits part of the embodiment.

FIG. 5.5-1 shows a special word generator part of the embodiment.

FIG. 5.5-2 illustrates waveform timings found in the special word generator of FIG. 5.5-1.

FIGS. 5.6-1A, 5.6-1B and 5.6-1C illustrate a regular chord decoder part of the embodiment.

FIGS. 5.6-2A and 5.6-2B show exemplary timing waveforms generated during the first eight phases of operation by the regular chord decoder of FIGS. 5.6-1A, 5.6-1B and 5.6-1C.

FIGS. 5.6-3A and 5.6-3B show exemplary timing waveforms generated during the last eight phases of operation by the regular chord decoder in FIGS. 5.6-1A, 5.6-1B and 5.6-1C.

FIGS. 5.7-1 shows an output control circuit part of the embodiment.

3.0 Detailed Embodiment

General Arrangement: The invention comprises the mechanical arrangement of a preferred form of one-handed keyboard, and the electronic circuits which generate the electrical signals upon actuation of the keyboard.

FIG. 3-1 is a layout of the keyboard designed for right hand operation. The keys and controls on the keyboard are as follows:

4 "thumb keys" are provided for entering information with the thumb of the right hand.

10 "finger keys" are provided for entering information with the four fingers of the right hand.

A "special chord" pushbutton permits the changing of special chords as discussed in section 3.4 below.

A "special word" pushbutton permits the changing of special words as discussed in section 3.4 below.

A "power switch" turns keyboard power on and off.

The finger keys and thumb keys are arranged in the manner shown in FIG. 3-1 so that in operation the fingers of the right hand can rest approximately in the center of the finger keys with the thumb resting in the middle of the thumb keys. The finger and thumb keys are flat and of a hard material with the thumb keys being about one-half inch below the level of the finger keys.

The four fingers of the right hand operate the ten finger keys. Chords are produced by pressing keys using from one to four fingers simultaneously. Each finger can press one finger position in creating a chord. Hence a chord is formed by pressing one to four finger positions simultaneously. Each pressed finger position presses up to four keys, as follows:
  one key
  two adjacent keys
  four adjacent keys A total of 27 finger positions are pressable on the 10 finger keys and are respectively identified by the 27 hexadecimal number [1] through [1B] shown in FIG. 3-6. These 27 finger positions are also shown in FIG. 3-2 where they are respectively used to represent the 26 letters of the English alphabet and one finger position is used for the space character.

An example of a chord is to press simultaneously the finger positions for characters T, H and E in FIG. 3-2. The effect of this chord is to produce the sequence of letters "THE".

The thumb of the right hand operates any of seven thumb positions on the four thumb keys to select one of four alphabets/cases, a normal or reverse output order for characters in each chord, whether a space character preceeds the chord, and whether the first non-space character in the chord is capitalized. The seven pressable thumb positions [1] through [7] are shown in FIG. 3-5, as comprising:

Any one of four thumb keys, i.e. [1], [3], [5] or [7].
Any two adjacent thumb keys, i.e. [2], [4] or [6].

3.1 Left-Hand Keyboard

The left hand keyboard (not shown) is a mirrorimage reversal of the finger and thumb key locations on the keyboard.

3.2 Thumb Positions

In the described embodiment, the thumb section can select any of four alphabets/cases in accordance with the thumb positions. The alphabets are as follows: 1. LETTER alphabets: provide lower-case and upper-case English alphabet letters.

2. NUMBER alphabet: provides the decimal digits, control characters, and some special characters.

3. SPECIAL CHARACTER alphabet: provides special characters and punctuation symbols. Note that two keys are not assigned any character in this alphabet.

The eight thumb positions available with the four thumb keys in FIG. 3-5 are defined in the embodiment as follows:

[0] No thumb keys pressed: Transmits the lower case characters in the letter alphabet of FIG. 3-2 in the normal left-to-right sequence of the characters in the chord being pressed with the finger keys.

[1] SPECIAL: Transmits characters in the special character alphabet in FIG. 3—3 in the normal sequence of characters in the chord currently being pressed with the finger keys.

[2] NUMBER: Transmits characters of the number alphabet in FIG. 3-4 in the normal sequence of characters in the currently pressed chord.

[3] UPPER: Transmits characters in the upper-case of the letter alphabet as shown in FIG. 3-2 in the normal sequence of characters in the currently pressed chord.

[4] SPACE CAP LOW: Transmits a single space character followed by an upper-case character in the letter alphabet of FIG. 3-2 for the leftmost finger position followed by lower-case characters in the letter alphabet of FIG. 3-2 for any other characters in the currently pressed chord in normal sequence.

[5] SPACE: Transmits a single space character followed by the lower-case letter alphabet characters of FIG. 3-2 in the currently pressed chord in normal sequence.

[6] SPACE REVERSE: Transmits a single space character followed by lower-case characters in the letter alphabet of FIG. 3-2 for the currently pressed chord, with the characters outputted in reverse sequence. This combination would, for example, permit the transmission of the characters "and" with a single chord stroke of keys D, N and A in FIG. 3-2 with three fingers.

[7] REVERSE: Transmits lower-case characters in the letter alphabet in FIG. 3-2 in reverse sequence for the currently pressed chord.

3.3 Finger Positions

Respective assignments of characters to the 27 finger positions (labeled in FIG. 3-6 in hexadecimal from [1] to [1B]) for various alphabets/cases are shown in FIGS. 3-2 through 3-4. FIG. 3-2 illustrates the assignment of upper case characters of the "letter" alphabet, but it also represents the assignment of the lower case characters in the letter alphabets to the same finger positions. FIG. 3—3 shows the finger position assignment of characters for the "special" character alphabet. FIG. 3-4 shows the finger position assignment of the characters for the "number" alphabet.

One or more finger positions may be simultaneously pressed on the keyboard to form a single chord, and an output character signal is generated for each pressed finger position in the chord. The alphabet that is used to translate the pressed finger positions into characters is controlled by which thumb position is being pressed.

The first chord begins when any one or more keys are pressed from null keyboard state, which is defined as the state existing when no finger key is pressed. The second and following chords need not be pressed from a null state; this is explained later in relation to discussions for FIG. 5.3-1, 5.3A and 5.3B. The transmitted sequence of characters for a chord can be a normal sequence or a reversed sequence. The normal sequency represents the characters in the chord from left-to-right across the finger keyboard in the thumb selected alphabet. The reverse sequences represent the characters in the chord from right-to-left across the keyboard.

A "window" concept is used for decoding the finger positions in the detailed embodiment. A window is comprised of each group of four adjacent finger keys. A window is decoded by examining the electrical signals provided from the window's four keys; a key's electric signal is 0 if the key is not pressed and is 1 if the key is pressed. FIG. 3-6 illustrates the five windows available on the ten finger keys. The decoding operation begins with the leftmost window 1, as follows:

A. First, the two signals for the leftmost upper and lower finger keys in window 1 are electronically sensed to determine if neither of these two keys are pressed. If neither is pressed (i.e. 00XX), there is no detectable finger position for this window; and the next window is accessed by going to step H below. If either or both of the leftmost keys in the window is pressed, decoding for this window continues by going to step B.

B. Next, if all four keys in the window are pressed (i.e. 1111), the decoded finger position is indicated in the common corner of the four keys e.g. finger position [5] in window 1 in FIG. 3-6. That is, it will be finger position [5], [B], [11] or [17] for the respective windows 1, 2, 3 or 4. Then, step H is entered to access the next window. But, if all four keys are not pressed, Step C is entered.

C. If the two leftmost keys in the window are both pressed, but not all four keys are pressed, the decoded finger position is indicated between the leftmost upper and lower keys in the window, e.g. [2] in window 1. That is, it will be finger position [2], [8], [E], [14] or [1A] for the respective windows 1, 2, 3, 4 or 5. Then Step H is entered. If the two leftmost keys are not both pressed, step D is entered.

D. If the upper left key is the only pressed key in the window (i.e. 1000), that key represents the decoded finger position e.g., finger position [1] in window 1. That is, it will be finger position [1], [7], [D], [13] or [19] for the respective window 1, 2, 3, 4 or 5. Then Step H is entered. If no finger position has yet been decoded for the window, step E is next entered.

E. If both upper keys in the window are pressed (i.e. 1010), the decoded finger position is indicated between the upper two keys in the window. That is, it will be finger position [4], [A], [10] or [16] for windows 1, 2, 3 or 4 respectively. Then Step H is entered. If no decoding has occured so far, step F is entered. F. If only the left lower finger key in the window is pressed, i.e. 0100, that key represents the decoded finger position. That is, the decoded finger position is [3], [9], [F], [15] or [1B] for the respective windows 1, 2, 3, 4, or 5. Then Step H is entered. If no finger position has been decoded thus far, the only remaining decodable code is 0101 which then must represent the decoded finger position, which is between the two lower keys in the window. That is, the decoded finger position is [6], [C], [12], or [18], for window 1, 2, 3 or 4, respectively. Step H is then entered to access the next window.

H. At this point, any finger position that can be identified from the information in this window has been identified. Any one bit for either or both right hand keys of the window that has been used in any detected finger position is changed to a zero. Then the four signals representing the next window are accessed, the Step A is reentered for decoding that next window, which now becomes the current window. The process continues from window 1 to window 2 to window 3 to window 4 and ends with the decoding of window 5. In window 5 in FIG. 3-6, two non-existent keys are assumed to be in its rightmost two positions, which always generate "00" for purposes of decoding, i.e. they are considered not pressed. When a finger position is decoded, the thumb position determines the character it represents by chosing one of the four alphabets/cases in which the decoded finger positions represent a character. Each time a next window is selected, the process returns to Step I above for operation on the new current window.

3.4 Special Word and Special Chord Generation

The keyboard provides the facility for storing a special word and a special chord. Whenever the stored special chord is keyed, the special word (which is a stored sequence of up to eight characters) is transmitted by the keyboard.

A special chord pushbutton and a special word switch shown in FIG. 3-1 are used to store the special chord and its corresponding special word. With there two separate switches, either the special word or special chord can be independently changed at any time, even though both the currently stored special chord and special word combine to control a single keyboard operation.

To store a special word for subsequent transmission, the special word switch in FIG. 3-1 is set to LOAD position. Sequences of characters generated by pressing the keyboard when this switch is set to LOAD position are not transmitted, but they are sent to a special word buffer which can hold up to eight characters. If more than eight characters are generated, only the last eight are retained in this buffer. Returning this switch to its USE position restores normal operation of the keyboard; so that at any subsequent time, pressing the keys that make up the special chord will cause the characters stored in the special word buffer to be transmitted as keyboard output.

To store a special chord for subsequent use, the special chord pushbutton in FIG. 3-1 is set to its LOAD position. The next chord pressed on the keyboard after this button is pushed (and released) is stored as the special chord. Subsequently, when that chord is pressed on the keyboard, it causes the special word stored in the special word buffer to be transmitted instead of the normal keyboard output for that chord.

The special chord pushbutton should not be pressed while the special word switch is set to LOAD unless the special chord is to be part of the special word.

3.5 Typing On The Chord Keyboard

A characteristic of this keyboard is that it supports a wide range of learning skills. There are several levels of learning and, when the typist advances to a new level, he will rise to a new and faster typing speed.

This keyboard, unlike prior chord keyboards, allows the novice to do "hunt and poke" typing with one finger.

The typist who is willing to learn touch-typing can take advantage of additional resources of the keyboard in order to type faster.

A second level of learning is to learn by touch the positions of single characters in the letter alphabet on the keyboard and the position of the upper-case thumb key.

The third level of learning is to learn to enter several letters with one chord keystroke plus the use of all thumb positions. Initially, the typist would learn small chord patterns for specific commonly used character sequences.

The final learning level would begin when the typist started to generate chords for multiple character sequences which had not previously been specifically learned. The skilled typist would copy text at close to the maximum number of available keyboard characters per chord stroke.

4.0 Mechanical Design

The principal features of the mechanical design of the keyboard are shown in FIGS. 4-1 and 4-2. FIG. 4-1 shows a top view of the keyboard mechanism, and FIG. 4-2 is a side view showing the finger keys and their associated components. The said view also shows the height relation between top surfaces of the thumb keys and the finger keys.

In FIG. 4-2, the mechanical assembly is constructed on a base 1. Each key 8 or 9 is fastened securely to its key arm 3. When the key is pressed down, the key arm 3 rotates about its axis 4 pressing against a switch 5 creating a short circuit between its terminals, 6a and 6b. Terminal 6a is connected to +5 volts (i.e., a logical 1) whereas terminal 6b is connected through a resistor to 0 volts (a logical 0). Therefore, when any key is not depressed, a logical 0 is provided on terminal 6b, but when the key is depressed, the signal on terminal 6b becomes a logical 1. Terminal 6b and its counterparts for the 13 other keys are wired to the keyboard word generator (see FIG. 5.1-1). The switch must finish bouncing within 5 milliseconds after key actuation so as not to make errors, but this requirement is easily met by good commercially available switches.

In FIG. 4-1 it can be seen that all of the finger keys rotate about one axis, 4, while all of the thumb keys rotate about another axis, 10. The key arms of the front row of finger keys are shaped so as not to conflict with the arms of keys of the back row.

There is a spring, such as 11 shown in FIG. 4-2, for each key that is compressed when that key is depressed. This contributes to providing the proper mechanical resistance when the key is pressed to provide the proper force to react against the user's finger. There are restraints, 12 and 13, that limit the motion of the keys to their required upper positions.

In FIG. 4-1, the group of thumb keys is arranged at an angle 14 with respect to the finger keys. In FIG. 4-2, it is shown that the upper limit of the thumb keys is below the upper limit of the finger keys by a distance 15. These two values, 14 and 15, are selected properly to accommodate the fact that the thumb is attached to the hand in a different position and at a different angle from the fingers. This arrangement makes it comfortable to form chords with the fingers and the thumb.

Each thumb key structure has a sideview (not shown) which may be similar to the sideview of finger key 7 shown in FIG. 4-2, except that key surface 9 is supported at a lower position. In FIG. 4-2, the upper surfaces of the thumb keys are made lower than the upper surfaces of the finger keys by distances 15, e.g. one-half inch.

At various places beneath the keyboard, such as at 16 and 17 in FIG. 4-2, the base has holes molded into it to accept circuit boards, such as 18 and 19, which hold sockets like 20 and 21, which hold integrated circuit packages like 22 and 23. In FIG. 4-1 the space 24 between the finger key assembly and the thumb key assembly contains the power supply.

An outer container protects the internal working parts so that the assembled keyboard looks like FIG. 3—1.

5.0 Keyboard Electronics

5.1 Overview

The control circuits take the signals produced by pressing the keyboard keys and produce as output a series of serially encoded pulses representing a string of characters that is the output from the manual keyboard actuations. FIG. 5.1-1 is a block diagram relating the keyboard and its control circuits.

Pressing the keyboard keys closes sets of contacts that provide key signals on 14 wires 102 through 115 which are either 5 volts (logical level 1) or 0 volts (logical level 0). The signals from the keys are fed in parallel to the Keyboard Work Generator which generates a 16 bit word.

Timing Signal generator 5.2 is described in detail in section 5.2. This circuit provides the clock and other timing pulses required by the rest of the keyboard electronics.

Keyboard Word Generator 5.3 is described in detail in section 5.3. This circuit takes the parallel input from the keyboard keys and generates every 5ms a serial output comprising a 16 bit keyboard word which represents all characters in a chord. This word is sent to a Regular Chord Decoder 5.6 and to Special Chord Circuits 5.4. The Keyboard Word Generation 5.3 will generate a sequence of many keyboard words for each chord pressed on the keyboard, since it generates a word every 5ms. However, only one keyboard word is decoded per pressed chord. To accomplish this, the Keyboard Word Generator generates a Chord Present signal when any key is released which indicates the last word is valid and is to be decoded.

The Special Chord Circuits 5.4 detect when a predetermined chord combination is pressed or not. If the predetermined chord (i.e. special chord) is pressed, a Special Word of up to 8 characters is outputted by the Special Word Generator 5.5. If no Special Word is detected, circuits 5.4 signal the Regular Chord Decoder 5.6 to decode that keyboard word. The Special Chord is loaded by pressing a Special Chord Pushbutton and then pressing the described special chord on the Keyboard. The Special Word is loaded by pressing the Special Word Switch while inputting the characters comprising the special word (up to 8).

The Output Control 5.7 determines if the keyboard output characters are to be the decoded characters from the Regular Chord Decoder or the special word characters from the Special Word Generator; and then it transmits these characters as the output of the keyboard.

5.1.1 Symbols In The Drawings

Standard drawing symbols are used for OR circuits, AND gates, inverters, etc. Commercially-available pluggable circuit modules are represented by boxes containing a number, such as 74123 in parenthesis in FIG. 5.2-1, which identifies a commercially available integrated circuit module that is available from Texas Instruments, Inc. as TTL module part number SN74123, or from the Signetics Company as part number N74123, and other companies. The standard circuits are described in prior commercial publications, such as "The TTL Data Book For Design Engineers" published by Texas Instruments Inc, in 1973, or "Designing with TTL Integrated Circuits" published by McGraw-Hill Book Company in 1971.

Thus, logic modules used in the detailed embodiment are commercially available off the shelf items.

5.2 Timing Signal Generator

The Timing Signal Generator produces the basic timing signals required by the keyboard system. A reset pulse is generated every 5ms to control the period for sampling the key settings. This frequency is chosen because the human finger reaction on the chords cannot press or release the chords more than once in a 5ms period. During each 5ms period, a higher frequency of 0.625 megahertz generates the pulse sequence which operates the system between 5ms reset pulses. These 0.625 megahertz signals consist of 4 continuously running pulses of 0.4 microsecond duration, called PCOUNT, RPULSE, COMPARE, and NCOUNT. These pulses are shown in FIG. 5.2-2. The inverse of the RESET pulse (NRESET) is also generated.

FIG. 5.2-1 is a logic diagram of the circuit for generation of the timing signals. This circuit operates as follows.

A Clock multivibrator generates the continuous squarewave output signal OSC (see FIG. 5.2-2). The Clock multivibrator consists of two monostable multivibrators wired back to back so that they free run at a frequency determined by the connected resistor and capacitors shown in FIG. 5.2-1. The resistor is adjusted to give an oscillator output frequency of 1.25 megahertz.

The signal OSC is connected to the CK input of a clock counter, which divides the oscillator frequency by two to provide an output OSCHALF (see FIG. 5.2-2) with a frequency of 0.625 megahertz.

Pulse gates receive the Q and $\overline{Q}$ outputs of the clock counter and combine them with the OSC and $\overline{OSC}$ signals from the Clock multivibrator to produce the PCOUNT, RPULSE, COMPARE and NCOUNT output signals. The RESET pulses are controlled by a sample interval timer in FIG. 5.2-1 which produces a square-wave output with a frequency of approximately 200 cycles per second. This module is connected with appropriate external resistor and capacitors (not shown) to produce the 0.2 kilohertz square wave. A negative-going signal (TPULSE) appears at the output of the Sample Interval Timer once every 5 milliseconds (5ms). First and Second Synch flip flops are used to produce a RESET pulse coincident with the first RPULSE that starts after the occurrence of the negative-going TPULSE signal. The negative-going TPULSE signal sets the First Synch flip flop bringing its Q output to 1 (signal A on FIG. 5.2-2). With the J input of the second synch flip flop now at 1, the leading (negative-going) edge of the next RPULSE will set the Second Synch flip flop and take its not Q output to 0 (Signal B on FIG. 5.2-2). The RESET pulse is generated by gating the not Q output of this flip flop with RPULSE in a NOR gate. The inverted RESET pulse (NRESET) is used to reset the First Synch flip flop. The Second Synch flip flop is reset by ORing the Q output of the Second Synch flip flop with the COMPARE signal in a NOR gate (signal C in FIG. 5.2-2). The Second Synch flip flop is thus reset immediately following the generation of the RESET pulse.

5.3 Keyboard Word Generator

The Keyboard Word Generator generates a 16 bit word once every 5ms (after each reset pulse) from the keyboard cable output signals. But these keyboard words are not decoded until a signal occurs (called CHORD PRESENT) which is provided when a chord is completely formed on the keyboard. The CHORD PRESENT signal distinquishes each valid word from all the generated invalid words. Each valid word is to be decoded by the special chord circuits in FIG. 5.4-1 and the Regular Chord Decoder in FIGS. 5.6-1A, 1B and 1C.

5.3.1 Alternate Finger Techniques

The Keyboard electronics controls how the machine will accept chords formed by the user on the keyboard. Three different chord completion techniques are used by three alternative embodiments of the Keyboard Word Generator shown respectively in FIGS. 5.3-1, 5.3A and 5.3B,

5.3.1.1 "One-Released" Finger Technique

The first and preferred technique is for the machine to recognize completion of a chord by using the one-released finger technique. This technique recognizes completion of a chord (generating the CHORD PRESENT signal) whenever a user releases one keyboard key after having pressed one or more keyboard keys. The operation of this technique is illustrated in the diagram below which shows different events and states on a time scale from left to right.

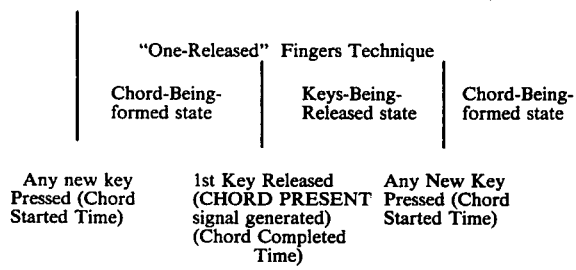

Pressing any key places the keyboard word generator in the Chord-Being-Formed state. During that state, any number of keys may be pressed. The first key released generates the CHORD PRESENT signal, the detected chord being made up of those keys pressed just prior to the release of that key. The keyboard word generator is then placed in the Keys-Being-Released state. Pressing any new key puts the keyboard word generator back in the Chord-Being-Formed state.

For example, a chord may be formed by pressing a number of keys and releasing all keys pressed. Another way in which a chord may be formed is by holding down a number of keys and pressing and releasing additional keys, with a chord formed each time a key is released after one or more keys have been pressed.

Thus, this technique allows the user to leave his fingers pressing keys which are to be part of the next chord, and thereby minimizes the amount of total finger movement required to operate the keyboard.

5.3.1.2 "All-Released" Finger Technique

The second technique used is the All-Released Finger Technique. With this technique, a chord is detected at the point where all pressed keys are released. The operation of this technique is illustrated in the diagram given below.

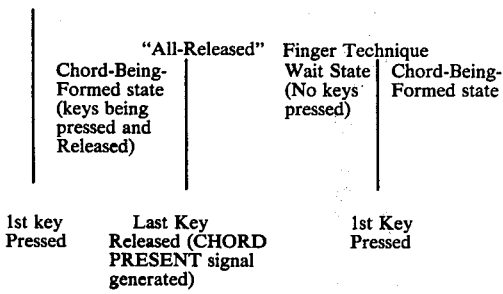

The first key pressed places the keyboard word generator in the Chord-Being-Formed state. While in that state the fact that any key has been pressed is stored by the keyboard word generator. When all keys are released, a chord is detected and the CHORD PRESENT signal is produced. The chord produced is made up of all keys pressed from the time the first key is pressed until all keys are released. (It is noted that the conventional two-handed stenograph machine recognizes chord formation when all keys are restored after pressing a chord with both hands and it may be said to use a form of the All-Released technique).

5.3.1.3 "One-Released, All-Released" Finger Technique

The third technique is the One-Released, All-Released finger technique. With this technique, a chord is detected at the point when one key is released after one or more keys have been pressed. However, the formation of a new chord does not begin until all keys have been released. The diagram given below illustrates the operation of this technique.

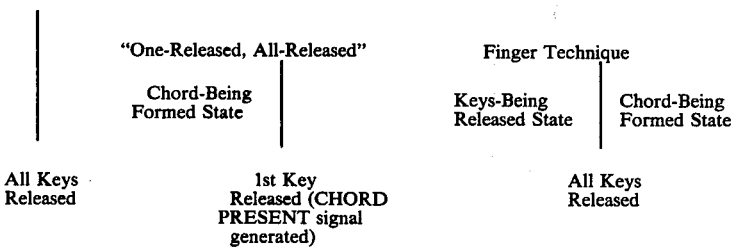

With no keys pressed, the keyboard word generator is in the Chord-Being-Formed state. During that state, any number of keys may be pressed. The first key released generates the CHORD PRESENT signal and places the Keyboard word generator in the Keys-Being-Released state. The detected chord is made up of those keys pressed just prior to the release of that key. Once all keys have been released the keyboard word generator is placed back in the Chord Being Formed state.

This third technique combines the first two techniques by using the One-Released technique to recognize chord completion and using the All-Released technique before permitting the next chord to be started. That is, it inhibits formation of the next chord until after all keys are released. Note that no key is pressed after one finger is lifted but before all fingers are lifted can be included in any chord.

5.3.1.4 Comparison of Finger Techniques

The third technique provides faster electronic operation than the second technique by permitting earlier decoding of a chord than the second technique. However, the first technique permits the fastest operation but may result in a higher error frequency than the second or third technique.

Only one chord formation technique should be used in construction of a keyboard, because a user trained in one technique will have difficulty in switching to another.

In general, and depending to some extent on his finger pressing habits, a user who has formed the habits required to use the All-Released fingers chord formation technique may get the same keyboard output results when using a keyboard incorporating the One-Released technique because lifing one finger is included in the operation of lifting all fingers. However, the converse is not true. That is, a user who has formed the habits of the One-Released finger technique or the One-Released, All-Released finger technique may not always get the same keyboard output results when using a keyboard incorporating the All-Released chord formation technique.

5.3.2 Overview of One-Released Keyboard Word Generator

FIG. 5.3.2 is a diagram of the One-Released keyboard word generator. The keyboard cables shown in FIG. 5.3.1 connect to the key switches shown in FIG. 4-1.

The output of each key switch (as described in Section 4.0) is either 0 volts (key is raised) or 5 volts (key pressed). These voltages correspond to logic levels 0 (e.g. 0 volts) and 1 (e.g. 5 volts) used by the logic circuits in the keyboard electronics.

There are 14 keys on the keyboard shown in FIG. 3-1. The key switch associated with each of these keys is connected through a keyboard cable to the keyboard multiplexer shown in FIG. 5.3.1. Each key switch determines the state of a respective one of bit positions 2 through 15 in a 16-bit word referred to as the new keyboard word. Bit positions 0 and 1 of the new keyboard word are always at 0 state. Thus, if a key is pressed, the corresponding bit is in the 1 state in the new keyboard word; and if a key is not pressed or is released, the corresponding bit position is in 0 state. Section 5.6.1 describes in more detail the correspondence between the bit position numbers and the keyboard key positions.

Once every 5ms, one new keyboard word is generated and compared bit-by-bit with the keyboard word generated 5ms before (the last keyboard word). This sampling interval was selected to be sufficiently short, relative to human finger movement, so that finger movement could not change the key state more than once (from 0 to 1, or 1 to 0) during any 5ms sampling period. (It may be possible to operate a keyboard without loss of data at a longer sampling interval than 5ms, because maximum human finger reaction is of the order of 50ms.) The circuit as designed is capable of operating with a much shorter or longer sampling interval than 5ms. It is all right if the keys comprising a chord are not all pressed in the same 5ms interval, since resulting keyboard words for incomplete chords are ignored by the electronic system.

The bit-by-bit comparison of the new and last keyboard words is done by comparison gates 27 and 28 in FIG. 5.3-1 to determine which keyboard word represents the completed chord and should be decoded. Whether a chord has completed or a chord has started, is determined by comparison gates 27 and 28 which control a State flip flop to indicate the respective one of these two keyboard states. A chord completed signal from gate 27 sets a CHORD PRESENT flip flop, which conditions a CHORD PRESENT gate 29 upon completion of the new keyboard word, indicated by setting of the COUNT CUTOFF flip flop. Gate 29 then transmits a CHORD PRESENT signal to indicate the last chord is the valid chord which should be decoded by the Regular Chord Decoder and the Special Chord Circuits after the final bit of the last keyboard word has been transmitted to those circuits by the Keyboard Word Shift Register. Thus, the CHORD PRESENT signal indicates that the keyboard word just transmitted is a valid chord which needs to be decoded.

The CHORD PRESENT signal remains active throughout the current 5ms sampling interval during which the decoding and resulting character outputting takes place.

The comparison and shifting of the keyboard words takes a small fraction of the 5ms sampling interval. The circuits have been designed to shift one bit every 1.6 microsecond, thus completing the comparison and shift operation in approximately 26 microseconds; hence the remainder of the 5ms interval is available for decoding the keyboard word. However, the design of the disclosed circuit could permit considerably faster shifting and comparison than 26 microseconds, if necessary.

5.3.3 Modules Used in The One-Released Keyboard Word Generator

FIG. 5.3.1 is a logic diagram of the Keyboard Word Generator. The significant modules shown in FIG. 5.3-1 are as follows. They are listed roughly left to right and top to bottom on FIG. 5.3-1.

1. The input gate 21 controls PCOUNT pulses to the Bit Counter.

2. The Bit Counter is used to generate the count input to the Keyboard Multiplexer for it to sample successively the signal levels on each of the fourteen keyboard cables E2 through E15 from the key switches.

3. The Count Gate 22 determines when a count of hexadecimal F (all 1's) has been reached on the Bit Counter to terminate a sequence of 15 PCOUNT pulses.

4. The Keyboard Multiplexer has 16 parallel inputs and an output W that converts the 16 input levels representing the positions of the 14 keys on the keyboard) to a serial output.

5. The COUNT CUTOFF flip flop is a J-K flip flop with outputs used to control the three gates 24, 26, 29 that control the shifting and comparison of data.

6. The Shift Gate 24 controls the PCOUNT pulses used to shift the Keyboard Word shift register.

7. The Keyboard Word shift register is a 16-bit shift register used to hold the last keyboard word for the purposes of comparison with the new keyboard word. The keyboard word stored in this register is passed to the regular chord decoder and the special chord circuits as the KEYBOARD BITS signal.

8. The CHORD PRESENT flip flop is a J-K flip flop that is used to indicate when a completed chord has been detected.

9. The Chord gate 26 controls the times as which comparisons are made between corresponding bits in the new and last keyboard words.

10. The Comparison gates 27 and 28 are used to determine the Chord-Completed and Chord-Started times.

11. The State flip flop is a J-K flip flop that is used to indicate whether the Chord-Being-Formed State or the Keys-Being-Released state is the current keyboard state.

12. The CHORD PRESENT gate 29 produces a signal that is sent to the regular chord detector and special chord circuits to indicate that the keyboard word last transmitted to those circuits represents a completed chord, and that its contained characters should be detected and outputted.

5.3.4 Detailed Operation of Keyboard Word Generator

FIG. 5.3-2 illustrates the timing of significant Keyboard Word Generator signals. Three clocking pulses for driving the system are derived from FIG. 5.2-1 as the COMPARE, PCOUNT, and RESET pulses. NRESET pulses are RESET pulses inverted. The COMPARE and PCOUNT pulses are continuous pulses which are offset in time by an interval 2t, as shown in FIG. 5.3-2. The interval t may be assumed to be 0.4 microseconds for this discussion although the circuit will operate with a t considerably longer or shorter than this period. The RESET pulse has a width of t and occurs once each timing interval where the timing interval is as discussed previously. The RESET pulse is synchronized to occur between a PCOUNT and a COMPARE pulse, as shown in FIG. 5.3-2. The generation of these pulses is discussed in the section Timing Signal Generator.

In the following discussion, the various waveforms identified by the circled letters A through L on FIG. 5.3-2, are found on lines referenced with circled letters on FIG. 5.3.1.

The RESET pulse resets the Bit Counter so that its outputs QA, QB, QD are all 0. The COUNT CUTOFF flip flop and the CHORD PRESENT flip flop are also reset at the same time by an NRESET pulse. With the output lines of the Bit Counter all at zero, the output of the count gate 22 (waveform B) is also zero, so that a one output from inverter 23 enables the input gate 21 to pass PCOUNT pulses to the input of the Bit Counter (waveform A). As a result, the Bit Counter steps through 15 counts, one count each time that the trailing edge of a PCOUNT pulse occurs, until gate 21 is blocked by count 15 (all ones) enabling gate 22 and dropping the output of inverter 23 to thereby block any further PCOUNT pulses through gate 21.

During the 15 counts of the keyboard word, the $\overline{Q}$ output of the COUNT CUTOFF flip flop (waveform G) is one, enabling the shift gate 24 and the chord gate 26. This $\overline{Q}$ signal is also sent to the Regular Chord Decoder as the COMPARE ENABLE signal. With shift gate 24 enabled, PCOUNT pulses are transmitted to the shift clock input CP of the Keyboard Word shift register (waveform K); it is then shifted one bit on the leading edge of each PCOUNT pulse. With chord gate 26 enabled, COMPARE pulses are transmitted to the clock input of the State flip flop (waveform L) causing the flip flop to sample the Comparison gates each time that a COMPARE pulse occurs.

In more detail, the comparison of the first bit positions in the new and last keyboard words occurs at the COMPARE pulse that follows the RESET pulse. At that time, the four outputs from the Bit Counter are all set to zeroes due to the RESET pulse, and thus inputs A, B, C and D of the Keyboard Multiplex are set to zero. During the first count, the Keyboard Multiplexer connects its E0 input to its W output line (waveform C). The E2 through E15 input lines of the Keyboard Multiplexer are connected to Keyboard cables 2 through 15, respectively, as shown in FIG. 5.3-1. Inputs E0 and E1 are not used, and are only padded zero bits in each keyboard word.

The 16-bit Keyboard Word shift register at this point contains bit positions 15 through 0 of the last keyboard word. Bit position 0 is in the rightmost bit position of the register, as shown in FIG. 5.3-1; and, thus, the Q output of that shift register indicates the state of that bit position. The COMPARE pulse is used to compare bit N of the last keyboard word with bit N of the new keyboard word, where N is the number of the keyboard word bit position currently in the rightmost bit position of the input shift register. Two types of comparisons are of interest. The Chord-Started condition is indicated when the State flip flop is in the Key-Being-Released state and any bit N of the new keyboard word is a 1 and the corresponding bit N in the last keyboard word is a 0. This comparison is achieved through Comparison gate 28, which is an AND gate receiving the inverted output of the shift register, the output of the multiplexer, and the Keys-Being-Released output of the State flip flop. If all of these inputs are 1, the output of AND gate 28 will trigger the J input of the State flip flop at the trailing edge of the COMPARE pulse and the State flip flop will be RESET to the Chord-Being-Formed state.

The system is put in the Keys-Being-Released state when the State flip flop is in the Chord-Being-Formed state and any bit N in the new keyboard word is a 0 and the corresponding bit N in the last keyboard word is a 1. Comparison gate 27 detects this situation. The inverted output of the keyboard multiplexer (representing a bit in the new keyboard word) is compared with the output of the N bit of the shift register (representing the corresponding bit in the last keyboard word). When the output of the inverted multiplexer is 1 (representing a 0 bit), the output of the rightmost bit of the shift register is 1, and the State flip flop output is 1 representing the Chord-Being-Formed signal, the output of comparison gate 27 will go to 1 and the State flip flop will be switched to the Keys-Being-Released state on the trailing edge of the COMPARE pulse. In addition, a 1 output from Chord Comparison gate 27 sets the CHORD PRESENT flip flop on the trailing edge of the COMPARE pulse.

In more detail, the comparison for all of the bits in the new and last keyboard words operates in the following manner. The leading edge of the PCOUNT pulse shifts the Keyboard Word shift register 1 bit to the right. The output of the shift register is passed to the Regular Chord Decoder and the Special Chord circuits as the KEYBOARD BITS signal. The trailing edge of each passed PCOUNT pulse (waveform A) increments the Bit Counter by 1. As the outputs of the Bit Counter are provided to the inputs of the Keyboard Multiplexer, the next sequential bit of the new keyboard word (on the 16-input lines to the Multiplexer) is selected for output. At this point, the output of the Multiplexer represents bit N of the new keyboard word, and the output of the Keyboard Word shift register represents bit N of the last keyboard word. The COMPARE pulse which occurs following the PCOUNT pulse changes the state of the State flip flop if either comparison gate 27 or 28 has a 1 output for that bit comparison as previously described. Thus, if the State flip flop is in the Chord-Being-Formed state, if any bit in the new keyboard word is 0 where the corresponding bit in the last keyboard word is 1, a chord completed signal will be generated by gate 28. Similarly, any bit going from 0 to 1 during the Keys-Being-Released state will cause the State flip flop to be set to the Chord-Being-Formed state.

The waveforms in FIG. 5.3-2 illustrate a case where prior to the RESET pulse the State flip flop is in the Chord-Being-Formed state (waveform J). The bit pattern in bit positions 0, 1 and 2 of the last keyboard word is 001. The bit pattern in bit positions 0, 1, and 2 of new keyboard word is 000. Thus, a Chord Completed signal is generated when bit positions 2 of the two words are compared. Waveforms C and D on FIG. 5.3-2 represent the two signals compared. Note that the output of comparison gate 27 (waveform E) goes to 1 at bit 2 time and that the trailing edge of the COMPARE waveform resets the State flip flop (waveform J) and sets the CHORD PRESENT flip flop (waveform H).

The comparison cycle continues until the Bit Counter reaches a count of 15 (all output bits are set to 1). At that time, the output of Count gate 22 (waveform B) goes to 1, and the output of gate 21 goes to 0, preventing any further PCOUNT pulses from being transmitted to the Bit Counter. The output from count gate 22 also goes to the J input of the COUNT CUTOFF flip flop.

The comparison pulse now makes a comparison of bit position 15 of the new keyboard word with bit position 15 of the last keyboard word. The leading edge of the next PCOUNT pulse shifts the last bit out of the Keyboard Word shift register. The shift register now contains the bits from the new keyboard word (which thereafter becomes the last keyboard word for the next cycle). As the J input to the COUNT CUTOFF flip flop is now one, the trailing edge of the PCOUNT pulse sets the COUNT CUTOFF flip flop. With the COUNT CUTOFF flip flop set, its $\overline{Q}$ input to shift gate 24 and chord gate 26 is brought to 0 (waveform G). This condition prevents further PCOUNT pulses from reaching the shift register and further COMPARE pulses from reaching the State flip flop or the CHORD PRESENT flip flop. The Q output of the COUNT CUTOFF flip flop goes to the CHORD PRESENT gate. If the CHORD PRESENT flip flop has been set, an output signal is produced at the output of gate 29 generating a CHORD PRESENT signal that indicates that a completed chord is represented by the last keyboard word sent to the Regular Chord Decoder and the Special Chord Circuits (waveform I). Note that this signal is not produced until the last bit has been shifted out of the shift register to the Special Chord register in FIG. 5.4-1 and the Finger Bit Register in FIG. 5.6-1.

No further action takes place in the Chord Detector in FIG. 5.3-1 until the next RESET pulse occurs. It resets the Bit Counter, the COUNT CUTOFF flip flop, and the CHORD PRESENT flip flop; and then the above described operation repeats.

5.3.5 All-Released Keyboard Word Generator

The circuit logic in FIG. 5.3A uses the All-Released fingers technique, which requires all keys on the keyboard to be returned to their zero position (not pressed) for a CHORD PRESENT signal to be generated. See Section 5.3.1.2 for a more detailed external description of this technique.

Chord Completion detection in FIG. 5.3A is as follows: When any key on the keyboard is pressed, it is stored as a one state in its assigned bit position in the Keyboard Word Shift Register, and it remains stored there until all keys are returned to the zero state which is when the chord is detected. The chord detected is made up of all keys pressed between the time the first key is pressed and the time all keys are returned to the zero state. The following components in the alternative Keyboard Word Generator in FIG. 5.3A operate in the same way as described for FIG. 5.3-1: Input gate 21, the Bit Counter, Count gate 22, the Keyboard Multiplexer, the COUNT CUTOFF flip flop, and Shift gate 24.

After each NRESET pulse (every 5ms), which begins a Multiplexer cycle, the 16 bit position content of the Keyboard Word shift register is both outputted and recirculated to its input through a Bit Accummulation OR gate 31. This gate merges the 1 bit for each newly pressed key with the same bit in the stored word. That is, this OR circuit provides a 1 bit to the intput of the shift register if either an output bit from the Keyboard Multiplexer is 1 or the same bit position in the recirculated word is a 1. This accumulation of bits in the shift register takes place from the time the first key of a chord is pressed on the keyboard until all keys on the keyboard are returned to 0 state before a CHORD PRESENT signal is provided to signal that the chord is completed.

As with the embodiments in FIG. 5.3-1 and 5.3B, it will take as many 5ms periods to form the chord in the shift register as it takes the user to press the keys at any user speed and in any key pressing order.

A Zero Detection flip flop senses when all keys are returned to the zero state.

At the beginning of each Multiplexer cycle, the Zero Detection flip flop and the Chord Present flip flop are cleared with an NRESET pulse so that each has its Q output set to 0 and its $\overline{Q}$ output set to 1. Hence, the CHORD PRESENT signal is then 0.

If thereafter any output bit position of the Keyboard Multiplexer becomes 1 (representing a pressed key in a chord), the Zero Detection flip flop will be set and its $\overline{Q}$ output becomes 0. The signal from Shift gate 24 clocks both the Zero Detection flip flop and the Keyboard Word Shifter register for a single recirculation cycle of the shift register after each NRESET pulse (every 5ms).

The first pressed key in a chord also causes the Recirculate Enable flip-flop to be preset by enablement of gate 34 (at the time that a 1 bit is inputted into the shift register). This preset brings up the Q output of the Recirculate Enable flip flop to enable the Recirculate Enable gate 32, but the Q output does not affect the Chord Present flip flop at this time because the Clock input is only actuated by a negative-going signal, which is provided later when the Recirculate Enable flip flop is later cleared by gate 33. With gate 32 enabled, all pulses shifted out of the Keyboard Word shift register are recirculated back to its input through the Bit Accummulation OR circuit 31.

When all keys on the keyboard are returned to a released state, all zeros are provided in the output of the Keyboard Multiplexer. Then the Zero Detection flip flop will not be set due to lack of any 1 bit from the output of the Keyboard Multiplexer during a Multiplexer cycle. Hence, its $\overline{Q}$ output will remain at its 1 state after the Multiplexer cycle completes. Thus, when the Q output of the COUNT CUTOFF Flip flop goes to 1, the output of gate 33 produces a negative-going zero signal to the clear input of the Recirculate Enable flip flop. This signal causes its Q output to switch to zero, producing a negative-going transition at the clock input of the CHORD PRESENT flip flop. This signal sets its Q output to 1, producing a CHORD PRESENT signal that indicates the last outputted word from the Keyboard Word shift register represents a valid chord which should be decoded.

With the Q output of the Recirculate Enable flip flop set at 0, the Recirculate Enable gate 32 is disabled. Therefore, after the next NRESET pulse, the bits in the Keyboard Word shift register are not recirculated. The output bits of the Keyboard Multiplexer are all 0 at this time so that all input bits to the Keyboard Word shift register are zeros. The shift register content is thereby reset to all zeros until the next chord is started by pressing at least one key on the keyboard.

After being set, the CHORD PRESENT flip flop will remain set only until the next NRESET pulse. It will not be set again until the next chord is formed since the Recirculate Enable flip flop can not again be preset until the next time a key on the keyboard is pressed, which enables gate 34.

5.3.6 One-Released, All-Released Keyboard Word Generator

The implementation of the One-Released, All-Released finger technique keyboard word generator is shown in FIG. 5.3B. It generates a CHORD PRESENT signal indicating completion of the chord stored in the last outputted keyboard word when the first finger is released in the chord, but the next chord cannot be started on the keyboard until after all keys have been released. See Section 5.3.1.3 for a more complete discussion of this technique.

In FIG. 5.3B, the following components operate in the same way as explained for FIG. 5.3-1: Input gate 21, Count gate 22, the Bit Counter, the Keyboard Multiplexer, the COUNT CUTOFF Flip Flop, Shift Gate 24, Keyboard Word shift register, Chord gate 26, Comparison gate 27, the CHORD PRESENT flip flop, and CHORD PRESENT gate 29.

Thus, the Comparison gate 27 senses the first key to be released and generates a Chord Completed signal which sets the CHORD PRESENT flip flop in the manner previously described for FIG. 5.3-1. The Chord Completed signal also sets the State flip flop to the Keys-Being-Released state.

The major difference in the operation of the circuit in FIG. 5.3B over the circuit in 5.3-1 occurs in the way the State flip flop is cleared (reset) which controls when the next chord can be electronically recognized. That is, gate 27 is blocked by the lack of a Chord-Being-Formed output (i.e. $\overline{Q}$ being zero) which inhibits the enablement of gate 27 until after gate 41 signals that all keys have been released. A negative-going signal level from NAND gate 41 is required to the Clear input of the State flip flop before it can be reset.

The clearing of the State flip flop operates as follows: After each NRESET pulse, the All Zero flip flop is cleared, which activates its $\overline{Q}$ output to an input of NAND gate 41. However, NAND gate 41 does not then provide any output signal because its input from the Count Cutoff flip flop is deactivated while the Keyboard Multiplexer is outputting its 16 bit position word. If any bit position in the Multiplexer output word is a 1 bit (indicating a key is pressed) the J input of the All Zeros flip flop is activated. The trailing edge of the output from the Chord gate 26 then sets the flip flop swinging down its $\overline{Q}$ output and inhibiting gate 41 and preventing any output from clearing the State flip flop as long as any key is being pressed. When all keys are released, the All Zero flip flop will be set due to the lack of 1's from the Multiplexer word, and its $\overline{Q}$ output will remain up after the Multiplexer word ends. When the COUNT CUTOFF flip flop output Q is activated following the completion of the multiplexer cycle, the Keys-Released signal from gate 41 is produced to clear the State flip flop and place it in the Chord-Being-Formed state. Gate 27 is now conditioned so that it can generate the next chord Completed signal when the first key of the next chord is released. Accordingly, in FIG. 5.3B, the electronic recognition of any pressed chord (which is recognized by generating a CHORD PRESENT SIGNAL) cannot be provided until all fingers are released from the last chord prior to the pressing of the next chord.

5.4 Special Chord Circuits

The Special Chord Circuits are shown in FIG. 5.4.1. They receive each keyboard word from the Chord Detector in FIG. 5.3-1 and determine whether the currently pressed chord is a regular chord or a special chord. If the current chord is a regular chord, the Regular Chord Detector is notified by a REGCHORD signal, that it should do the decoding. If it is determined to be a special chord, it causes the special word (up to 8 characters stored in the Special Word Generator in FIG. 5.4-1) to be outputted as the keyboard characters.

In the Special Chord Circuits, this determination is indicated by one of the two output signals, REGCHORD (i.e. regular chord) or SPECHORD (i.e. special chord); these signals are gated only for keyboard words indicated as valid by the CHORD PRESENT signal. The keyboard bits are compared to the special chord bits stored in the Special Chord Register to determine if they represent the special chord. If so, the keyboard is caused to output the special word stored in the Special Word Register in FIG. 5.5-1. But, if the keyboard bits are determined not to be the special chord, it is thereby determined to be a regular chord, which is to be decoded by the Regular Chord Decoder in FIG. 5.6-1.

The Special Chord Circuits in FIG. 5.4-1 are able to accept and store a new special chord at any time. The special chord is stored in a 16-bit shift register, called the Special Chord Register. A Use/Load flip flop controls whether the keyboard bits are being compared to a previously stored special chord, or are being inputted as a new special chord. To do this, the flip-flop opposite outputs Q and $\overline{Q}$ control gates 201 and 202. Gate 201 recirculates the bits previously stored in the Special Chord Register, while they are being compared to the keyboard word by Exclusive-OR circuit 203. Gate 202 loads the keyboard bits into the special chord register where they become the new special chord. The Use/-

Load flip flop is set to Load state by momentarily pushing down the Special Chord pushbutton. While the push button is pressed down, each successive group of KEYBOARD BITS is stored into the special chord register. After the push button is released, the Chord Detector detects the next chord and provides a Chord Present signal, which resets the flip-flop to enable gate 201 and disable gate 202. Thereafter the stored chord is used as the special chord until the Special Chord pushbutton is pushed again. If the push button is pressed without pressing any chord, all zeros are loaded, resulting in there not being any special chord available for use.

After a special chord has been loaded and the USE/LOAD flip flop has returned to the USE state, Exclusive-OR circuit 203 compares all KEYBOARD BITS to the bits in the Special Chord register. If any bit is different, the keyboard word does not represent the special chord, and are thereby presumed to represent a regular chord, which produces a signal and the output of Exclusive-OR circuit 203 that sets the Regular Chord flip flop. After the SHIFT pulses for each set of keyboard bits are completed, a CHORD PRESENT signal appears which enables the REGCHORD signal to pass the Q output, or enables the SPECHORD signal to pass the $\bar{Q}$ output of the Regular Chord flip flop.

The Regular Chord flip flop s preset by the next RESET pulse.

5.5 Special Word Generator

The Special Word Generator is shown in FIG. 5.5-1. The Special Word switch shown in FIG. 3-1 determines whether a special word is being LOADED, or whether a previously loaded special word is being USED.

When the Special Word switch is set to USE and the Special Chord circuits povide a SPECHORD signal, an eight byte special word currently stored in a Special Word register is outputted by the keyboard.

When the Special Word switch is set to LOAD, the Special Word register is reset; and as long as the switch is in LOAD position, the Decoded Characters output from the Regular Chord decoder in FIG. 5.6-1 is inputted into the Special Word register, thus reloading it. When the switch is moved back to USE position, the last eight characters from the Regular Chord Decoder inputted to the Special Word register remain stored in their inputted sequence as the new special word, which may now be used.

5.5.1 Special Word Load Control

The action of the Special Word Generator is controlled by a Preload flip flop and a Load flip flop, which are controlled by the Special Word switch and the RESET pulse provided from FIG. 5.2-1. When the switch is in the USE position, the Preload flip flop and the Load flip flop are both maintained in reset state. When the switch is positioned to LOAD, the next RESET pulse turns on the Preload flip flop to enable gate 301. The following received RESET pulses pass through gate 301 to become LOAD RESET pulses, which continue until the switch is changed back to USE position. The next RESET pulse after the switch is changed back to USE position turns off the Preload flip flop which terminates the LOAD RESET pulses.

The J-K inputs of the Load flip flop are connected to the J-K inputs of the Preload flip flop, and hence they are controlled together. Thus, when the switch is set to LOAD, the first LOAD RESET pulse in a group passes through gate 301 and turns on the Load flip flop. The Load flip flop then provides the LOAD signal from output Q to enable gate 303 when it is on and provides the USE signal from its output $\bar{Q}$ to disable gates 302 and 304. The Load flip flop is turned off by the first LOAD RESET pulse after the switch is changed to USE position to then enable gates 302 and 304.

When gate 303 is enabled, the decoded characters (resulting from pressing chords while the Special Word switch is in Load position) are loaded into the Special Word register.

A Special Word Counter controls the eight character cycle of the Special Word Register during both USE and LOAD operations. If the switch is set to USE, the special word register, a 64-bit shift register, is set to recirculate through gate 304 while the special word counter and gate 307 are providing SHIFT pulses.

The USE operation is controlled by the Special Chord Circuits when it detects a special chord and provides the SPECHORD signal to start the action. The Special Word Counter then counts out 64 COMPARE pulses via gate 306 and stops at count 64 which disables gates 306 and 308 via the inverter. It remains at count 64 until it gets reset to zero by the next RESET pulse, from which it can begin another cycle. These 64 pulses are applied through gate 307 to recirculate the Special Word register which then outputs the SPECIAL WORD CHARACTERS to the Output Control in FIG. 5.7-1. Gate 308 passes 64 PCOUNT pulses to the Output Control in FIG. 5.7-1 as SPECIAL SYNCH OUT signal.

5.6 Overall Description

5.6.1 Overall Description

The 16 bit positions in each keyboard word directly correspond to the thumb and finger keys in the chord currently being pressed. The circuits in the Regular Chord Decoder generate and output the characters represented by the keyboard word. The bit positions in the keyboard word are labeled:

(0) (1) (2) (3) (4) (5) (6) (7) (8) (9) (A) (B) (C) (D) (E) (F)

Table 1 Word Bit Positions, and Cable Wire Labels

Bit positions (0) and (1) are always "0" state, and the 14 bit positions (2) through (F) correspond to the keys on the keyboard, and are shown in parenthesis on the keys in FIGS. 3-5 and 3-6. A bit position state of "1" indicates that the corresponding key is pressed and a 0 state indicates it is not pressed. These bit position labels are also used to label the cables from the respective key switches 5 in FIG. 4-2 since each can be identified by these labels. As may be seen in FIGS. 3-5 and 3-6, the key locations on the keyboard are as follows:

|  |  | (6) (8) (A) (C) (E) | Finger Keys |
|---|---|---|---|
|  |  | (7) (9) (B) (D) (F) |  |
| Thumb Keys | (2) (3) (4) (5) |  |  |

Table 2 Key Location Arrangement

The first stage of decoding the chords is to determine which finger positions have been pressed by examining the signals for the keys (6) through (F). To do this, the finger bit positions (6) through (F) in the keyboard word are examined in five overlapping subgroups representing the respective five windows, W1 through W5, which are shown in FIG. 3-6. The data that is observed through a single window indicates whether the operator pressed any one of the six finger positions observable through that window.

Each window is represented by four keys which are respectively represented by four keyword bit positions that are shown in parenthesis on the finger keys. Note that the non-existent two keys in window 5 are not in the keyboard word but are presumed to have permanent zero states in its 3rd and 4th bit positions. The windows are represented in Table 3 as follows:

| Window | Window Bit Positions |
|---|---|
| W1 | (6), (7), (8), (9) |
| W2 | (8), (9), (A), (B) |
| W3 | (A), (B), (C), (D) |
| W4 | (C), (D), (E), (F), |
| W5 | (E), (F), (0), (0), |

Table 3 Window Bit Positions in Keyboard Word
A single finger can press a combination comprising 1, 2 or 4 keys in any window, which combination is identified as a single finger position on the keyboard. There are 27 single finger positions which correspond directly to the characters in any alphabet/case on the finger keyboard. The single finger positions are labeled in brackets in FIG. 3-6, and they are as follows:

| [1] | [4] | [7] | [A] | [D] | [10] | [13] | [16] | [19] |
| [2] | [5] | [8] | [B] | [E] | [11] | [14] | [17] | [1A] |
| [3] | [6] | [9] | [C] | [F] | [12] | [15] | [18] | [1B] |

Table 4 Finger Position Labels

Ten of these single finger positions in Table 4 press a single key, and they are positions [1], [3], [7], [9], [D], [F], [13], [15], [19], and [1B]. The other 17 single finger positions press two or four keys.

The decoding process for a valid keyboard word (signalled by a CHORD PRESENT Signal) decodes its window subgroups beginning with window 1 and ending with window 5. In any window (except window 5), a single finger can press any of nine possible key combinations indicated by the 9 different finger positions in each such window. However, part of the data for the rightmost three finger positions in each of windows W1-W4 are found in the next window. For example, window 1 in FIG. 3-6 may indicate no finger position or one of finger positions [1], [2], [3], [4], [5], [6], [7], [8], [9] of which the last three finger positions [7], [8], [9] are also three finger positions in next window 2. Since some of the data required to identify the last three finger positions not found in this window, the decoding is assigned to the next window. This leaves each window with six decodable finger positions except W5 which has three decodable finger positions. This accounts for the total of 27 finger positions on the keyboard, which correspond to respective characters in each alphabet in FIG. 3-2, 3-3, or 3-4.

Therefore, a four bit code represents the four key positions for each finger position in each window. These finger position codes are easily determined by an inspection of FIG. 3-6, and they are tabulated in the following Table 4A:

Table 4A

| Finger Position | W1 | | | | W2 | | | | W3 | | | | W4 | | | | W5 | | | |
|---|---|---|---|---|---|---|---|---|---|---|---|---|---|---|---|---|---|---|---|---|
| | (6) | (7) | (8) | (9) | (8) | (9) | (A) | (B) | (A) | (B) | (C) | (D) | (C) | (D) | (E) | (F) | (E) | (F) | (0) | (0) |
| None | 0 | 0 | 0 | 0 | 0 | 0 | 0 | 0 | 0 | 0 | 0 | 0 | 0 | 0 | 0 | 0 | 0 | 0 | 0 | 0 |
| [1] | 1 | 0 | 0 | 0 | | | | | | | | | | | | | | | | |
| [2] | 1 | 1 | 0 | 0 | | | | | | | | | | | | | | | | |
| [3] | 0 | 1 | 0 | 0 | | | | | | | | | | | | | | | | |
| [4] | 1 | 0 | 1 | 0 | | | | | | | | | | | | | | | | |
| [5] | 1 | 1 | 1 | 1 | | | | | | | | | | | | | | | | |
| [6] | 0 | 1 | 0 | 1 | | | | | | | | | | | | | | | | |
| [7] | 0 | 0 | 1 | 0 | 1 | 0 | 0 | 0 | | | | | | | | | | | | |
| [8] | 0 | 0 | 1 | 1 | 1 | 1 | 0 | 0 | | | | | | | | | | | | |
| [9] | 0 | 0 | 0 | 1 | 0 | 1 | 0 | 0 | | | | | | | | | | | | |
| [A] | | | | | 1 | 0 | 1 | 0 | | | | | | | | | | | | |
| [B] | | | | | 1 | 1 | 1 | 1 | | | | | | | | | | | | |
| [C] | | | | | 0 | 1 | 0 | 1 | | | | | | | | | | | | |
| [D] | | | | | 0 | 0 | 1 | 0 | 1 | 0 | 0 | 0 | | | | | | | | |
| [E] | | | | | 0 | 0 | 1 | 1 | 1 | 1 | 0 | 0 | | | | | | | | |
| [F] | | | | | 0 | 0 | 0 | 1 | 0 | 1 | 0 | 0 | | | | | | | | |
| [10] | | | | | | | | | 1 | 0 | 1 | 0 | | | | | | | | |
| [11] | | | | | | | | | 1 | 1 | 1 | 1 | | | | | | | | |
| [12] | | | | | | | | | 0 | 1 | 0 | 1 | | | | | | | | |
| [13] | | | | | | | | | 0 | 0 | 1 | 0 | 1 | 0 | 0 | 0 | | | | |
| [14] | | | | | | | | | 0 | 0 | 1 | 1 | 1 | 1 | 0 | 0 | | | | |
| [15] | | | | | | | | | 0 | 0 | 0 | 1 | 0 | 1 | 0 | 0 | | | | |
| [16] | | | | | | | | | | | | | 1 | 0 | 1 | 0 | | | | |
| [17] | | | | | | | | | | | | | 1 | 1 | 1 | 1 | | | | |
| [18] | | | | | | | | | | | | | 0 | 1 | 0 | 1 | | | | |
| [19] | | | | | | | | | | | | | 0 | 0 | 1 | 0 | 1 | 0 | 0 | 0 |
| [1A] | | | | | | | | | | | | | 0 | 0 | 1 | 1 | 1 | 1 | 0 | 0 |
| [1B] | | | | | | | | | | | | | 0 | 0 | 0 | 1 | 0 | 1 | 0 | 0 |

Observation of Table 4A will show that: (1) the codes repeat for each window, except window 5 which has only f three codes, (2) the last three codes of each of windows W1-W4 identify three finger positions also coded for the next window, and (3) the three overlapping codes all have 00 in its first two bit positions, (4) the first six codes for each window after the all zero code do not have 00 in their first two bit positions, and (5) the first six codes are identical for each of the five windows, except that window 5 uses only the first three of these codes. Only the first six codes are assigned for decoding at each window, since the finger positions for the last three will be decoded by the first three codes of the next window.

A single chord may be formed with up to four finger positions, which are simultaneously coded in a keyboard word. The Regular Chord Decoder scans the keyboard word to detect the chord's finger positions. To do this, the decoder systematically detects each window subgroup. The Regular Chord Decoder in the described embodiment begins by detecting any of the six detectable finger positions in the window 1 subgroup and repeats this detection process at each of the other window subgroups.

Up to eight alphabets/cases can be permanently recorded in the Character Memory in which each alphabet/case does not have over 32 characters. An eight bit address is used to select each character from such Memory. The address includes a 3 bit part which addresses the particular alphabet/case selected by the thumb key depression(s), and the remaining 5 bit part addresses one of the characters selected by the finger key depression(s) comprising the chord.

The thumb key bit positions (2) through (5) in the keyboard word are used in generating the three bit part of the address, and keyboard word bits (6) through (F) are used to generate the 5 bit part of the address.

In this manner, the pressed finger positions in a chord get translated into a character in the alphabet selected by the thumb and finger positions. The first or last finger position in a chord may be translated into two characters in some alphabets/case. For example, the first character in a chord may be capitalized and preceded by a space in one case, or it may be uncapitalized and not preceded by a space in another case.

5.6.2 Window Bit Decoder

The process of decoding window bits is now discussed in detail. The first four bits 6, 7, 8, 9 of the keyboard word in the Finger Bit register are outputted as window 1 at output terminals QA, QB, QC, QD to the Window Decoder Memory and each next window is outputted by a 2 bit position left shift of the remaining finger bits in the Finger Bit Register. The current window output QA, QB, QC, QD is the 4 bit window code which the Window Decoder Memory translates into a 3 bit code Y3, Y4, Y5 which is provided at the Memory output to the Comparator inputs A1, A2, A3. Also, this Memory provides two Reload bit outputs Y1, Y2 back to the Finger Bit register inputs C, D, to set to zero each 1 bit at QC, QD which was significant in decoding the current window, so that it cannot be used in decoding the next window.

Table 5, which follows, relates the sixteen 4-Bit Window codes QA, QB, QC, QD to a resulting 3 bit code Y3, Y4, Y5 provided to the Comparator. It also relates the 4-Bit Window codes to Reload bits Y1, Y2, which reset to zero each one bit in QC, QD which is significant to the current window but must not appear in the next window. The 3 bit code is used to represent the six detectable finger positions at each of the windows W1-W4 and the three detectable positions at W5 discussed in connection with Table 4A. Table 5 shows how the 3 bit codes correspond to the 4 bit codes. The Window Bit Significance Column groups together the different 4 bit codes which have the same 3-bit code. Thus, the 3 bit code eliminates the effect of certain bits in the 4 bit code that are not significant to the detection of the current window.

Table 5

Action of Finger Memory and Comparator

| Step Counter Count | Window Bit Significance | | | | Window Code in Finger Bit Register | | | | Window Decoder Memory Output to Comparator | | | Finger Positions Represented By Code | | | | | Reload Bits | |
|---|---|---|---|---|---|---|---|---|---|---|---|---|---|---|---|---|---|---|
| | QA | QB | QC | QD | QA | QB | QC | QD | Y3 | Y4 | Y5 | W1 | W2 | W3 | W4 | W5 | Y1 | Y2 |
| | | | | | 0 | 0 | 0 | 0 | 0 | 0 | 0 | | | | | | 0 | 0 |
| | | | | | 0 | 0 | 1 | 0 | 0 | 0 | 0 | | | | | | 1 | 0 |
| 0 | 0 | 0 | r | r | 0 | 0 | 1 | 1 | 0 | 0 | 0 | | | | | | 1 | 1 |
| | | | | | 0 | 0 | 0 | 1 | 0 | 0 | 0 | | | | | | 0 | 1 |
| | | | | | 1 | 0 | 0 | 0 | 0 | 1 | 0 | 01 | 07 | 0D | 13 | 19 | 0 | 0 |
| 2 | d | 0 | 0 | r | 1 | 0 | 0 | 1 | 0 | 1 | 0 | 01 | 07 | 0D | 13 | | 0 | 1 |
| | | | | | 1 | 1 | 0 | 0 | 0 | 1 | 1 | 02 | 08 | 0E | 14 | 1A | 0 | 0 |
| 3 | d | d | r | r | 1 | 1 | 1 | 0 | 0 | 1 | 1 | 02 | 08 | 0E | 14 | | 1 | 0 |
| | | | | | 1 | 1 | 0 | 1 | 0 | 1 | 1 | 02 | 08 | 0E | 14 | | 0 | 1 |
| | | | | | 0 | 1 | 0 | 0 | 1 | 0 | 0 | 03 | 09 | 0F | 15 | 1B | 0 | 0 |
| 4 | 0 | d | r | 0 | 0 | 1 | 1 | 0 | 1 | 0 | 0 | 03 | 09 | 0F | 15 | | 1 | 0 |
| | | | | | 1 | 0 | 1 | 0 | 1 | 0 | 1 | 04 | 0A | 10 | 16 | | 0 | 0 |
| 5 | d | 0 | d | r | 1 | 0 | 1 | 1 | 1 | 0 | 1 | 04 | 0A | 10 | 16 | | 0 | 1 |
| 6 | d | d | d | d | 1 | 1 | 1 | 1 | 1 | 1 | 0 | 05 | 0B | 11 | 17 | | 0 | 0 |
| | | | | | 0 | 1 | 0 | 1 | 1 | 1 | 1 | 06 | 0C | 12 | 18 | | 0 | 0 |
| 7 | 0 | d | r | d | 0 | 1 | 1 | 1 | 1 | 1 | 1 | 06 | 0C | 12 | 18 | | 1 | 0 |

Table 6

Key Operations and Resulting Window Bit Codings

| Window Bit Significance | | | | Window Key Actuation Combinations | | | | Finger Positions Represented | | | | |
|---|---|---|---|---|---|---|---|---|---|---|---|---|
| QA | QB | QC | QD | | | | | W1 | W2 | W3 | W4 | W5 |
| 0 | 9 | r | r | 0r | 0r | 00 | 00 | | | none | | |
| | | | | 0r | 00 | 00 | 0r | | | | | |
| d | 0 | 0 | r | d0 | d0 | | | 01 | 07 | 0D | 13 | 19 |
| | | | | 00 | 0r | | | | | | | |
| d | d | r | r | d0 | dr | d0 | | 02 | 08 | 0E | 14 | 1A |
| | | | | d0 | d0 | dr | | | | | | |
| 0 | d | r | 0 | 00 | 0r | | | 03 | 09 | 0F | 14 | 1B |
| | | | | d0 | d0 | | | | | | | |
| d | 0 | d | r | dd | dd | | | 04 | 0A | 10 | 16 | |
| | | | | 00 | 0r | | | | | | | |
| d | d | d | d | dd | | | | 05 | 0B | 11 | 17 | |
| | | | | dd | | | | | | | | |
| 0 | d | r | d | 00 | 0r | | | 06 | 0C | 12 | 18 | |
| | | | | dd | dd | | | | | | | |

The "Window Bit Significance" column shown in Tables 5 and 6 indicates which bits in the 4-bit code are significant and which are not significant. The "Window Key Actuation Combination" column in Table 5 shows each of the sixteen 4 key window combinations, in which the key locations relate to the bits in the 4-bit code as

| QA | QC |
|----|----|
| QB | QD |

Thus, Table 6 shows the 16 different combinations that keys can be pressed in any window and also shows the other columns in Table 5 and the corresponding "Finger Positions" and corresponding Window Bit Significance for each bit in the current window. Thus, the 16 pressable combinations for a 4 key window are as shown in the Window Key Actuation Combinations column, in which the relative position for each of the four keys in the window is shown by one of three symbols, 0, d or r which have the following meaning:

0 key not depressed d significant key depression, interpreted as a 1 bit for decoding the current window r ignored key for decoding the current window by interpreting it as a 0 bit whether it is pressed or not (the r key is significant in decoding the next window).

The significant keys d are used in decoding the current window, but once used, they should not be used again in decoding the next window. The problem is that significant keys d in bit positions QC, QD could appear as a one bit in positions QA, QB in the next window where they would be decoded again, unless something is done to prevent their appearance in the next QA, QB. The Reload bits prevent the appearance of d bits in the next window by forcing them to zero state in QC, QD in the current window.

Note that the first eleven 4-bit codes in Table 5 do not have any d keys in bit positions QC, QD and therefore have Reload bits Y1, Y2 which are identical to QC, QD codes; hence their Reload bits do not change their bit pattern for QC, QD. However, the last of the 4-bit five window codes in Table 5 have d keys in QC, QD. Thus, the Reload bits Y1, Y2 for patterns 5, 6, 7 will have the corresponding bit code QC, QD except that a zero bit is substituted whenever a d bit existed.

In more detail, the window subgroup QA, QB, QC, QD for windows W1–W4, the last 2 bits QC, QD will again appear as the QA, QB bits of the next window subgroup. It will be noted in Table 5 that in bit positions QC, QD sometimes a bit is significant and sometimes it is not significant. If it is not significant (i.e., r), it is treated as a zero, regardless of its actual state, for decoding the current window, but it is significant in the decoding of the next window in which it becomes a d. If it is significant (i.e. d), it is a 1 bit used in decoding the current window; but it should not be used in decoding the next window. To avoid use of a d key in the next window after its use in decoding the current window, each d bit in QC, is set to zero by a Reload bit. Therefore, in detecting the next window, the 1 bits for d keys that were used in the detection of the prior window were deleted, i.e. set to 0, but any 1 bits that were not used (i.e. for r keys) remain in the next window. This is accomplished in FIG. 5.6-1A by reload bit inputs C, D into the Finger Bit Register from the window Decoder Memory. The Reload bits are gated into Finger Bit register bit positions QC, QD by a equal output from the Comparator, which occurs when the current window detection is performed. Therefore, the changing of the bits QC, QD in the Finger Bit Register cannot affect the decoding of the current window, but only the decoding of the next window. If no finger position is detected in a window, no Reload bits are gated into the Finger Bit Register. The Reload bits do not effect the current windows bit positions QA, QB because they are only used by the current window, and they will be shifted out of the Finger Bit Register in the 2-bit shift that occurs in positioning the next window for decoding.

5.6.3 The Major Components of The Regular Chord Decoder

The Regular Chord Decoder is shown in FIGS. 5.6-1A, 1B and 1C.

IN FIG. 5.6-1A, the major components are:

a. Finger Bit Register (8 and 4 bit shift registers): The 8 bit register output QH is serially coupled to the 4 bit register input L. Together they provide a 12 bit shift register which initially receives and stores the last 12 bits, i.e. bit 3–15, in the current keyboard word as they are received from the Chord Detector under the timing of 6 NSHIFT pulses. The first bits, i.e. 0–3 of the keyboard word are shifted into the Thumb Bit Register in FIG. 5.6-1C from the output QA of the 4 bit shift register. Then a preshift by a 2 bit shift left to these three registers leaves thumb bits 2–5 in the Thumb Bit Register, and finger bits 6–9 in the Finger Bit Register at its outputs QD-QA to provide the window 1 four bits in parallel to the Window Decoder Memory as the current window to be decoded. Thereafter, each next window is presented for decoding by shifting 2 bits left only the contents of the Finger Bit Register. That is, the Thumb Bit register outputs remain static until all windows are decoded from the current keyboard word.

Parallel inputs C, D, of the Finger Bit register receive Reload bits Y1, Y2 from the Window Decoder Memory. (The Reload bits reset to 0 each 1 bit which is common with the next window if that bit is used in decoding the current window. Thus, the Reload bits can only affect the 3rd and 4th bit positions in the current window. The Reload bits permit each 1 bit in the finger bit positions 6–15 of a keyboard to contribute to the decoding of only one respective character in the chord.)

b. Window Decoder Memory (8 × 32 Read-Only Memory): Translates the current four window bits (being received from the finger bit register) into a 3 bit finger position code KY3, Y4, Y5 that defines a finger position related only to the current window being decoded, and generates the 2 Reload bits. The 3 bit window code can be code 0 to indicate no finger position was pressed in the current window, or one of the codes 2 through 7 which indicate the six finger position which can be decoded from the current window. The 3 bit code is outputted to the Comparator. The two bit Reload signal Y1, Y2 is connected back to the C, D inputs of the Finger Bit Register to eliminate any bit decoded for the current window from being used in decoding the next window.

c. Test Counter (4 stage binary counter):

It provides the overall clocking which controls the decoding and outputting of the characters represented by each chord. Its 16 output counts define 16 phases of operation for each chord, which operation begins at count 0 and ends when count 15 is incremented back to count 0. It is initially preset to count 0, in which phase it remains until it is set to count 1 by a REGCHORD signal from the Special Chord Circuit, which starts the operations which handle the current chord (REGCHORD energizes a gate 301 and 320 in FIG. 5.6-1A that sets the counter to 1.) Once set to count 1, the Test Counter synchronously cycles to count 15 and back to 0 under actuations from the Step Counter. (The synchronous cycling of the Test Counter begins when AND gate 316 is enabled by inverter 300 to pass a sequence of PCOUNT pulses to the input of the step counter, which then synchronously outputs carry pulses to the input of the Test Counter and they stop when the Test Counter cycles back to count 0, which drops the enabling output of inverter 300.

d. Step Counter (3 stage binary counter):

It provides 8 counts of sublocking within each count (i.e. phase) of the Test Counter to control the electronic operations within each clocking phase. For example, in phase 1, the Step counter provides its first 2 pulses to preshift the Finger Bit Register to position window 1, and to position the Thumb Bit Register. In each next of phases 2-6, it preshifts the Finger Bit Register to the next window. The remaining six subclock pulses in each of phases 2-6 control the Comparator for decoding the current windows finger position code to detect which one of the six permissible finger position codes it happens to be. These six subclock pulses also concurrently increment the Finger Position Counter to provide a respective six of the 27 finger position addresses for the Finger Position Memory so that is can keep track of which of the five windows the current window happens to be, and store therein the detected code. (In more detail, this is done by sending each of step counts 2 through 7 to the Comparator; the coding of counts 2-7 on Step Counter outputs QB, QC, QD in the same as the six possible finger position codes translated outputs Y3, Y4, Y5 from the Window Decoder Memory, and one of the step counts will be equal to the current window code unless it is all zeros. Hence, an equal condition between a particular Test Count and the output of the Window Decoder Memory signals the decoding of the finger position for the current window to provide an EQUALPULSE output. The same set of counts 2 through 7 are also sent to the Finger Position Counter to increment it in a count-up direction during the decoding process. Each sequence of step counts 2-7 increments the finger position counter to address another set of 6 bit positions in the Finger Position Memory corresponding to the current window among the 27 finger positions, and an EQUALPULSE sets to 1 the bit position corresponding to the detected code for the respective window.

e. Comparator

Provides an EQUALPULSE output whenever its Test Counter input B1, B2, B3 becomes equal to its input A1, A2, A3 (finger position code) from the Window Decoder Memory to signal which of the Step Counter subcycles O through 7 represents the current finger position code. The EQUALPULSE output is timed with the selected one of Test Counts 2 through 7. The EQUALPULSE signal is provided to the Finger Position Memory to set to 1 its currently addressed bit position (of 27 bit positions), which represents the current windows finger position to store the result of decoding the current window.

In FIG. 5.6-1B, the major components are:

f. Position Flip Flop:

It is set during phase 7 if a space character is signalled by the Y3 output of the Thumb Memory, and it may be set during any of phases 8 through 15 in which a 1 bit is signalled by the Y output of the Finger Position Memory. That Memory is output scanned for 1 bits during phases 8 through 15. After being set, the Position flip flop is reset at the beginning of the next phase during the first Step count.

g. Shift Flip Flop:

It is set by the same pulse that resets the Position flip flop, which occurs only if the Position flip flop was set by a space or a finger position being sensed in the Finger Position Memory. Therefore, the Shift flip flop is set only when a character is to be outputted. The setting of the Shift flip flop is timed with the first Step count, and its resetting is done during the eighth Step Count of the same phase. Hence, eight step counts occur while it is set and they gate eight COMPARE pulses to the Output Buffer to shift out the eight bits of the character.

The Shift flip flop is reset by the CLEARSHIFT signal which is a negative PCOUNT pulse that occurs at the very end of step 7. This CLEARSHIFT signal goes to the clock input of the Shift flip flop. Since the Shift flip flop is now cleared, and since its output controls the SHIFT/LOAD input of the shift register, the shift register loads the next character when it gets the CLEARSHIFT signal.

In FIG. 5.6-1C, the major components are:

h. Thumb Bit Register (4 bit shift register):

It receives the thumb bits 2, 3, 4, 5 in the current keyboard word from output QA of the Finger Bit Register during the last two of the 16 NSHIFT pulses followed by a 2 bit preshift (as explained for the Finger Bit Register). The Thumb Bit Register statically stores the thumb bits throughout the decode and character output operations for the current chord.

i. Finger-Position Memory (1×256 RAM):

The 2nd through 28th bit positions in the menory respectively correspond to the 27 finger positions on the keyboard.

At the beginning of the chord detection process in phase 0, its bits are all reset to zero state. During phases 2 through 7, those of bit positions with addresses 1 through 27 corresponding to the detected finger positions in the current chord will be set to the one state to store the results of the finger position detection. During phases 8 through 15, the one bit settings control the selection of the output characters in the alphabet/case selected by the Thumb Bit Register outputs. In more detail, each finger position in the current chord is detected by the timing of an EQUALPULSE signal from the Comparator, which is synchronized with the sequential addressing of the Finger Position Memory by the Finger Position Counter, in order to set a 1 bit precisely at each bit position representing a detected finger position.

j. Thumb Memory (32 × 8 read-only memory):

It translates five input bits (of which four bits A, B, C, D are the thumb bits provided from the output of the thumb bit register and bit E is the output of the Case flip flop), which controls upper case for only the first character of a chord. The Thumb Memory provides outputs Y1, Y2 to select the required alphabet/case in the Character Memory. The Thumb Memory also outputs a FIFO signal which indicates whether the chord characters are to be outputted in normal or reverse sequence. It further outputs a CHORDSPACE signal which indicates whether the first character in the chord is to be preceded with a blank character.

k. Finger Position Counter (8 position UP/DOWN shift register):

It receives PCOUNT pulses controlled by the Step Counter, which steps it through a count of six for each respective window being decoded for a total of 27 step counts for each keyboard word, i.e. counts 1-6 for window 1, counts 7-12 for window 2, 13-18 for window 3, counts 19-24 for window 4, and counts 25-27 for window 5. It outputs five bits for addressing in sequence each of 27 finger position bits in the Finger Position Memory. The output sequence of detected characters for the current chord is controlled by the up or down Count direction; it counts up for the from 1 to 27 normal output sequence, or it counts down from 27 to 1 for the reverse output sequence. The Thumb Memory Output signal FIFO selects the direction of output sequence.

l. First Character Flip Flop: This flip flop is reset at the beginning of each phase by an NRESET pulse to provide a Q output of 0 which disables NAND gate 361.

The flip flop is set by the first 1 bit scanned in the Finger Position Memory during its output scan during Phases 8-15. The first 1 bit represents the first character to be outputted for the current chord. When set, it provides a Q output of 1 which conditions NAND gate 361 to set the Case Flip Flop at the beginning of the next phase.

m. Case Flip Flop: This flip flop, in combination with the First Character flip flop and the bits in Thumb Memory, controls the generation of an upper case character as the first non-space character outputted for a chord; any following characters in such a chord will be lower case. This operation occurs when a Space Capital Low Thumb position is pressed in a chord. The Case flip flop is set during any of Phases 9-15 after the First Character flip flop is set during the preceding Phase 8-14. Thus, if the First Character flip flop is set, its output Q conditions NAND gate 361 so that the PCOUNT Pulse during the first Step Count (i.e. FIRSTSTEP signal) activates AND gate 362 and therefore NAND gate 361 at the beginning of the next phase to set the Case flip flop. Then its output Q switches from 0 to 1 at the input E of the Thumb Memory to switch its Y2 output to the A6 input of the character Memory from 1 to 0 which then selects the lower case output for any second and following characters in the current chord.

n. Character Memory (8 × 256 Read Only Memory):

It is used during the keyboard output operation for the current chord. It translates the decoded finger positions (stored in the Finger Position Memory as one bit) into the thumb-selected character set. The Character Memory can store up to eight character sets (i.e. alphabets/cases) because its addressing bits A5, A6, A7 can address up to eight different alphabets/cases. However, in the embodiment, four alphabets/cases are stored. The Y1 and Y2 outputs of Thumb Memory become the two address bits A5 and A6 which select one of the four alphabet/cases. Two address bits from the Thumb Memory select the alphabet/case. Five address bits A0 through A4 select the required character in the selected alphabet/case. When a one bit is read from the position memory, the selected character is read from the Character Memory.

o. Output Buffer (8 bit shift register):

The Output Buffer is used with the Character Memory to sequentially output the characters of the current chord during the clock phases 8-15 after the decoding of all of its finger positions during clock phases 2-7. It receives each character as eight parallel bits from the output of the Character Memory, and outputs each received character serial by bit as the keyboard output.

5.6.3.1 Initial Condition for Certain Major Components

In every 5ms operation, the following registers in the Regular Chord Decoder are set to zero by a RESET pulse from FIG 5.2, or by some other means:

a. Case flip flop (0 until first character in a chord has been found, then (1) in FIG. 5.6-1C.
b. Finger Position Counter (scale of 32) in FIG. 5.6-1C.
c. Step Counter (scale of 8) in FIG. 5.6-1A.
d. Test Counter (scale of 16) in FIG. 5.6-1A.
e. Position Memory in FIG 5.6-1C.

In every sample period (e.g. 5ms), a keyboard word is loaded into the Finger Bit register (in FIG. 5.6-1A) and the Thumb Bit register (in FIG. 5.6-1C). These come from the keyboard word received from the Keyboard Word Generator in FIG. 5.3-1. However, the received keyboard word is not used until REGCHORD signal arrives from the special chord circuits in FIG. 5.4-1 to indicate the received keyboard word representing a regular chord which was determined to be valid for decoding.

The REGCHORD signal starts a decoding operation when it causes the Test Counter in FIG. 5.6-1A to go from 0 to 1. As soon as the Test Counter is non-zero, the Step Counter starts counting PCOUNT pulses. Carry outputs from the Step Counter are counted by the Test Counter. When the Test Counter reaches 0, indicating the completion of a keyboard word, the decoding operation is complete and the characters that the chord represents have been outputted from the keyboard. The Regular Chord Decoder then waits for the next REGCHORD signal to handle the next chord.

5.6.4 Electronic Phases of Handling Each Chord

The Test Counter controls sixteen test phases. Each of the phases is represented by a different output count, which are:

0 WAIT: Wait for a REGCHORD signal to indicate a valid keyboard word has been generated. The REGCHORD signal advances the Test Counter to Phase 1.

1 START: Start a chord decode and output sequence by advancing the Finger Position Counter to count 1.

2 POSITIONTEST: Decodes Finger Bit Register bits (6), (7), (8), (9) for window 1. There are five POSITIONTEST phases which decode windows 1-5 respectively. One or none of the six possible key combinations is detected in each window. If a finger position is decoded, a one bit is stored in a corresponding bit position in the Finger Position Memory to record the fact; the bits in the Finger Position Memory are sequentially assigned to the respective 27 finger positions. Thus, each of the windows W1-W4 has a different group of addressable bits in the Finger Position Memory, and window W5 has the last three addressable bits. Six counts from the Step Counter advance the Finger Position Counter through each of the six finger position tests in each window. Hence, it advances from 0 to 6 at window 1.

3 POSITIONTEST: Decodes bits (8), (9), (A), (B) in window 2. The Finger Position Counter advances the bit addresses from 6 to 12 in the Finger Position Memory.

4 POSITIONTEST: Decodes bits (A), (B), (C), (D) in window 3. The Finger Position Counter advances the bit addresses from 12 to 18 in the Finger Position Memory.

5 POSITIONTEST: Decodes bits (C), (D), (E), (F) in window 4. The Finger Position Counter advances the bit addresses from 18 to 24 in the Finger Position Memory.

6 POSITIONTEST: Decodes bits (E), (F), (φ), (φ) in window 5. Window 5 only has three tests because there are only three combinations of the two keys in window 5. The Finger Position Counter advances the bit addresses from 24 to 27 in the Finger Position Memory.

7 SPACE- If the thumb position generates the thumb bits 0110, 0010, or 0011, a space character, i.e. a blank (ʉ), will preceed the first character in the chord. These thumb bits cause the Position flip flop to be set in FIG. 516-1B, to control the emission of a space character in Phase 8 prior to the other chord characters. If the Thumb chord is not 0001 or 0011, the n-gram is not reversed. Therefore, in this phase, the Finger Position Counter is set to zero in preparation for reading out the characters from left to right.

8 EMITCHAR: If the Position flip flop is set, then it is reset, and the byte from Character memory is loaded into the Output Shift Register and shifted out. In the part of the phase that follows reading character memory, count the finger position counter, addressing position Memory after each count, until reading a one from Position Memory, or, after the sixth count, running out of time in the phase. If a one is found, the finger counter stops and the position flip flop is set. The final step in every EMITCHAR phase is to read character memory which puts a byte on its output lines whether or not it is needed.

9 to 15 These phases are each on EMITCHAR phase identical to phase 8. This guarantees that all characters that were found in Phases 1-7 will be emitted since the maximum number of characters that can be represented by a regular chord is six, e.g. a space followed by five other characters.

5.6.5 Operation of Phases 2, 3, 4, 5 and 6

Phases 2 through 6 perform the window decoding operations described in Section 5.6.2 Window Bit Detection. In each of Phases 2-6, an eight step count process decodes one of the five windows in a valid keyboard word. During each of Phases 2-6, the first two Step Counts, 0 and 1, are used to shift the next window into the shift register outputs QA, QB, QC and QD so that it can be decoded during the remaining step counts 2-8 in the phase.

In Phase 2, during Step Counts 0 and 1, the Finger Bit Register is shifted left two bits to eliminate the first two dummy zero bits in the keyboard word, leaving only the keyboard word bits at bit positions (2), (3), (4), (5), (which are the window 1 bits) as the outputs QA, QB, QC, QD of the Finger Bit Register.

The window output is connected to the Window Decoder Memory which translates the four bit code in the window to a 3-bit code at its outputs Y3, Y4, Y5 which are provided to the Comparator. During the next six Step Counts 2 through 8, respectively, the Comparator decodes the 3-bit code to determine if it represents none or one of the six different finger positions. To do this, the comparator compares code Y3, Y4, Y5 with the set of Codes found in the 3-bit binary-coded output counts from the Step Counter during step counts 2-8. Step counts 2-6 provide a set of codes equal to the set of six different finger position codes shown in Table 5. An equal condition between a respective step count and the Y3, Y4, Y5 code detects that the window contains the respective step count. Hence, if step counts 2-8 are considered on a scale of 1-6, respectively, the number of any step count providing an equal condition is the decoded number for that window.

Phase 3 repeats the process described for Phase 2, except that its initial Step Counts 0 and 1 provide the initial two bit left shift which moves window 2 into decoding position. The same process is repeated in Phases 4, 5 and 6 for the respective windows 3, 4 and 5.

The window decoding operation also uses the Finger Position Memory. It contains a separate bit position for each finger position, which are respectively addressed by the output of the Finger Position Counter. When any one or more bits are set to 1 in the Finger Position Memory, each 1 indicates that the respective finger position was decoded. For example, if the bits at addresses 7 and 18 are set to 1, then the 7th and 18th finger positions were decoded.

The Finger Position Counter counts through a scale of 32. It is incremented as the Step counter counts through its six decoding counts 2-8. In other words, the Finger Position Counter is advanced by each Step count that is compared for a finger position, and it is advanced through six counts for each window for a total advance of 30 counts while decoding the five windows in a keyboard word for the 27 finger positions.

The Finger Position Counter outputs five bits as the address provided as inputs A, B, C, D, and E of the Finger Position Memory to address each bit corresponding to one of the 27 finger positions. The incrementing (or decrementing) counts to this counter are provided through OR circuit 347 as a signal called FINGERCOUNT.

Thus, whenever the comparator finds agreement between the Step count and the output of the Window Decoder Memory, it causes two things to happen:

1. It stores a 1 in the currently addressed bit in the Finger Position Memory. This will later cause a character to be read out.
2. It also causes a pair of Reload bits from Window Decoder Memory to be provided to inputs C, D in the Finger Bit Register.

5.6.6 Character Memory

A typical set of contents for Character Memory is shown in Table 7, which illustrates four alphabets/cases in columns 00, 01, 10 and 11.

Table 7

| FINGER POSITION | | Contents of Character Memory | | | | | | | | Definitions |
|---|---|---|---|---|---|---|---|---|---|---|
| | | A0 | A1 | A2 | A3 | A4 | A5 00 | A6 01 | 10 | 11 | |
| DEC | HEX | | | | | | | | | | |
| | | 0 | 0 | 0 | 0 | 0 | ʉ | ʉ | b | ʉ | |
| [1] | [1] | 0 | 0 | 0 | 0 | 1 | d | D | ¢ | / | |
| [2] | [2] | 0 | 0 | 1 | 0 | 0 | t | t | & | ATTN | ATTENTION |
| [3] | [3] | 0 | 0 | 0 | 1 | 1 | g | G | ! | * | |

Table 7-continued

| FINGER POSITION | | A0 | A1 | A2 | A3 | A4 | Contents of Character Memory A5 00 | A6 01 | 10 | 11 | Definitions |
|---|---|---|---|---|---|---|---|---|---|---|---|
| DEC | HEX | | | | | | | | | | |
| [4] | [4] | 0 | 0 | 1 | 0 | 0 | b | B | @ | CR | CARRIAGE RETURN |
| [5] | [5] | 0 | 0 | 1 | 0 | 1 | w | W | ' | BS | BACKSPACE |
| [6] | [6] | 0 | 0 | 1 | 1 | 0 | c | C | " | TAB | TAB |
| [7] | [7] | 0 | 0 | 1 | 1 | 1 | f | F | ! | + | |
| [8] | [8] | 0 | 1 | 0 | 0 | 0 | p | P | _ | NA | NOT ASSIGNED |
| [9] | [9] | 0 | 1 | 0 | 0 | 1 | m | M | $ | — | |
| [10] | [A] | 0 | 1 | 0 | 1 | 0 | s | S | \ | NA | |
| [11] | [B] | 0 | 1 | 0 | 1 | 1 | v | V | NA | NA | |
| [12] | [C] | 0 | 1 | 1 | 0 | 0 | l | L | # | NA | |
| [13] | [D] | 0 | 1 | 1 | 0 | 1 | n | N | ) | φ | |
| [14] | [E] | 0 | 1 | 1 | 1 | 0 | h | H | ( | NA | |
| [15] | [F] | 0 | 1 | 1 | 1 | 1 | r | R | ? | . | |
| [16] | [10] | 1 | 0 | 0 | 0 | 0 | k | K | NA | NA | |
| [17] | [11] | 1 | 0 | 0 | 0 | 1 | x | X | NA | NA | |
| [18] | [12] | 1 | 0 | 0 | 1 | 0 | q | Q | NA | NA | |
| [19] | [13] | 1 | 0 | 0 | 1 | 1 | j | J | = | 7 | |
| [20] | [14] | 1 | 0 | 1 | 0 | 0 | z | Z | % | 4 | |
| [21] | [15] | 1 | 0 | 1 | 0 | 1 | y | Y | NA | 1 | |
| [22] | [16] | 1 | 0 | 1 | 1 | 0 | u | U | < | 8 | |
| [23] | [17] | 1 | 0 | 1 | 1 | 1 | ␢ | ␢ | > | 5 | |
| [24] | [18] | 1 | 1 | 0 | 0 | 0 | i | I | NA | 2 | |
| [25] | [19] | 1 | 1 | 0 | 0 | 1 | a | A | ; | 9 | |
| [26] | [1A] | 1 | 1 | 0 | 1 | 0 | e | E | : | 6 | |
| [27] | [1B] | 1 | 1 | 0 | 1 | 1 | o | O | , | 3 | |
| | | 1 | 1 | 1 | 0 | 0 | ␢ | ␢ | ␢ | ␢ | |
| | | 1 | 1 | 1 | 0 | 1 | ␢ | ␢ | ␢ | ␢ | |
| | | 1 | 1 | 1 | 1 | 0 | ␢ | ␢ | ␢ | ␢ | |
| | | 1 | 1 | 1 | 1 | | ␢ | ␢ | ␢ | ␢ | |

Table 7 - Contents of Character Memory

The Character Memory is a read-only memory chip, and by replacing the chip with another, it is possible to change alphabets/cases.

The Character Memory is addressed by bits A0, A1, A2, A3, A4, A5, A6 of which A0-A4 are the outputs of the Finger Position Counter, and A5, A6 are outputs of the Thumb Memory. An address A0-A6 selects one character in the Finger Position Memory in an alphabet/case selected by address bits A5, A6 received from the Thumb Memory.

The four codes for address bits A5, A6 are shown in Table 7 as the headings of columns 00, 01, 10 and 11 which contain the names or graphic characters. These graphic characters represent 8bit bytes in the EBCDIC code in the Memory. The column headed by 00 contains the "lower case" of the English Alphabet. The column headed by code 01 contains the "upper case" of the English alphabet. The column headed by 10 is the "special" alphabet; and the column headed by code 11 is called the "number" alphabet even though it also contains control characters.

In each alphabet/case in the read-only memory, the A0-A4 addresses 00000 and 10111 and 11111 are used to hold the byte that represents a space, i.e. The choice among these addresses for a preceding space is determined by whether the thumb keys call for a preceding space in the chord and whether the characters in the chord are to be emitted in left-to-right sequence (normal) or from right-to-left sequence (reverse), or whether finger position [23] is typing a space character.

5.6.7 Thumb Memory

The Thumb Memory in FIG. 5.6-IC uses 32X4 bits of read-only memory space. Its inputs D, C, B, A are the four thumb bits from the thumb keys. Input E is the Q output of the Case flip flop. Together, inputs E, D, C, B, A provides a 5-bit address to the Thumb Memory, which then provides the corresponding content shown in Table 8 as its output, as follows:

Table 8

| THUMB POSITION | THUMB MEMORY ADDRESS | | | | | THUMB MEMORY CONTENTS | | | | THUMB POSITION NAME |
|---|---|---|---|---|---|---|---|---|---|---|
| | E | D | C | B | A | Y1 | Y2 | Y3 | Y4 | |
| [0] | 0 | 0 | 0 | 0 | 0 | 0 | 0 | 0 | 1 | Forward lower case |
| [7] | 0 | 0 | 0 | 0 | 1 | 0 | 0 | 0 | 0 | Reverse lower case |
| [5] | 0 | 0 | 0 | 1 | 0 | 0 | 0 | 1 | 1 | Space forward lower case |
| [6] | 0 | 0 | 0 | 1 | 1 | 0 | 0 | 1 | 0 | Space reverse lower case |
| [3] | 0 | 0 | 1 | 0 | 0 | 0 | 1 | 0 | 1 | Upper case |
| | 0 | 0 | 1 | 0 | 1 | 0 | 0 | 0 | 1 | * |
| [4] | 0 | 0 | 1 | 1 | 0 | 0 | 1 | 1 | 1 | space cap low |
| | 0 | 0 | 1 | 1 | 1 | 0 | 0 | 0 | 1 | * |
| [1] | 0 | 1 | 0 | 0 | 0 | 1 | 0 | 0 | 1 | Special character alphabet |
| | 0 | 1 | 0 | 0 | 1 | 0 | 0 | 0 | 1 | * |
| | 0 | 1 | 0 | 1 | 0 | 0 | 0 | 0 | 1 | * |
| | 0 | 1 | 0 | 1 | 1 | 0 | 0 | 0 | 1 | * |
| [2] | 0 | 1 | 1 | 0 | 0 | 1 | 1 | 0 | 1 | number alphabet |
| | 0 | 1 | 1 | 0 | 1 | 0 | 0 | 0 | 1 | * |
| | 0 | 1 | 1 | 1 | 0 | 0 | 0 | 0 | 1 | * |
| | 0 | 1 | 1 | 1 | 1 | 0 | 0 | 0 | 1 | * |
| [0] | 1 | 0 | 0 | 0 | 0 | 0 | 0 | 0 | 1 | Forward lower case |
| [7] | 1 | 0 | 0 | 0 | 1 | 0 | 0 | 0 | 0 | Reverse lower case |
| [5] | 1 | 0 | 0 | 1 | 0 | 0 | 0 | 1 | 1 | Space forward lower case |
| [6] | 1 | 0 | 0 | 1 | 1 | 0 | 0 | 1 | 0 | Space reverse lower case |
| [3] | 1 | 0 | 1 | 0 | 0 | 0 | 1 | 0 | 1 | Upper case |

Table 8 -continued

Contents of Thumb Memory

| THUMB POSITION | THUMB MEMORY ADDRESS | | | | | THUMB MEMORY CONTENTS | | | | THUMB POSITION NAME |
|---|---|---|---|---|---|---|---|---|---|---|
| | E | D | C | B | A | Y1 | Y2 | Y3 | Y4 | |
| | 1 | 0 | 1 | 0 | 1 | 0 | 0 | 0 | 1 | * |
| [4] | 1 | 0 | 1 | 1 | 0 | 0 | 0 | 1 | 1 | Space cap low |
| | 1 | 0 | 1 | 1 | 1 | 0 | 0 | 0 | 1 | * |
| [1] | 1 | 1 | 0 | 0 | 0 | 1 | 0 | 0 | 1 | Special character alphabet |
| | 1 | 1 | 0 | 0 | 1 | 0 | 0 | 0 | 1 | * |
| | 1 | 1 | 0 | 1 | 0 | 0 | 0 | 0 | 1 | * |
| | 1 | 1 | 0 | 1 | 1 | 0 | 0 | 0 | 1 | * |
| [2] | 1 | 1 | 1 | 0 | 0 | 1 | 1 | 0 | 1 | Number alphabet |
| | 1 | 1 | 1 | 0 | 1 | 0 | 0 | 0 | 1 | * |
| | 1 | 1 | 1 | 1 | 0 | 0 | 0 | 0 | 1 | * |
| | 1 | 1 | 1 | 1 | 1 | 0 | 0 | 0 | 1 | * |

Two output bits Y1, Y2 provide address bits A5,A6 to the Character Memory to select one of four alphabets/cases stored in the Character Memory. Another output bit Y3 from the Thumb Memory provides a signal called CHORDSPACE which determines whether the chord is to be preceeded by a space character. Another output bit Y4 from the Thumb Memory provides a signal called FORWARD which controls the output sequence of characters of the chord, i.e. whether they are to be outputted in normal or reverse sequence.

The E bit in the address is logically significant only for the single thumb position [4], called "SP. CAP. LOW", which means "Space, Capital, then Lower Case". Table 8 shows the thumb bit codes in its address columns D, C, B, A is two places for thumb position [4], one place with E being 0 and the other with E being 1. Note that the Y2 bit in the content for the SP. CAP. LOW thumb position changes from 1 to 0 when the E bit in the address changes from 0 to 1. A change in the E bit is insignificant for all other codes in Table 8, since their content codes do not change when the E bit changes.

A case control operation is caused by the SP. CAP. LOW thumb position [4] bit code 0110, which is found in the D, C, B, A columns of the Thumb Memory Address in Table 8. Initially, the E bit has a 0 state to provide a total Thumb Memory Address of 00110, which in Table 8 selects the Thumb Memory content Y1, Y2, Y3, Y4 of 0111. Later when E is 1, the content Y1, Y2, Y3, Y4 is 0011. The difference is in the Y2 bit, which is also the A6 bit in the Character Memory Address. (The Y1 bit, which is also the A5 bit in the Character Memory Address, does not change when the E bit changes.) Now look at Table 7, in which it will be seen that when the A5, A6 bits are 01, (corresponding to Y1, Y2 when E is 0) the upper case is selected; but when A5, A6 are 00 (corresponding to Y1, Y2 when E is 1), the lower case is selected The sequential control for the SP. CAP. LOW operation uses a First Character flip flop and a case flip flop in FIG. 5.6-IC, in which both are initially cleared by an NRESET pulse. The latter then provides a Q output 0 as the E bit for the Thum Memory to cause an upper case character to be outputted by the Character Memory as the first chord character when the first 1 bit is scanned in the Finger Position Memory. Thus, the first 1 bit scanned for a chord in the Finger Position Memory provides a POSOUT signal which sets the first Character flip flop. Its Q output then conditions NAND gate 361, which is actuated by AND gate 362 at the beginning of the next phase by PCOUNT pulse during Step Count 0, which then sets the case flip flop. Hence, the first upper case character is addressed in the Character Memory and outputted into the Output Buffer during one phase, which is before the Case flip flop sets E to 1 at the beginning of the next phase for selecting lower case characters thereafter in the chord.

The thumb key codes A, B, C, D that are marked with an asterisk in Table 8 will not occur in the proper operation of the keyboard. If they are pressed, however, they have been given the same meaning as pressing no thumb keys at all, i.e. Thumb Memory Content 0001, which provides the "forward lower case" output control for the characters in the chord.

5.6.8 Control Signals of Regular Chord Decoder

FIGS. 5.6 2A and B show the timing of the control signals. Not all of the signals are shown in FIG. 5.6-2A and B, and equations are provided below to include signals that may not be shown.

The first four signals COMPARE, PCOUNT, NCOUNT, and RESET are received from the Timing Signal Generator in FIG. 5.2-1.

SHIFT is received from the Keyboard Word Generator in either 5.3-1 or 5.3A or 5.3B.

REGCHORD from FIG. 5.4-1 signals that the current keyboard word is valid and should be decoded by the Regular Chord Decoder. It is generated by the Special Chord Circuits in FIG. 5.4-1 and has the same timing as the CHORD PRESENT signal from the Keyboard Word Generator.

Before attempting to read the next paragraphs, the reader should have clearly in mind the description of the operation of the Step Counter and Test Counter in FIG. 5.6-1A which were given previously in Section 5.6.3, and the phases of testing which are described in Section 5.6.4. Thus, the Test Counter determines the overall timing phases, and the Step Counter clocks the operations within each phase.

SCB, SCC, and SCD are the three outputs of the Step Counter which is stepped by eight PCOUNT pulses during each of phases 1 through 15.

TCA, TCB, TCC and TCD are the four outputs of the Test Counter controlling the sixteen phases. While in Phase, the system waits for a REGCHORD signal which steps the Test Counter from Phase 0 to Phase 1 and causes a sequence of PCOUNT pulses to step the Step Counter. Thereafter, carries from the Step Counter at its Count 7 step the Test Counter from Phase 1 to 15 and back to 0. When the Test Counter returns to Phase 0 PCOUNT pulses are then blocked from input to the Step Counter by AND gate 316 so that no carries are thereafter provided to the Test Counter, and it hences stops at Phase 0. That is, the REGTEST signal from inverter 300 inhibits gate 316 from passing PCOUNT pulses to the Step Counter when the 0 count of the Test Counter is detected by AND gate 302. From a practical circuit point of view, the Test Counter increments on negative transitions of outputs from OR circuit 320 which receives each SCD signal (carry) and the output of AND circuit 301. Test Counter incrementing is defined as:

SCD1/-(-REGTEST®CHORD&PCOUNT)

Note 1: the / symbol is an OR function, — is a NOT function, and & is an AND function.

Note 2: The - is regarded as being more tightly bound to the symbol at its right than that symbol is bound to anything else. The following truth table illustrates the notation:

| A | B | A & B | A / B | −A | −A & B | −(A & B) |
|---|---|-------|-------|----|--------|----------|
| 0 | 0 | 0 | 0 | 1 | 0 | 1 |
| 0 | 1 | 0 | 1 | 1 | 1 | 1 |
| 1 | 0 | 0 | 1 | 0 | 0 | 1 |
| 1 | 1 | 1 | 1 | 0 | 0 | 0 |

RETEST from inverter 300 enables gate 316 to pass PCOUNT pulses while a regular chord is being decoded, and it only inhibits the Test Counter when it is 0. The output of inverter 300 and AND circuit 302 is defined as:

REGTEST = (−TCA&−TCB&−TCC&−TCD)

To save space, four signals are shown together in FIGS. 5.6-2A and B on one line with REGTEST. They are all defined below.

5.6.8.1 Phase 1 Control

Phase 1 is initiated by the REGCHORD signal passing through gate 301 and OR circuit 320 to increment the Test Counter to count 1. This is permitted only during Phase 0 because gate 301 is only conditioned during Phase 0 by the WAIT output of gate 302. Test Count 1 activates the START signal from AND circuit 303, as follows:

START = −TCD&−TCC&−TCB&−TCA

5.6.8.2 Phases 2-6 Control

Phases 2 through 6 are controlled by the POSITIONTEST signal from AND gate 305 and NAND gate 304, defined as follows:

POSITIONTES = TCD&−(−TCC&−TCB)

The POSITIONTEST signal is provided to an inverter 309 and to AND gate 311. The inverter generates a PRESHIFT signal used to preshift the first window into a decodable position in the Finger Bit Register. AND gate 311 generates an ENABLECOMP signal. ENABLECOMP does two things. It is applied through inverter 318 to the Window Decoder memory input G for controlling its 3-bit code to the Comparator. ENABLECOM is also applied to the S0 input of the Finger Bit Register to control Reload bits to the Finger Position Register on the next clock pulse. Thus, ENABLECOMP is 1 while the five windows are being decoded during step counts 2-7 in each of phases 2, 3, 4, 5 and 6. OR circuit 310 and AND gate 311 operate as follows:

ENABLECOMP = POSTIOCONTESTS& (SCC/SCD)

The keyboard bits are shifted in from the Keyboard Word Generator with NSHIFT pulses, which are provided by AND gate 330, defined as follows:

NSHIFT = NCOUNT & −(COMPARE ENABLE)

These signals are all normally positive 1 and the pulses go to 0, because the 74194 shift register circuit controls S0 and S1 can be changed only when the clock is positive.

At the beginning of each decoding phase 2 and through 6 there are two PRESHIFT pulses during Step counts 0 and 1. These pulses bring the next window in place for decoding.

PRESHIFT = SCC/SCD/ NCOUNT/-POSITIONTEST

The first two of the 16 bits in a word are not significant, they are dummy bit positions which are always 0. In Phase 2, the PRESHIFT pulses move the first two-non-significant bit positions out to leave the first four significant bits available at QA, QB, QC and QD for decoding the first window.

Notice also that the pair of PRESHIFT pulses from OR 312 in Phase 2 also shifts the Thumb Bit Register by providing THUMBSHIFT from AND 331 to position the thumb bits in the Thumb Bit Register for decoding.

The Equal (=) signal output of the Comparator occurs when the Step Counter output equals the Window Decoder Memory output during Phases 2-6. The (=) output of the Window Decoder Memory activates OR circuit 313 to provide an EQUALPULSE signal provided from AND gate 313 which indicates as a negative-going pulse that a finger position has been found. It is defined as:

EQUALPULSE = −EQUAL/NCOUNT

An AND gate 314 generates a REGSHIFT signal which is shown in FIG. 5.6.2. It is defined as:

REGSHIFT = NSHIFT & PRESHIFT & EQUALPULSE

The shift pulses of REGSHIFT are applied only to the 74194 part of the Finger Bit Register since it must not receive EQUALPULSE. Only the NSHIFT pulses are applied to the Thumb Register.

In FIG. 5.6-1B, a DIRECTION signal is the output of OR circuit 341, which is used to control the direction of counting of the Finger Position Counter. It counts up during Phases 2-7, but it may count up or count down during the emit Phases 8-15 as controlled by the Y4 output of the Thumb Bit Register. If the Y4 output is 0, it indicates that the characters are to be read out in reverse order, i.e. DOWN, otherwise it must count UP. OR circuit 341 defines the DIRECTION signal as follows:

DIRECTION = −TCD/FORWARD

AND gates 342 and 343 control whether input pulses to the Finger Position Counter will cause it to count UP or DOWN. The TESTCOUNT signal from AND 317 in FIG. 5.6-1A controls the number of pulses to be counted by the Finger Position Counter, which are six pulses during each of Phases 1 through 6. TESTCOUNT is generated by AND gate 316, OR circuit 310 and AND circuit 317, as follows:

TESTCOUNT = PCOUNT®TEST& (SCC/SCD) & POSITIONTEST

The detection of a finger position occurs when a one is stored in the Finger Position Memory in FIG. 5.6-1C when EQUALPULSE goes negative. This signal is applied to the WE (Write Enable) input of the 74S200, Finger Position Memory by AND gate 352 in FIG. 5.6-1B which provides the WRITENABLE signal as follows:

WRITENABLE = ZEROWRITE&EQUALPULSE

5.6.8.3 Phase 7 Control

Phase 7 decodes any space character which is to preceed the characters outputted for the chord, and detects the output sequence for the chord characters. This occurs for the three thumb positions [4], [5] and [6]. Phase 7 is signalled by the SPACETIME output of AND gate 306 in FIG. 5.6-1A, defined as follows:

SPACETIME = −TCD&TCC&TCB&TCA

The thumb positions [4], [5] and [6] cause the Y3 output of the Thumb Memory, called CHORDSPACE, to be 1 and it is provided to NAND 361, AND 362 in FIG. 5.6-1B to set the POSITION flip flop with the following output signal:

SETPOS = −(CHORDSPACE&SPACETIME)&POSOUT

The output Q of the Position flip flop provides the POSFLIP output to AND 363.

The output character sequence is controlled by the thumb position bits. If the thumb position bits are not 0001 or 0011, i.e. not reverse thumb positions [7] or [6] then the Y4 output of the Thumb Memory is FORWARD, which is 1 to signal the normal output sequence. In this case, the Finger Position Counter must be cleared by the CLEARFINGER output of AND 351 in FIG. 5.6-1B, as follows:

CLEARFINGER = FIRSTSTEP&SPACETIME&FORWARD&COMPARE

When cleared, the Finger Position Counter is set to its 0 count output.

5.6.8.4 Phases 8-15 Control

The chord finger positions which were decoded and stored in the Finger Position Memory during Phase 2 through 7 are translated to characters and outputted from the keyboard during Phases 8 through 15, which occur during the TCD signal from output QD of the Test Counter. If a preceeding space character was decoded, the Position flip flop was set in Phase 7. Then, a compare pulse at the beginning of the Phase 8 loads the space byte from the Character Memory into the output Buffer, clears the Position flip flop, and sets the Shift flip flop. This is done by the FINDPOS output of AND gate 363 during the Step count 0 of Phase 8, defined as follows:

FIRSTSTEP = −(SCB/SCC/SCD) = Step Count 0
    FINDPOS = COMPARE&FIRSTSTEP&TCD&POSFLIP The Shift flip flop in FIG. 5.6-1B controls the shift-/load input of the Output Buffer in FIG. 5.6-1C. When the Shift flip flop is set, it outputs the SHIFTFLIP signal to AND gate 364, which then enables the Regular Decoder SYNCHOUT signal:

SYNCHOUT = COMPARE&TCD&SHIFTFLIP

The SYNCHOUT signal shifts the Output shift register and also goes to the Output Control in FIG. 5.7-1.

The last step count 7 in each Phase 8-15 clears the Shift flip flop from the output of AND 366, and its invert, called CLEARSHIFT, controls the Output Buffer to the next byte from the Character Memory. AND gate 366 therefore provides:

CLEARSHIFT = (TCD&LASTSTEP&PCOUNT)

The CS signal from NOR circuit 323 in FIG. 5.6-1A enables the Character Memory to read a byte during Step counts 7 and 0. TheCS pulse is 4 microseconds, and a Step count pulse is 2 microseconds long. During the CS pulse, the Memory settles and the output can be read during Step Count 0 of the next phase.

The CS signal is provided during Step counts 1-6: It and its component signals are defined as follows:
    LASTSTEP = SCB&SCC&SCD
    FIRSTSTEP = −(SCB/SCC/SCD)
    CS = −(FIRSTSTEP/LASTSTEP)

During each of Phases 8-15, up to 6 bit positions in the Finger Position Memory are scanned. The scan continues during each of Phases 8-15 as long as the bits are sensed in zero state. That is during any of Phases 8-15, the scan stops at the first 1 bit sensed. The 1 bit is set to zero at the end of the phase during the Step count 7 before the scan continues. The scan starts again for the next phase at the next bit position. The reset to zero for each 1 bit prepares the Finger Position Memory for the next chord decoding.

In more detail to perform the scan, the Finger Position counter is incremented (up) or decremented (down) by up to six SCAN pulses (synchronized by Step Counts 1-6 and PCOUNT pulses). But this sequence of up to six pulses is stopped by the setting of the Position flip flop upon the sensing of a 1 bit at the currently scanned addressed location in the Finger Position Memory. At the end of each Phase 8-15 during Step count 7, the scan is moved to the next memory bit position, after the last bit position is reset by the WRITENABLE signal, and the MEMENABLE signal from AND gate 372.

Thus, a SCAN pulse is provided during each of Step counts 1 through 6 within each Phase 8 through 15 until the Position flip flop is set during the phase or until the sixth SCAN pulse is provided during step count 6. During each Step count 1-6 of the same phase, a PTEST pulse reads the currently addressed bit position in the Finger Position Memory, and if a 1 bit is found therein, POSOUT sets the Position flip flop, and WRITENABLE during Step count 7 resets the 1 bit. The PTEST signal is provided by NAND gates 354, and the SCAN signal is provided by AND gate 356, defined as follows:

PTEST = −(TCD&CS&COMPARE&−POSFLIP)
    SCAN = TCD&CS&PCOUNT&POSFLIP

The PTEST pulse enables the ME input of the Finger Position Memory during the Step Counts 1-6 to read the bit before the ZEROWRITE enables WE to erase the bit during Step count 7.

5.6.8.5 Finger Position Counter Control

The Finger Position Counter counts in every phase. Its operations may be summarized as follows:

```
FINGERCOUNT = START/TESTCOUNT/-
    SPACECOUNT/SCAN/CLEARSHIFT
SPACECOUNT = PCOUNT&SPACETIMER&-
    FIRSTSTEP
```

It also can be reset during Phase 7 with CLEARFINGER, and always is reset by a RESET pulse.

```
CLEARFINGER = SPACETIME&FIRST-
    STEP&FORWARD&COMPARE
```

5.6.8.6 Finger Position Memory

This is a 256×1 bit random access memory which is used to record, with a 1, the discovery of each finger position decoded during Phases 2-6. It is read and reset during Phases 8-15 and, whenever is produces a 1, a character is outputted.

The Memory has Write Enable (WE) and Memory Enable (ME) inputs which are each enabled by a negative signal, i.e. down level. Gate 352 (in FIG. 5.6-1B) and gate 372 (in FIG. 5.6-1C) act as OR circuits because their negative output is provided when any input is at its down level. The controlling signals are defined as follows:

```
ZEROWRITE = -(TCD&LASTSTEP&COM-
    PARE)
```

The PTEST and the EQUALPULSE are both negative-going signals, so they are at their up levels when not providing pulses.

```
WRITENABLE = ZEROWRITE/EQUAL-
    PULSE
MEMENABLE = WRITENABLE/PTEST
```

A PTEST pulse that enables the reading of a 1 bit gets chopped off, as shown in FIG. 5.6-3. The way this happens is that when the PTEST enables the Finger Position Memory to read and produce a 1 at its output Y which provides a POSOUT signal through inverter 373 to AND 362 for setting the Position flip flop, which then drops the NOT POSFLIP signal to turn off the PTEST and SCAN signals from AND circuits 354 and 356. This happens quickly enough to chop off part of the PTEST pulse.

After the PTEST pulse is chopped off, the Finger Position Memory is still sitting at the same address because the SCAN pulses also have been ended at least by the Step count 6. A ZEROWRITE signal in Step 7 of each Phase 8-15 writes a 0 in that bit position in Positon Memory whether that bit position has a 0 or 1. Since the scan stopped at every 1, they are all set to 0 at the end of a scan of the Memory. In this manner, every 1 bit in the first 28 positions of the Finger Position Memory gets detected, used, and changed to 0, and the memory is made ready for its next chord.

The final thing that has to be done at the end of each Phase 8-15 is that, after ZEROWRITE and before the end of Step count 7, the Finger Position counter has to be incremented by 1 to get ready for the next phase. This is done with the last NOT CLEARSHIFT pulse from inverter 357, which is gated by the next PCOUNT pulse.

It should be noticed that the search for 1's in Finger Position Memory can go beyond the area where detected finger positions are stored. This is harmless as the Finger Position Counter gets reset to its zero position by a RESET pulse so its output address is initialized for the next chord regardless of any excess scanning for the current chord.

5.7 Output Control

The output control is shown in FIG. 5.7-1. It accepts characters in serial-by-bit form and gates them out with SYNCH OUT pulses, one for each bit of data from either the Regular Chord Decoder or the Special Word circuits. It also is gated by the REGCHORD and SPECHORD signals. If REGCHORD is 1, then SPECHORD is 0 during Phases 1 through 15 (see FIG. 5.6-2) and the Keyboard Output characters are the decoded characters from the Regular Chord Decoder. Otherwise, the keyboard Output Characters are the Special Word Characters.

5.8 Alternative Embodiments

The alternatives described in the following sections occurred to the inventors during the design of the embodiment and are described here to elucidate further the scope of the invention.

5.8.1 Parallel vs. Serial Logic

Parallel implementation for decoding all 14 keyboard word bits can be done in parallel. However, fewer components result in serially decoding the windows as is done in the detailed embodiment with no restriction in speed in view of human speed limitations.

5.8.2 Number of Finger Keys

A different number of finger keys could be used than the 2×5 array of keys. In particular, a 2×6 array of keys seems very appropriate for European alphabets which have things like um lauts so that the number of characters is increased a little bit over the standard Roman alphabet. Also, three rows ofkeys may be used instead of two rows. This should be useful for some kinds of applications. The choice of the 2×5 array in the present embodiment was preferred as the simplest arrangement for typing English, using the conventional alphabets.

5.8.4 Number of Thumb Keys

It would be easy to put in a fifth thumb key, but four was preferred on the basis of simplicity. Also, two rows of thumb keys may be provided but thumb control of quad-groups of keys is more difficult than finger control due to the flat position of the thumb in relation to the keys. If there were two rows of five thumb keys, there would be 38 thumb positions instead of the 8 in the present embodiment. This would provide much greater power at the expense of increased difficulty of learning.

It will be possible to increase both the number of fingers keys and the number of thumb keys. Suppose there were three rows of 6 finger keys and two rows of 5 thumb keys. There would be somewhat fewer than 168,000 chords that could be keyed with one hand. This is an obvious application of the invention which could be used if an appropriate need arose.

5.8.4 Different Use of Finger Positions and Thumb Positions

It is not essential to use the finger positions to identify members of an alphabet and to use the thumb positions to select among alphabets/cases. Instead, some of the finger positions could select alphabets/cases and some of the thumb positions could select character from alphabets. There are a variety of alternatives of this sort. The choice in the detailed embodiment is preferred because of simplicity in structure and in ease of learning.

Other changes would be to use different alphabets or to assign the alphabets to finger positions differently. The assignment of letters to finger positions has been optimized with respect to English and with respect to the samples of English text that were experimentally used. If the assignment were optimized with respect to text of foreign language, the assignment would be different.

5.8.5 Other Switch Mechanisms

The structure of each key may support it to go up and down vertically in slides instead of being pivoted on lever arms. Alternatively, the keys need not be mechanically movable at all, but may be marked positions in which the presence of a finger is sensed capacitively, or the pressure of a finger on that position could actuate some electrical property of the material underneath when pressure is exerted, e.g. strain gauge.

5.8.6 Surfaces of the keys

Flat surfaces are shown and preferred due to simplicity. However, there are many alternatives. For example, a dish-shaped depression or a bump at each finger position might be useful for guiding the finger to the finger position. The angle between the thumb key group and the finger key group, and their relative heights, may be changed to conform to the different hand structures.

5.8.7 Special Chords and Words

The embodiment shows a single special chord and a special word of limited length. An obvious extension would be to have a larger number or perhaps an unlimited number of special chords, and longer or perhaps unlimited maximum length for special words. For many applications, this would be extremely attractive and might become the primary method of signalling with a keyboard.

5.8.8 Independent Meanings for Separate Chords

Instead of using several alphabets and selecting among them, it would be possible to assign a distinct meaning to each chord. For example, a chord could be assigned to each of the several thousand characters used in writing Chinese, then one could type Chinese with one character per chord. Another such application would be to assign a separate English word or word stem or word ending to separate chords. Then one could get merely one word per chord which would approximately double the speed of typing.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A keyboard for one-handed typing of chords, such chords being formed by the simultaneous pressing of one or more keys on the keyboard to produce one or more characters, the keyboard comprising
   an array of keys for being operated by the fingers of one hand, electrical switch means being connected to the keys in the array of keys, an array of finger positions located on the array of keys, a finger position being located on each key and across the boundary of adjacent keys pressable by any one finger, a particular switch combination of closed and open switching paths in the electrical switch means being provided for each chord pressable on the array of keys,
   means for interpreting chords, comprising means to generate coded signals representing members of a set of characters, switching and logical circuit means to sense the particular switch combinations of closed and open switching paths of a chord to select character signals that correspond to the finger positions that correspond to a respective chord, and output circuit means to issue the character signals.

2. A keyboard for the one-handed typing of chords, as defined in claim 1, further comprising
   each finger position being a disk-shaped depression formed on the surface of each key and on the combined surfaces of adjacent keys across their boundaries.

3. A keyboard for one-handed operation as defined in claim 1, in which said electrical switch means further comprises
   one-released-finger circuit means for generating a chord present signal which a first finger key is released after one or more finger keys are pressed to form a chord, and
   a finger position decoder circuit means being enabled by the chord present signal to decode a particular combination of closed and open switching paths existing at an instant before the first key is released.

4. A keyboard for one-handed operation as defined in claim 1, in which said elecrical switch means further comprises,
   an all-released-fingers circuit means for generating a chord present signal when all finger keys in the array of keys are released after one or more finger keys are pressed, and
   a finger position decoder circuit means being enabled by said chord present signal to decode a particular combination of closed and open switching paths from the time of pressing only one finger key until all finger keys on the keyboard are released.

5. A keyboard for one-handed operation as defined in claim 1, in which said electrical switch means further comprises,
   a one-release, all-released circuit means for generating a chord present signal for a chord pressed on the array of keys when a first finger key of a chord is released after one or more finger keys are pressed to form the chord, and a register circuit means set by signals from the switching paths and being reset when all finger keys are released,
   whereby a depression of any one or more finger keys from the time the first finger key is released until all finger keys are released does not provide any additional character in the keyboard output, and
   a finger position decoder circuit means being enabled by said chord present signal to decode key combination output signals of the register circuit means at an instant before the first finger key is released.

6. A keyboard for one-handed operation as defined in claim 1, in which
   said array of finger keys comprise ten keys with five keys in each of two rows, Whereby said array provides 27 different finger positions which can respectively be related to the characters in the English alphabet.

7. A keyboard for one-handed typing of chords, such chords being formed by the simultaneous pressing of one or more keys on the keyboard to produce one or more characters, the keyboard comprising a row of keys for being operated by the thumb, electrical switch means being connected to the keys in the row of keys, a row of thumb positions located on the row of keys, a thumb position being located on a single key or on the boundary across adjacent keys in the row of keys pressable by the thumb, a particular switch combination of closed and open switching paths in the electrical switch means being provided for each chord pressable on the row of keys, means for interpreting chords, comprising first means to generate coded signals representing members of a set of characters, switching and logical circuit means to sense the particular switch combinations of closed and open switching paths for a chord to select one set from among several sets of coded representations of characters, the selected set corresponding to the thumb position, an array of keys for being operated by the fingers of the same hand having the thumb for operating the row of keys, the electrical switch means also being connected to the keys in the array of keys, an array of finger positions located on the array of keys, a finger position being located on each key and across the boundary of adjacent keys pressable by any one finger on the array of keys, a particular switch combination of closed and open switching paths in the electrical switch means being provided for each chord pressable on the array of keys, means for interpreting chords, comprising second means to generate coded signals representing members of the set of characters selected by first means, switching and logical circuit means to sense the particular switch combinations of closed and open switching paths of a chord to select the coded representations of the characters that correspond to the finger positions that correspond to the respective chord, and output circuit means to issue the coded representations of characters.

8. A keyboard for one-handed operations as defined in claim 3, further comprising, at least one thumb key in the row of thumb keys located to one side of said array of finger keys to control the selection of case in an alphabet having characters selected by pressing combinations of finger keys, storage means containing electronic signals for plural alphabets/cases, and address circuit means for generating an address component for said storage means corresponding to the pressed/released position of a thumb key to select the case of alphabet of each character address generated by the depression of said finger keys, and means connecting the address circuit means to the electrical switching means to select characters in a selected case or alphabet.

9. A keyboard for one-handed operation as defined in claim 8, in which said row of thumb keys are located in a line with each other, a thumb key combination including the simultaneous pressing of up to two adjacent thumb keys.

10. A keyboard for one-handed operation as defined in claim 9, in which said row of thumb keys are located in a line making an angle of approximately 40° with a line parallel to rows in the array of finger keys.

11. A keyboard for one-handed operation as defined in claim 8, in which facing surfaces of the row of thumb keys, when not pressed, are located in a plane which is lower than a plane passing through facing surfaces of the array of finger keys, when not pressed.

12. A keyboard for one-handed operation as defined in claim 11, in which the plane of the facing surfaces of said thumb keys is approximately one-half inch below the plane of the facing surfaces of said finger keys.

13. A keyboard for one-handed operation as defined in claim 8, further comprising a keyboard word generator sampling the electrical states for the open and closed paths of the electrical switch means at periodic intervals for periodically generating a keyboard word having bit positions indicating the pressed/released state for each thumb key and each finger key respectively, said periodic intervals being shorter than the reaction time for human fingers acting to press or release keys, first comparing means for comparing electrical states of corresponding bit positions in each two consecutively-generated keyboard words, said first comparing means generating a chord-complete signal when any compared bit position indicates a change in electrical state from a pressed to a released state, and a chord-present circuit being actuated by said chord-complete signal to output a chord-present signal, whereby the chord-present signal indicates that the first generated of the two compared keyboard words is to be decoded for generating each character provided by a chord formed when any key in the chord is released.

14. A keyboard as defined in claim 7, in which key motion is detected by means containing electro-mechanical contacts actuated by pressing each of said keys, also comprising means for sampling the electrical states of the electro-mechancial contacts at periodic intervals which are longer than the duration of contact bounce in actuating the electro-mechanical contacts.

15. A one-handed keyboard as defined in claim 13, further comprising, a state flip flop circuit being settable by the chord-complete signal from the first comparing means, second comparing means for comparing the electrical states of corresponding bit positions in each two consecutively-generated keyboard words, the second comparing means generating a chord-being-formed signal when any compared bit position indicates a change in electrical state from a released state to a pressed state, and complementary outputs of said state flip flop circuit oppositely conditioning the first and second comparing means to alternately dissable one of the two comparing means until the enabled one of the two comparing means provides an output signal to reverse the electrical state of the state flip flop.

16. A one-handed keyboard as defined in claim 13, further comprising an all-zero flip flop cleared at the beginning of each periodic interval, the all-zero flip flop being set by any bit in each keyboard word having a pressed electrical state, and gate means connecting the output of the all-zero flip flop to the state flip flop to clear the state flip flop to an all-keys-released state whenever the all-zero flip-flop is in a cleared state after receiving any generated keyboard word, whereby the generation of the current of the following keyboard word to represent a next chord is inhibited until said state flip flop is put into a cleared state.

17. A one-handed keyboard as defined in claim 8, further comprising a keyboard word generator sampling the electrical states for the closed and open switching paths in the electrical switch means at periodic intervals for periodically generating a keyboard word having bit positions indicating the pressed/released state for each thumb key and each finger key respectively, said periodic interval being shorter than the reaction time for human fingers acting to press or release keys on the keyboard, a keyboard word register storing the state of each switching path at a respective bit position, a zero-detection flip flop cleared at the beginning of a periodic interval, the zero-detection flip flop being set when any bit in the keyboard register is set to a pressed state, and a chord-present flip flop being cleared at the beginning of each periodic interval and being set to a chord-present state whenever the zero-detection flip flop is in a cleared state after each keyboard word is generated, whereby each chord is signalled as being formed of all keys pressed before all keys are released.

18. A one-handed keyboard as defined in claim 8, further comprising, a special chord circuit for sensing a special predetermined combination of key pressings on a said keyboard, the special chord circuit generating a special chord signal upon sensing the predetermined combination, a special word circuit for storing a special predetermined set of characters, the special word circuit being actuated by the special chord signal to output the special predetermined set of characters.

19. A one-handed keyboard as defined in claim 8, further comprising a special chord switch located on said keyboard having a USE position and a LOAD position, a special chord circuit being connected the speical chord switch, means for storing in said special chord circuit the key signals of the electrical switch means provided by pressing keys while said special chord switch is at its LOAD position, means for comparing the signals of the electrical switch means with the key signals in the storing means while said special chord switch is set at its USE position, and the comparing means generating a special-chord signal if the compared signals are equal, and the comparing means generating a regular-chord signal if the compared signals are not equal.

20. A one-handed keyboard as defined in claim 8, further comprising a special word switch located on said keyboard having a USE position and a LOAD position, a special word circuit being connected to the special word switch, means for storing in said special word circuit each character pressed on said keyboard in the order that the characters are provided while the special word switch is at its LOAD position, and means for outputting the characters stored in the special word circuit upon receipt of a special-chord signal while the special word switch is at its USE position.

21. A one-handed keyboard as defined in claim 7, in which the means for interpreting chords further comrpises, register circuit means having signals for a chord set by each particular switch combination of closed and open switching paths of the electrical switch means, window identifying means for identifying and selecting one subgroup of four signals at a time from the register circuit means and outputting the subgroup with a corresponding window identifications signal, window decoding means receiving each subgroup provided by the window identifying means and outputting a window decode signal identifying which of seven different codes is the code provided by the subgroup, and finger position decoding means combining each window decode signal received from the window decoding means with the window identifidation signal received from the window identifying means to generate a decoded finger position signal.

22. A one-handed keyboard as defined in claim 21, in which the window identifying means further comprises a shift register receiving the key combination output signals from the register circuit means, four parallel outputs being connected from said shift register to the window decoding means, means for initially shifting the key combination output signals into an initial predetermined position in said shift register at which the four parallel outputs identify a first window, window shift control means for shifting the shift register by two signal positions to provide signals for each next window at the four parallel outputs, each next shifting operation by the window shift control means identifying each next window.

23. A one-handed keyboard as defined in claim 21, in which the window identifying means further comprises, a step counter set to an initial state prior to decoding each window, means for actuating the step counter to step through at least six count signals while each window is being decoded, the six count signals providing a counter output which is coded to correspond to the window decode signals for six different finger positions decodable for a window, means for comparing the counter output with the signal subgroup currently being outputted from the window identifying means, and the comparing means generating an equal signal for any particular count signal equal to the signal subgroup, the particular count signal being outputted as the window decode signal of the window decoding means.

24. A one-handed keyboard as defined in claim 23, in which the window identifying means further comprises, a finger position counter circuit which has a count capability that equals or exceeds the number of finger positions possible on the keyboard, means for setting the finger position counter to an initial count state prior to the decoding of the key combination output signals provided by the register circuit means, means for incrementing the finger position counter and synchronism with incrementing the step counter to each next finger position count signal to provide a subset of six increments per window decoding operation for both the finger position counter and the step counter, the finger position counter circuit incrementing a next set of six counts when the window identifying means identifies the next signal subgroup for the next window, a finger position memory having different bit positions at addresses corresponding to the count signals available from the finger position counter, the bit positions initially being set to a first state, and menas for setting to a second state any bit position currently addressed by the finger position counter upon receiving an equal signal from the comparing means, the bit position states in the finger position memory representing the decoding of the provided key combination output signals after its last signal subgroup has been decoded.

25. A keyboard for one-handed operation as defined in claim 7, further comprising, a group of thumb keys located next to the group of finger keys, the thumb keys being spaced closely to each other to enable a thumb to simultaneously press a single thumb position consisting of pressing either one or a plurality of the thumb keys while the fingers of the samd hand are pressing one or more finger positions in the array of finger keys, The means for interpreting chords being connected to said electrical switch means for outputting thumb bits sensed from pressing one or more adjacent thumb keys, a storage means containing electronic signals for plural alphabets/codes, thumb decoder means receiving the thumb bits outputted by the electronic circuit means, the thumb decoder means decoding the thumb bits and providing a thumb position output for identifying a particular thumb position coded into the thumb bits, and thumb storage address circuit means receiving the thumb position output from the thumb decoder means and generating an alphabet/case address signal for said storage means from the information received from the thumb and finger keys and selecting a character within the alphabet/case being addressed from other information received from the thumb and finger keys.

26. A one-handed keyboard as defined in claim 25, in which said thumb address circuit means further comprises means for generating an alphabet/case address signal for said storage means, part of the address signal corresponding to each pressed thumb position to select an alphabet/case in said storage means, and another part of the address signal corresponding to a pressed finger position for selecting a character within the alphabet/case.

27. A one-handed keyboard as defined in claim 25, further comprising, a plurality of thumb positions for said keyboard actuating the thumb decoder means to provide sequence control outputs which signals the output order for the decoded finger positions in a chord, normal-order control circuit means being enabled by a first sequence control output to increment in a forward direction the finger position counter circuit when receiving input count signals, reverse-order control circuit means being enabled by a second sequence control output to decrement in a reverse direction the finger position counter when receiving input count signals, means for disabllling the normal-order control circuit means and the reverse-order control circuit means when the finger position counter has completed a scan of all storable finger positions, whereby the keyboard output bit signals for the characters in the chord in a normal sequence when provided with the first sequence control output, and output bit signals for the characters of the chord in a reverse sequency when provided with the second sequence control output.

28. A one-handed keyboard as defined in claim 27, further comprising, space-control circuit means being actuated by one or more of said plurality of thumb positions for controlling the appendage of a space character to the outputted sequence of characters for a chord.

29. A one-handed keyboard as defined in claim 28, further comprising, phase-timing control means for said keyboard for outputting said space character before the sequence of characters for said chord.

30. A one-handed keyboard as defined in claim 25, further comprising, at least one of said thumb positions for said keyboard actuating the thumb decoder means to provide a case control output, and means for combining the case control output with the sequence control output to output an upper case character as the first character of a chord and to output any subsequent characters in the chord as lower case characters.

31. A keyboard for the one-handed typing of chords, as defined in claim 7, further comprising each finger position being formed as a disk-shaped depression shaped on the surfaces of the keys in the row of keys and the array of keys to delineate each thumb and finger position whether it is on a single key or across one or more boundaries between adjacent keys.

* * * * *